(12) United States Patent
Imai et al.

(10) Patent No.: US 7,091,070 B2
(45) Date of Patent: Aug. 15, 2006

(54) SEMICONDUCTOR DEVICE AND METHOD OF MANUFACTURING THE SAME

(75) Inventors: Keitaro Imai, Kanagawa (JP); Toru Takayama, Kanagawa (JP); Yuugo Goto, Kanagawa (JP); Junya Maruyama, Kanagawa (JP); Yumiko Ohno, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/787,552

(22) Filed: Feb. 27, 2004

(65) Prior Publication Data

US 2004/0256618 A1 Dec. 23, 2004

(30) Foreign Application Priority Data

Feb. 28, 2003 (JP) .............................. 2003-053193
Feb. 28, 2003 (JP) .............................. 2003-053243

(51) Int. Cl.
*H01L 21/00* (2006.01)
*H01L 21/46* (2006.01)
*H01L 21/30* (2006.01)

(52) U.S. Cl. ...................... 438/149; 438/455; 438/458
(58) Field of Classification Search ............. 438/149, 438/455, 458
See application file for complete search history.

(56) References Cited

U.S. PATENT DOCUMENTS

| | | | |
|---|---|---|---|
| 5,256,562 A | 10/1993 | Vu et al. | |
| 5,377,031 A | 12/1994 | Vu et al. | |
| 5,821,138 A * | 10/1998 | Yamazaki et al. | .......... 438/166 |
| 5,877,034 A | 3/1999 | Ramm et al. | |
| 6,127,199 A | 10/2000 | Inoue et al. | |
| 6,372,608 B1 | 4/2002 | Shimoda et al. | |
| 6,521,940 B1 | 2/2003 | Vu et al. | |
| 2001/0015256 A1 | 8/2001 | Yamazaki et al. | |
| 2002/0024051 A1 | 2/2002 | Yamazaki et al. | |
| 2002/0030189 A1 | 3/2002 | Ishikawa | |
| 2003/0025118 A1 | 2/2003 | Yamazaki et al. | |
| 2003/0032210 A1 | 2/2003 | Takayama et al. | |
| 2003/0047280 A1 | 3/2003 | Takayama et al. | |
| 2003/0047732 A1 | 3/2003 | Yamazaki et al. | |

FOREIGN PATENT DOCUMENTS

| | | |
|---|---|---|
| JP | 10-125931 | 5/1998 |
| JP | 2002-184959 | 6/2002 |

OTHER PUBLICATIONS

European Search Report (Application No. 04004369.7; EP6999/7000 dated Jan. 20, 2006).

* cited by examiner

*Primary Examiner*—Alexander Ghyka
(74) *Attorney, Agent, or Firm*—Eric J. Robinson; Robinson Intellectual Property Law Office, P.C.

(57) ABSTRACT

To provide a method for manufacturing a semiconductor device including a transfer step that is capable of controlling the adhesiveness of a substrate and an element-formed layer in the case of separating the element-formed layer including a semiconductor element or an integrated circuit formed over the substrate from the substrate and bonding it to another substrate. An adhesive agent made of a good adhesiveness material is formed between the semiconductor element or the integrated circuit comprising plural semiconductor elements formed over the substrate (a first substrate) and the substrate, and thus it is possible to prevent a semiconductor element from peeling off a substrate in manufacturing the semiconductor element, and further, to make it easier to separate the semiconductor element from the substrate by removing the adhesive agent after forming the semiconductor element.

18 Claims, 25 Drawing Sheets

617  618  701

800

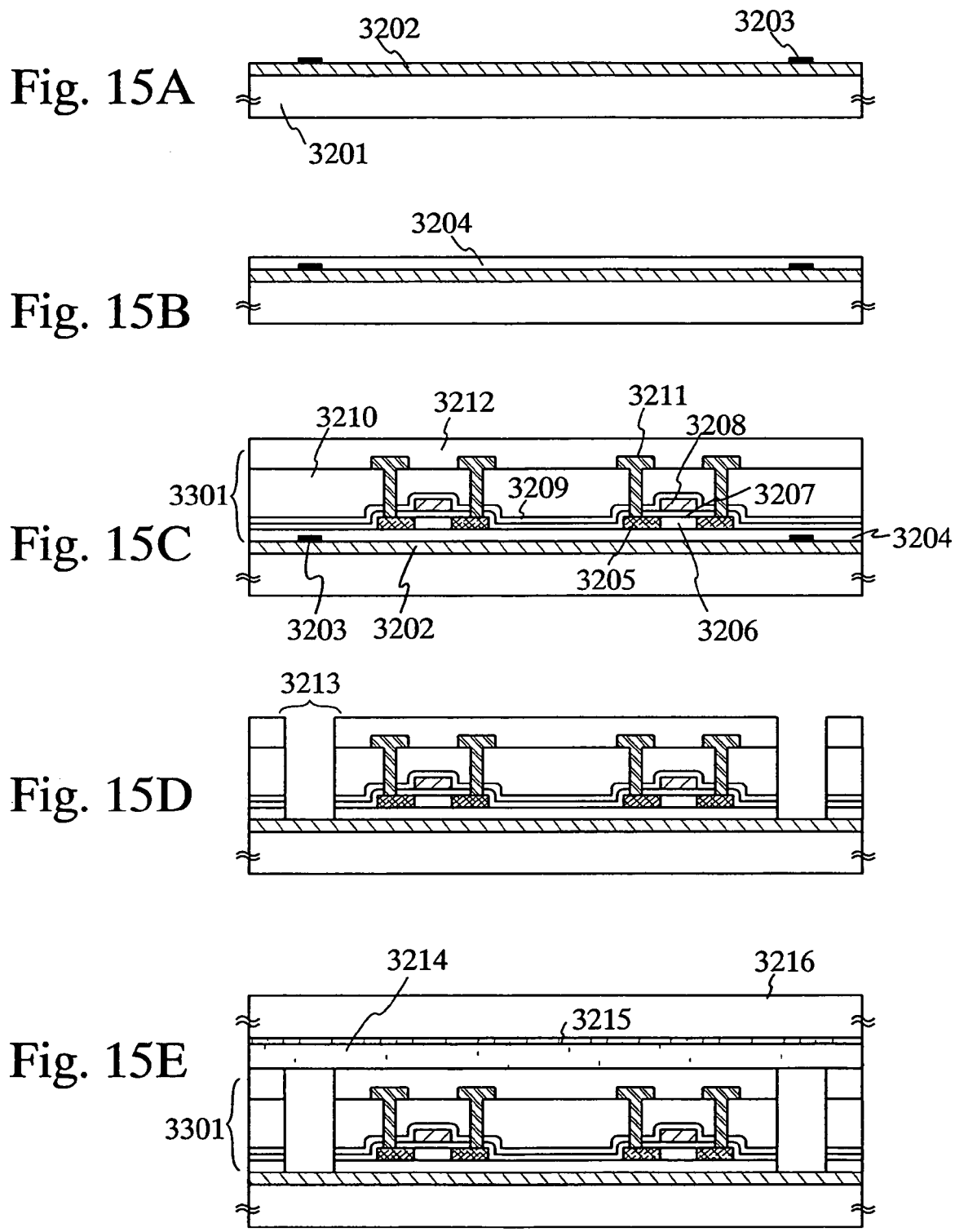

3701
3617
3618

3800

SEMICONDUCTOR DEVICE AND METHOD OF MANUFACTURING THE SAME

BACKGROUND OF THE INVENTION

1. Field of the Invention

The present invention relates to a method for manufacturing a semiconductor device including a transfer step of a semiconductor element such as a thin film transistor (TFT) formed over a substrate, to another substrate.

In addition, the present invention relates to a method for manufacturing a semiconductor device including a transfer step of an integrated circuit comprising a plurality of semiconductor elements (including a thin film transistor (TFT)) formed over a substrate, to another substrate.

2. Description of the Related Art

In recent years, various technical developments have been made about a semiconductor element represented by a thin film transistor (TFT) that is formed by using a semiconductor thin film (about from several nm to several hundred nm in thickness) formed over the same substrate.

To secure characteristics of a semiconductor element, a certain level of high temperature is required in the manufacture process. At present, a significant decrease of the step temperature is realized by introducing laser crystallization into a part of the manufacture process. As a result, it becomes possible to manufacture a semiconductor element over a glass substrate, which has been impossible in the high temperature process.

However, it is extremely difficult to manufacture a semiconductor element over a flexible substrate such as plastic from a viewpoint of heat-resistance of a substrate, because much lower-temperature is necessary.

On the contrary, a method for transferring a semiconductor element over a flexible substrate such as plastic after forming the semiconductor element over a glass substrate is known as an effective method, because the method substantially can remove thermal disincentive to a substrate.

There are several proposed methods for separating a semiconductor element formed over a substrate from the substrate. For example, (1) a method that a semiconductor element is formed over a glass substrate, then the glass substrate is dissolved by etching to separate the semiconductor element alone, and then, the semiconductor element is bonded to a plastic substrate (Reference: Japanese Patent Laid Open No. 2002-184959). (2) a method that a semiconductor element formed over a substrate is separated from the substrate, and then, is bonded to a flexible substrate such as plastic (Reference: Japanese Patent Laid Open No. H10-125931).

In the case of the method (1), there is a problem of a longer process time or high material cost of an etching material or a glass substrate, although a substrate is completely separated from a semiconductor element after forming the semiconductor element over the substrate.

In the case of the method (2), it is very important to control adhesiveness and film stress. Namely, there is a problem of peeling off while manufacturing a semiconductor element, although it is easier to perform separation with lower adhesiveness and higher film stress. There is also difficulty in performing separation of a semiconductor element from a substrate after the semiconductor element is formed, although peeling-off of the semiconductor element does not occur in the middle of manufacturing the semiconductor element, if the adhesiveness is enhanced.

SUMMARY OF THE INVENTION

It is an object of the present invention to provide a method for manufacturing a semiconductor device including a transfer step that is capable of controlling the adhesiveness of a substrate and an element-formed layer in the case of separating the element-formed layer including a semiconductor element formed over the substrate from the substrate and then bonding it to another substrate, as performed by the method (2).

To achieve the above-described object, according to the present invention, when an element-formed layer is formed, the adhesiveness of a substrate and a semiconductor element is enhanced. On the contrary, after the element-formed layer is formed, the adhesiveness of the substrate and the semiconductor element is lowered.

Specifically, it is possible to prevent a semiconductor element from peeling off a substrate in manufacturing the semiconductor element by forming an adhesive agent between the semiconductor element formed over the substrate (so-called a first substrate) and the substrate, and further, to make it easier to separate the semiconductor element from the substrate by removing the adhesive agent after forming the semiconductor element.

The adhesive agent of the present invention is made of a material having good adhesiveness to a metal layer that has been formed on a substrate for the sake of easier separation of the semiconductor element from the substrate. Specifically, there is used a material that can form a metal compound (including silicide) or an alloy by the reaction with a metal inside the metal layer, when it is formed to be in contact with the metal layer.

It may be possible to intentionally perform a heat treatment on the reaction of the adhesive agent and the metal inside the metal layer, but the reaction can be promoted by a heat treatment or the like in manufacturing the element-formed layer (including a TFT) in a later step.

The metal layer is formed on the substrate, the adhesive agent is formed on the metal layer, and then, a oxide layer is formed to cover the metal layer and the adhesive agent. The adhesiveness of the metal layer and an oxide layer over the substrate is enhanced by the adhesive agent. Then the element-formed layer including the semiconductor element is formed over the oxide layer.

Etching can be adopted as a method for removing the adhesive agent after forming the element-formed layer, and the adhesive agent can be removed by the etching, together with a portion of the element-formed layer that has been formed. Wet etching or dry etching can be used for the etching.

An opening portion formed in the portion of the element-formed layer by the etching may be left as it is, but may be filled with the same insulating material as the material that is removed by the etching, or another insulating material after removing the adhesive agent.

The element-formed layer can be separated from the substrate by physical force. This is because the adhesiveness in an interface of the metal layer and the oxide layer is lowered again since the adhesive agent is removed. However, at first, because the metal layer and the oxide layer that have been formed over the substrate easily peel off each other on the interface thereof due to the step of forming the semiconductor element over the oxide layer etc., the adhesiveness has been enhanced by forming the adhesive agent on the interface. Subsequently, transferring of the element-formed layer is completed by bonding the separated element-formed layer to another substrate.

The structure of the present invention is as follows: a metal layer is formed over a first substrate; an adhesive agent is formed on a portion of the metal layer; an oxide layer is formed to cover the metal layer and the adhesive agent; a semiconductor element is formed over the oxide layer; and the adhesive agent is removed. In this case, a heat treatment of 400° C. or more, preferably 600° C. or more, is included in forming a semiconductor element, thereby enhancing the adhesiveness of the metal layer and the adhesive agent. The interface between the metal layer and the adhesive agent becomes stable by the heat treatment of 400° C. or more. Further, the metal layer can be reacted with the adhesive agent by the heat treatment of 600° C. or more.

Note that, in the above structure, the semiconductor element (such as a TFT) is included in the element-formed layer. As for a method of removing the adhesive agent, it is preferable to remove the adhesive agent at the same time when a portion of the element-formed layer is etched.

In the above structure, although the adhesiveness in the interface of the metal layer and the oxide layer is reduced by a heat treatment in forming the element-formed layer, the adhesive agent formed on the metal layer can have more enhanced adhesiveness because the adhesive agent reacts with a metal material included inside the metal layer, by the heat treatment in forming the element-formed layer. Therefore, the element-formed layer can be formed without peeling the element-formed layer off a substrate.

The adhesiveness of the first substrate and the element-formed layer can be reduced by etching and removing the adhesive agent and a portion of the element-formed layer together, after the element-formed layer is formed.

In the above structure, after removing the adhesive agent, a second substrate is, further preferably, bonded to the element-formed layer through a first adhesive material since the element-formed layer can easily be separated from the first substrate.

In the above structure, the second substrate and the element-formed layer that have been separated from the first substrate are bonded to a third substrate by a second adhesive material, and thus, the element-formed layer can be transferred to the third substrate that is different from the first substrate over which the element-formed layer has been formed. After the transferring, the second substrate may be removed from the element-formed layer.

It is an object of the present invention to provide a method for manufacturing a semiconductor device including a transfer step that is capable of controlling the adhesiveness of a substrate and an element-formed layer in the case of separating the element-formed layer including an integrated circuit comprising a plurality of semiconductor elements formed over the substrate from the substrate and then bonding it to another substrate, as performed by the method (2).

To achieve the above-described object, according to the present invention, when an element-formed layer is formed, the adhesiveness of a substrate and a semiconductor element is enhanced. On the contrary, after the element-formed layer is formed, the adhesiveness of the substrate and the semiconductor element is lowered.

Specifically, it is possible to prevent a semiconductor element from peeling off a substrate in manufacturing an integrated circuit by forming an adhesive agent made of a good adhesiveness material between the integrated circuit comprising the plurality of semiconductor elements formed over the substrate (so-called a first substrate) and the substrate, and further, to make it easier to separate the integrated circuit from the substrate by removing the adhesive agent after forming the integrated circuit. It is noted that the integrated circuit of the present invention includes circuits such as a CPU (central processing unit), MPU (micro processor unit), a memory, a microcomputer, and an image processor.

The adhesive agent of the present invention is made of a material having good adhesiveness to a metal layer that has been formed on a substrate for the sake of easier separation of the integrated circuit from the substrate. Specifically, there is used a material that can form a metal compound (including silicide) or an alloy by the reaction with a metal inside the metal layer, when it is formed to be in contact with the metal layer.

It may be possible to intentionally perform a heat treatment on the reaction of the adhesive agent and the metal inside the metal layer, but the reaction can be promoted by a heat treatment or the like in manufacturing the element-formed layer (including an integrated circuit) in a later step.

As described above, the adhesiveness of the metal layer and an oxide layer over the substrate is enhanced by the adhesive agent, and the element-formed layer including the integrated circuit comprising the plurality of semiconductor elements is formed over the oxide layer.

Etching can be adopted as a method for removing the adhesive agent after forming the element-formed layer, and the adhesive agent can be removed by the etching, together with a portion of the element-formed layer that has been formed. Wet etching or dry etching can be used for the etching.

An opening portion formed in the portion of the element-formed layer by the etching may be left as it is, but may be filled with the same insulating material as the material that is removed by the etching after removing the adhesive agent, or another insulating material.

The element-formed layer can be separated from the substrate by physical force. This is because the adhesiveness in an interface of the metal layer and the oxide layer is lowered again since the adhesive agent is removed. However, at first, because the metal layer and the oxide layer that have been formed over the substrate easily peel off each other on the interface thereof due to the step of forming the integrated circuit (plural TFTs) over the oxide layer etc., the adhesiveness has been enhanced by forming the adhesive agent on the interface. Subsequently, transferring of the element-formed layer is completed by bonding the separated element-formed layer to another substrate.

The structure of the present invention is as follows: a metal layer is formed over a first substrate; an adhesive agent is formed on a portion of the metal layer; an oxide layer is formed to cover the metal layer and the adhesive agent; an integrated circuit comprising a plurality of semiconductor elements is formed over the oxide layer; and the adhesive agent is removed. In this case, a heat treatment of 400° C. or more, preferably 600° C. or more, is included in forming a semiconductor element, thereby enhancing the adhesiveness of the metal layer and the adhesive agent. The interface between the metal layer and the adhesive agent becomes stable by the heat treatment of 400° C. or more. Further, the metal layer can be reacted with the adhesive agent by the heat treatment of 600° C. or more.

Note that, in the above structure, the integrated circuit comprising the plurality of semiconductor elements (such as a TFT) is included in the element-formed layer. It is preferable to remove the adhesive agent at the same time when a portion of the element-formed layer is etched.

In the above structure, although the adhesiveness in the interface of the metal layer and the oxide layer is reduced by a heat treatment in forming the element-formed layer, the adhesive agent formed on the metal layer can have more enhanced adhesiveness because the adhesive agent reacts with a metal material included inside the metal layer, by the heat treatment in forming the element-formed layer. Therefore, the element-formed layer can be formed without peeling the element-formed layer off a substrate.

The adhesiveness of the first substrate and the element-formed layer can be reduced by etching and removing the adhesive agent and a portion of the element-formed layer together, after the element-formed layer is formed.

In the above structure, after removing the adhesive agent, a second substrate is, further preferably, bonded to the element-formed layer through a first adhesive material since the element-formed layer can easily be separated from the first substrate.

In the above structure, the second substrate and the element-formed layer that have been separated from the first substrate are bonded to a third substrate by a second adhesive material, and thus, the element-formed layer can be transferred to the third substrate that is different from the first substrate over which the element-formed layer has been formed. After the transferring, the second substrate may be removed from the element-formed layer.

According to the present invention, the adhesive agent is formed over a substrate in advance, thereby enhancing the adhesiveness of the substrate and the element-formed layer including the semiconductor element (such as a TFT) in manufacturing. Therefore, it can be prevent the element-formed layer from peeling off the substrate while manufacturing. On the other hand, after the element-formed layer has been formed, the element-formed layer can easily be separated from the substrate, since the adhesive agent can be removed to reduce the adhesiveness of the substrate and the element-formed layer. In other words, the adhesiveness of the substrate and the element-formed layer can be controlled when a semiconductor device is manufactured.

Moreover, according to the present invention, the adhesive agent is formed over the substrate in advance, thereby enhancing the adhesiveness of the substrate and the element-formed layer including the integrated circuit in manufacturing. Therefore, it can be prevent the element-formed layer from peeling off the substrate while manufacturing. On the other hand, after the element-formed layer has been formed, the element-formed layer can easily be separated from the substrate, since the adhesive agent can be removed to reduce the adhesiveness of the substrate and the element-formed layer. In other words, the adhesiveness of the substrate and the element-formed layer can be controlled when a semiconductor device is manufactured.

These and other objects, features and advantages of the present invention become more apparent upon reading of the following detailed description along with the accompanying drawings.

BRIEF DESCRIPTION OF THE DRAWINGS

In the accompanying drawings:
FIGS. 15A to 15E show a method for manufacturing a semiconductor device, including a transfer step.

DETAILED DESCRIPTION OF THE INVENTION

EMBODIMENT MODE

Embodiment Mode 1

An embodiment mode of the present invention is described with reference to FIGS. 1A to 1D.

Figure 1A:
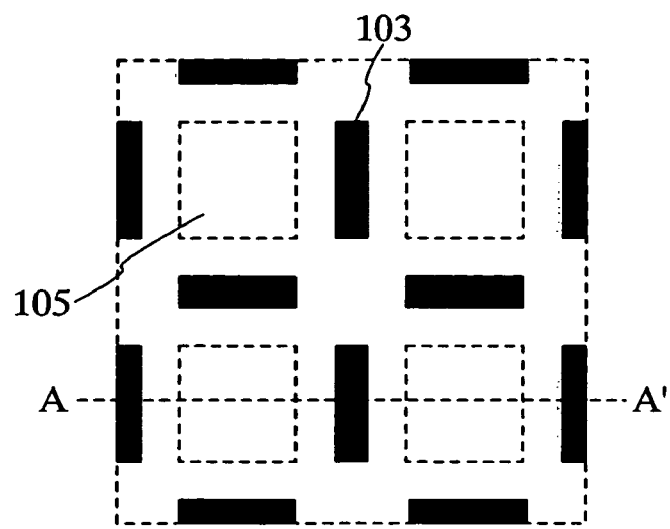
FIGS. 1A to 1D show a structure of the present invention.
Figure 1B:
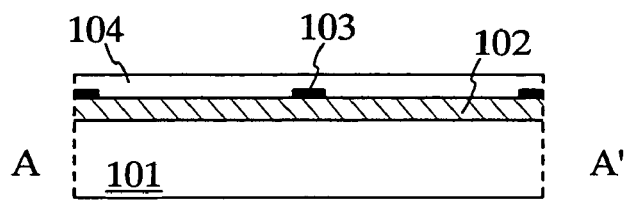

FIG. 1A is a top view of a substrate where an adhesive agent of the present invention is formed, whereas FIG. 1B is a cross-sectional view taken along a dotted line AA' in FIG. 1A. Namely, an adhesive agent 103 is formed like an island to be in contact with a metal layer 102 formed on a substrate 101 as shown in FIG. 1B. Note that, the adhesive agent that is formed here can enhance the adhesiveness of the metal layer 102 and the oxide layer 104 to be formed next, since the adhesive agent is formed between the metal layer 102 and the oxide layer 104.

A quartz substrate, a glass substrate, or the like can be used for a material of the substrate 101. However, a plurality of substrates can be bonded together and used, in the case where the strength is not enough when an element-formed layer (including a TFT) formed over a substrate is separated from the substrate in a later step.

A material of the metal layer 102 can be a single layer made of an element selected from the group consisting of: tungsten (W), molybdenum (Mo), technetium (Tc), rhenium (Re), ruthenium (Ru), osmium (Os), rhodium (Rh), iridium (Ir), palladium (Pd), platinum (Pt), silver (Ag), and gold (Au), or an alloy material including the element as a main constituent, and alternatively a nitride (such as titanium nitride, tungsten nitride, tantalum nitride or molybdenum nitride) or a laminated layer thereof.

The adhesive agent 103 formed on the metal layer 102 is formed in the vicinity of a TFT that is formed over the oxide layer 104. Namely, as shown in FIG. 1A, the TFT is formed in a region 105 surrounded by a dotted line, after the adhesive agent 103 has been formed. It is noted that the arrangement and the shape of the adhesive agent 103 are not limited to those of FIG. 1A and can be designed as appropriate.

The adhesive agent 103 is formed from a material having good adhesiveness with the metal layer 102 formed on the substrate 101 so that the element-formed layer (including a TFT) can be separated from the substrate easily. It is, specifically, a material forming a metal compound or an alloy by reaction with a metal inside the metal layer 102 when the material is formed to be in contact with the metal layer 102, for example, germanium, carbon, a metal material such as boron, magnesium, aluminum, titanium, tantalum, iron, cobalt, nickel, or manganese, as well as silicon forming a silicide.

The adhesive agent 103 is deposited by CVD (chemical vapor deposition), sputtering, vapor deposition, or the like and then, patterned.

Silicon oxide, silicon oxynitride ($SiO_xN_y$), silicon nitride and the like can be used for the oxide layer of the present invention, and can be formed by sputtering, CVD, or the like.

Figure 1C:
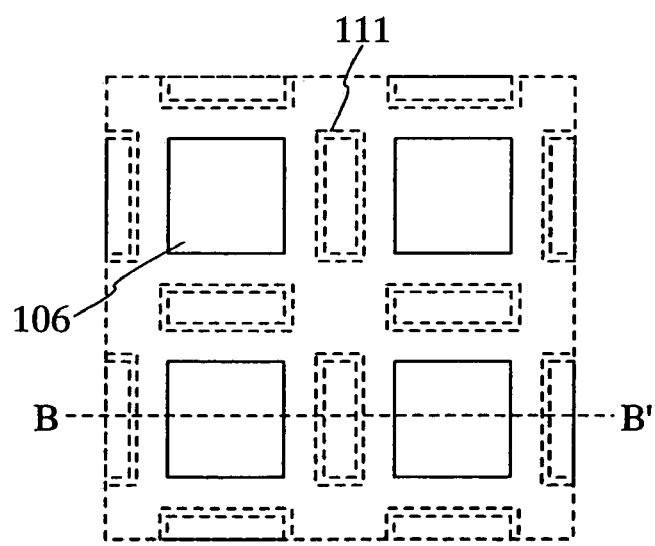
Figure 1D:
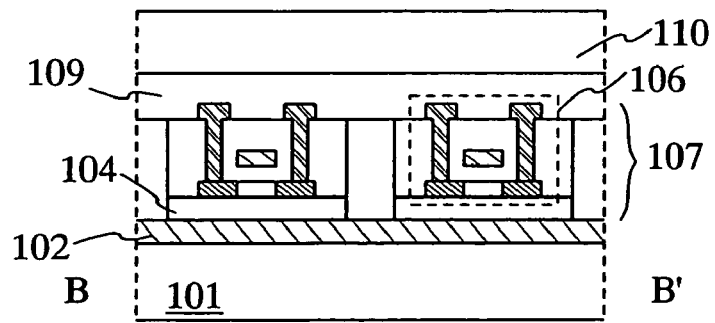

According to the present invention, after a TFT 106 of a semiconductor element is formed over the oxide layer 104, the adhesive agent is removed as shown in FIGS. 1C and 1D. FIG. 1C is a top view of a substrate where the TFT 106 is formed, whereas FIG. 1D is a cross-sectional view taken along a dotted line BB' in FIG. 1C. Etching methods (such as dry etching and wet etching) can be employed as a method of removing the adhesive agent 103. The adhesive agent 103 is removed with an interlayer insulating film in the element-formed layer 107 and with a portion of the oxide layer 104. A region a (111) in FIG. 1C shows a portion where the adhesive agent 103 is removed.

Note that, although the adhesiveness of the oxide layer 104 and the metal layer 102 over the substrate 101 has been enhanced by the adhesive agent 103, the adhesiveness is weakened by removing the adhesive agent 103.

Next, after an auxiliary substrate (refer to as a second substrate) 110 is bonded to the element-formed layer 107 including the TFT 106 with an adhesive layer (refer to as a first adhesive layer) 109 therebetween, the element-formed layer 107 and the auxiliary substrate 110 can be separated from the substrate 101 by physical force. In this case, the separation occurs in the interface between the metal layer 102 and the oxide layer 104 over the substrate 101. Hereinafter, a layer formed of an adhesive material is called an adhesive layer.

According to the present invention, opening portions formed in removing the adhesive agent 103 can be filled with an insulating material. The insulating material used here may be an organic insulating material or an inorganic insulating material. Specifically, silicon oxide, silicon nitride, silicon oxynitride and the like can be used for the inorganic insulating material, while acrylic (including photosensitive acrylic), polyacrylic (including photosensitive polyacrylic), polyimide, polyamide, BCB (benzo cyclo butene), and the like can be used for the organic insulating material.

An effective material for separating, in a later step, the auxiliary substrate (the second substrate) 110 from the element-formed layer 107 is used for the adhesive layer (the first adhesive layer) 109. For instance, an adhesive material whose adhesiveness is weakened by ultraviolet irradiation or heating is employed. A two-sided tape can also be used for the adhesive material. A film made of water-soluble organic resin can be formed between the element-formed layer 107 and the adhesive layer (the first adhesive layer) 109 for the sake of removing the rest of the adhesive layer (the first adhesive layer) 109 more easily, after the auxiliary substrate (the second substrate) 110 has been separated. In this case, the rest of the adhesive layer (the first adhesive layer) 109 can be removed at the same time when the film made of water-soluble organic resin is removed by water-washing.

The element-formed layer 107 and the auxiliary substrate 110 are separated together from the substrate 101 after the auxiliary substrate 110 has been bonded to the element-formed layer 107. At this time, the separation occurs between the metal layer 102 and the oxide layer 104 over the substrate 101. The separated element-formed layer 107 is bonded to another substrate (referred to as a third substrate) such as a plastic substrate that is flexible, by using an adhesive layer (referred to as a second adhesive layer, not shown here).

Thermoplastic or thermosetting synthetic resin can be used for the flexible substrate such as a plastic. For example, polyethylene, polypropylene, polystyrene, polyamide, polyimide, polyamide-imide, polycarbonate (PC), acrylic resin, nylon, polymethyl methacrylate, acrylic-styrene copolymer (AS resin), polyethylene terephthalate (PET), polyethylene naphthalate (PEN), polyether sulfone (PES), polyimide polyethylene, polypropylene, fluoride resin, styrene resin, polyolefin resin, melanin resin, phenol resin, norbornene resin, and the like can be employed.

An adhesive agent selected from various curing materials, for example, a reaction-curing adhesive material, a thermosetting adhesive material, a photo-curing adhesive material such as a UV cure adhesive material, and an anaerobic adhesive material can be used for the adhesive layer (the second adhesive layer). However, a UV cure adhesive material is preferably used in terms of working efficiency.

Lastly, the auxiliary substrate 110 is removed, thereby completing the transfer step of the present invention. Specifically, the adhesiveness of the adhesive layer (the first adhesive layer) 109 is weakened by ultraviolet irradiation or heating, thereby separating the auxiliary substrate 110 from the element-formed layer 107 that is bonded to the substrate (the third substrate). Further, when a film made of water-soluble organic resin is formed between the element-formed layer 107 and the adhesive layer (the first adhesive layer) 109, the film made of water-soluble organic resin and the rest of the adhesive layer (the first adhesive layer) 109 can be removed by water-washing.

Embodiment Mode 2

An embodiment mode of the present invention is described with reference to FIGS. 14A to 14D.

Figure 14A:
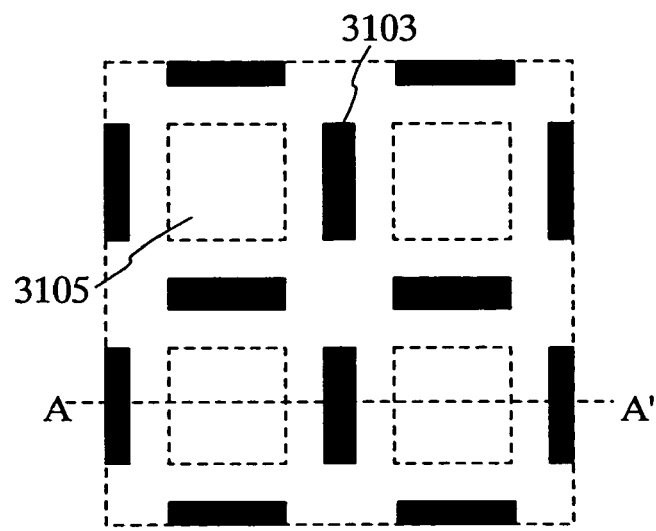
FIGS. 14A to 14D show a structure of the present invention.
Figure 14B:
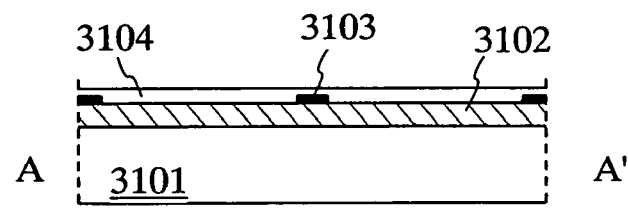

FIG. 14A is a top view of a substrate where an adhesive agent of the present invention is formed, whereas FIG. 14B is a cross-sectional view taken along a dotted line AA' in FIG. 14A. Namely, an adhesive agent 3103 is formed like an island to be in contact with a metal layer 3102 formed on a substrate 3101 as shown in FIG. 14B. Note that, the adhesive agent that is formed here can enhance the adhesiveness of the metal layer 3102 and the oxide layer 3104 to be formed next, since the adhesive agent is formed between the metal layer 3102 and the oxide layer 3104.

A quartz substrate, a glass substrate, or the like can be used for a material of the substrate 3101. However, a plurality of substrates can be bonded together and used, in the case where the strength is not enough when an element-formed layer (including plural integrated circuits) formed over a substrate is separated from the substrate in a later step.

A material of the metal layer 3102 can be an element selected from the group consisting of tungsten (W), molybdenum (Mo), technetium (Tc), rhenium (Re), ruthenium (Ru), osmium (Os), rhodium (Rh), iridium (Ir), palladium (Pd), platinum (Pt), silver (Ag), and gold (Au), or an alloy material including the element as a main constituent, and alternatively a single layer a nitride (such as titanium nitride, tungsten nitride, tantalum nitride or molybdenum nitride) or a laminated layer of the nitrides.

The adhesive agent 3103 formed on the metal layer 3102 is formed in the vicinity of an integrated circuit comprising a plurality of TFTs that is formed over the oxide layer 3104. Namely, as shown in FIG. 14A, the integrated circuit comprising the plurality of TFTs is formed in a region 3105 surrounded by a dotted line, after the adhesive agent 3103 has been formed. It is noted that the arrangement and the shape of the adhesive agent 3103 are not limited to those of FIG. 14A and can be designed as appropriate.

The adhesive agent 3103 is formed from a material having good adhesiveness with the metal layer 3102 formed on the substrate 3101 so that the element-formed layer (including plural integrated circuits comprising plural TFTs) can easily be separated from the substrate. It is, specifically, a material forming a metal compound or an alloy by reaction with a metal inside the metal layer 3102 when the material is formed to be in contact with the metal layer 3102, for example, germanium, carbon, boron, a metal material such as magnesium, aluminum, titanium, tantalum, iron, cobalt, nickel, or manganese, as well as silicon forming a silicide.

The adhesive agent 3103 is deposited by CVD (chemical vapor deposition), sputtering, vapor deposition, or the like and then, patterned.

Silicon oxide, silicon oxynitride ($SiO_xN_y$), silicon nitride and the like can be used for the oxide layer of the present invention, and can be formed by sputtering, CVD, or the like.

Figure 14C:
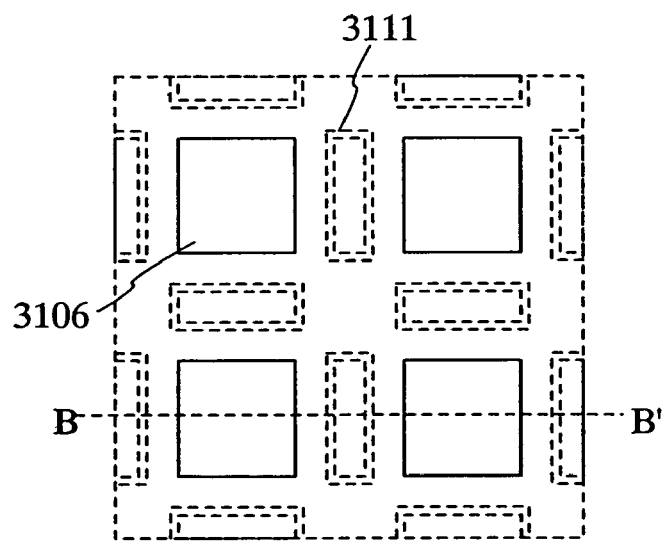
Figure 14D:
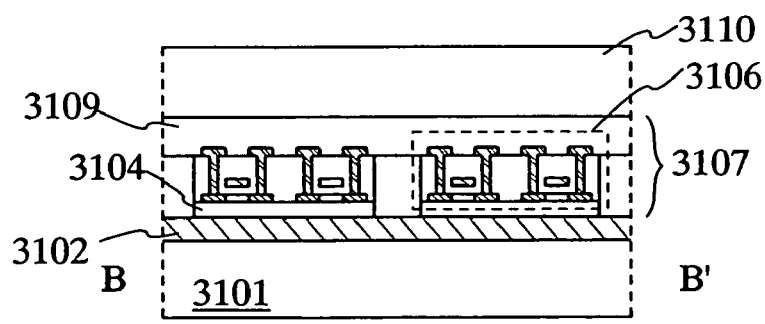

According to the present invention, after plural integrated circuits 3106 comprising plural TFTs are formed over the oxide layer 3104, the adhesive agent 3103 is removed as shown in FIGS. 1C and 1D. FIG. 14C is a top view of a substrate where the integrated circuits 3106 are formed, whereas FIG. 14D is a cross-sectional view taken along a dotted line BB' in FIG. 14C. Etching methods (such as dry etching and wet etching) can be employed as a method of removing the adhesive agent 3103. The adhesive agent 3103 is removed with a portion of an interlayer insulating film and a portion of the oxide layer 3104 in the element-formed layer 3107. A region a (3111) in FIG. 14C shows a portion where the adhesive agent 3103 is removed.

Note that, although the adhesiveness of the oxide layer 3104 and the metal layer 3102 over the substrate 3101 has been enhanced by the adhesive agent 3103, the adhesiveness is weakened by removing the adhesive agent 3103.

Next, after an auxiliary substrate (a second substrate) 3110 is bonded to the element-formed layer 3107 including the integrated circuits 3106 with an adhesive layer (a first adhesive layer) 3109 therebetween, the element-formed layer 3107 and the auxiliary substrate 3110 can be separated from the substrate 3101 by physical force. In this case, the separation occurs in the interface between the metal layer 3102 and the oxide layer 3104 over the substrate 3101.

According to the present invention, opening portions formed in removing the adhesive agent 3103 can be filled with an insulating material. The insulating material used here may be an organic insulating material or an inorganic insulating material. Specifically, silicon oxide, silicon nitride, silicon oxynitride and the like can be used for the inorganic insulating material, while acrylic (including photosensitive acrylic), polyacrylic (including photosensitive polyacrylic), polyimide, polyamide, BCB (benzo cyclo butene), and the like can be used for the organic insulating material.

An effective material for separating, in a later step, the auxiliary substrate (the second substrate) 3110 from the element-formed layer 3107 is used for the adhesive layer (the first adhesive layer) 3109. For instance, an adhesive material whose adhesiveness is weakened by ultraviolet irradiation or heating is employed. A two-sided tape can also be used for the adhesive material. A film made of water-soluble organic resin can be formed between the element-formed layer 3107 and the adhesive layer (the first adhesive layer) 3109 for the sake of removing the rest of the adhesive layer (the first adhesive layer) 3109 more easily, after the auxiliary substrate (the second substrate) 3110 has been separated. In this case, the rest of the adhesive layer (the first adhesive layer) 3109 can be removed at the same time when the film made of water-soluble organic resin is removed by water-washing.

The element-formed layer 3107 and the auxiliary substrate 3110 are separated together from the substrate 3101 after the auxiliary substrate 3110 has been bonded to the element-formed layer 3107. At this time, the separation occurs between the metal layer 3102 and the oxide layer 3104 over the substrate 3101. The separated element-formed layer 3107 is bonded to another substrate (also, referred to as a third substrate) such as a plastic substrate that is flexible, by using an adhesive layer (also, referred to as a second adhesive layer, not shown here).

Thermoplastic or thermosetting synthetic resin can be used for the flexible substrate such as a plastic. For example, polyethylene, polypropylene, polystyrene, polyamide, polyimide, polyamide-imide, polycarbonate (PC), acrylic resin, nylon, polymethyl methacrylate, acrylic-styrene copolymer (AS resin), polyethylene terephthalate (PET), polyethylene naphthalate (PEN), polyether sulfone (PES), polyimide polyethylene, polypropylene, fluoride resin, styrene resin, polyolefin resin, melamine resin, phenol resin, norbornene resin, and the like can be employed.

An adhesive agent selected from various curing adhesive materials, for example, a photo-curing adhesive material such as a reaction-curing adhesive material, a thermosetting adhesive material, or a UV cure adhesive material, and an anaerobic adhesive material can be used for the adhesive layer (the second adhesive layer). However, a UV cure adhesive material is preferably used in terms of working efficiency.

Lastly, the auxiliary substrate 3110 is removed, thereby completing the transfer step of the present invention. Specifically, the adhesiveness of the adhesive layer (the first adhesive layer) 3109 is weakened by ultraviolet irradiation or heating, thereby separating the auxiliary substrate 3110 from the element-formed layer 3107 that is bonded to the substrate (the third substrate). Further, when a film made of water-soluble organic resin is formed between the element-formed layer 3107 and the adhesive layer (the first adhesive layer) 3109, the film made of water-soluble organic resin and the rest of the adhesive layer (the first adhesive layer) 3109 can be removed by water-washing.

EMBODIMENTS

Hereinafter, embodiments of the present invention are described.

Embodiment 1

In this embodiment, a method for manufacturing including a transfer step of the present invention is described with reference to FIGS. 2A to 2E, and FIGS. 3A to 3D.

Figure 2A:
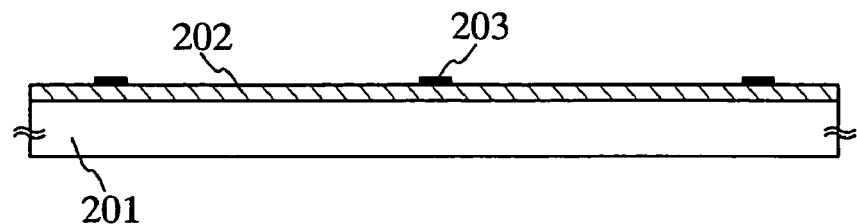
FIGS. 2A to 2E show a method for manufacturing a semiconductor device, including a transfer step.

In FIG. 2A, a metal layer 202 is formed on a first substrate 201, and a plurality of adhesive agents 203 are formed thereon.

A glass substrate or a quartz substrate can be used as the first substrate 201 in this embodiment. Note that, a glass substrate containing barium borosilicate glass, alumino borosilicate glass, alumino silicate glass, or the like as a material is suitable. Representatively, a 1737 glass substrate (distortion point of 667° C.) manufactured by Corning Incorporated, AN 100 (distortion point of 670° C.) manufactured by Asahi Glass Co., Ltd., and the like are applicable. AN 100 is used in this embodiment.

A material of the metal layer 202 can be a single layer made of an element selected from the group consisting of: tungsten (W), molybdenum (Mo), technetium (Tc), rhenium (Re), ruthenium (Ru), osmium (Os), rhodium (Rh), iridium (Ir), palladium (Pd), platinum (Pt), silver (Ag), and gold (Au), or an alloy material including the element as a main constituent, and alternatively a nitride (such as titanium nitride, tungsten nitride, tantalum nitride or molybdenum nitride) or a laminated layer thereof. The metal layer 202 containing W (tungsten) as a main constituent is used in this embodiment. The metal layer 202 may be from 10 nm to 200 nm thick, preferably from 50 nm to 75 nm.

The metal layer 202 can be formed by sputtering, CVD, vapor deposition, but the metal layer 202 is deposited by sputtering in this embodiment. In addition, the film thickness in the vicinity of circumference of the first substrate 201 becomes easily uneven to fix the first substrate 201 when the metal layer 202 is formed by sputtering. Therefore, it is preferable to remove only the circumference by dry etching.

The adhesive agent 203 to be formed on the metal layer 202 is formed by forming an amorphous silicon film and patterning this.

Figure 2B:
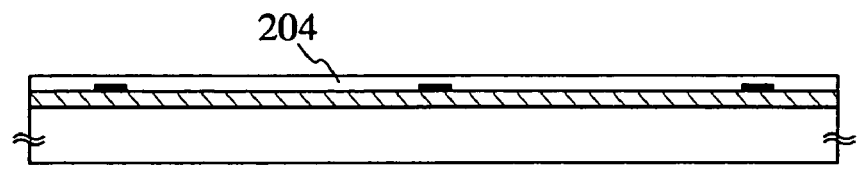

Next, an oxide layer 204 is formed (FIG. 2B). A film made of silicon oxide is formed to be from 150 nm to 200 nm thick by sputtering using a silicon oxide target in this embodiment. The film thickness of the oxide layer 204 is preferably twice as much as the film thickness of the metal layer 202 or more.

Figure 2C:
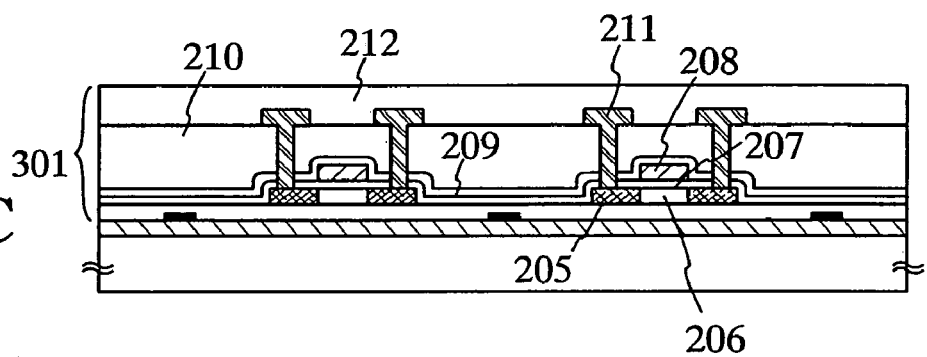

An element-formed layer 301 is formed on the oxide layer 204 (FIG. 2C). A plurality of TFTs (p-channel type TFTs or n-channel type TFTs) are formed in the element-formed layer 301, and it is assumed that an element (such as a light-emitting element or a liquid crystal element) connected to these TFTs are included, besides wirings 211 to connect these TFTs, and insulating films 210 and 212. In addition, a method for manufacturing of the element-formed layer including TFTs is not particularly limited in the present invention. The present invention can be implemented by combination with a publicly known manufacturing method, besides a manufacturing method shown in Embodiment 5. In addition, the TFT includes an impurity region 205 and a channel forming region 206 that are formed in a portion of a semiconductor film on the oxide layer 204, an insulating film 207 and a gate electrode 208.

In this embodiment, when the element-formed layer 301 is formed, a heat treatment to scatter hydrogen included inside a material film including at least hydrogen is performed after forming the material film (a semiconductor film or a metal film) including hydrogen. This heat treatment may be performed at the temperature of 420° C. or more, and it may be performed separately from the formation step of the element-formed layer 301, or serve as the formation step to omit the step. After forming an amorphous silicon film including hydrogen by CVD as the material film including hydrogen, for example, it is possible to simultaneously perform diffusion of hydrogen and formation of a polysilicon film by heating, with a heat treatment of 500° C. or more for the sake of crystallization of the amorphous silicon film In addition, a layer including a metal oxide having a crystal structure (not shown) is formed between the metal layer 202 and the oxide layer 204 by this heat treatment. In addition, when the adhesive agent 203 is formed on the metal layer 202 and the oxide layer 204 is laminated thereover, a metal-oxide layer (tungsten oxide film in this embodiment) in an amorphous condition that is formed to be approximately from 2 nm to 5 nm thick between the metal layer 202 and the oxide layer 204, also has the crystal structure by this heat treatment and forms the layer made of an metal oxide (not shown).

In addition, this layer made of a metal oxide (not shown) is formed in the interface between the metal layer 202 and the oxide layer 204, and therefore, the element-formed layer is easily separated from the substrate in a later step. In addition, in the heat treatment conducted while forming the element-formed layer 301, the case of forming the layer made of a metal oxide is described in this embodiment. However, the present invention is not limited to this method, and there is employed a method of forming the metal-oxide layer and then the oxide layer 204, after forming the metal layer 202 and the adhesive agent 203.

On the other hand, the adhesiveness of the adhesive agent 203 and the metal layer 202 can be enhanced by the heat treatment conducted while forming the element-formed layer 301. In other words, in this embodiment, the adhesive agent 203 formed from the amorphous silicon film reacts with tungsten (W) inside the metal layer 202 that has been formed, to form a silicide (tungsten silicide: $WSi_2$) by adding a heat treatment. Therefore, the adhesiveness of the adhesive agent 203 and the metal layer 202 can be enhanced. In addition, the present invention is not limited to the method of reacting a metal inside the metal layer with the adhesive agent by the heat treatment conducted while forming the element-formed layer 301. A heat treatment for reacting a metal inside the metal layer with the adhesive agent after forming the metal layer and the adhesive agent, may be performed separately from the formation of the element-formed layer 301.

Figure 2D:
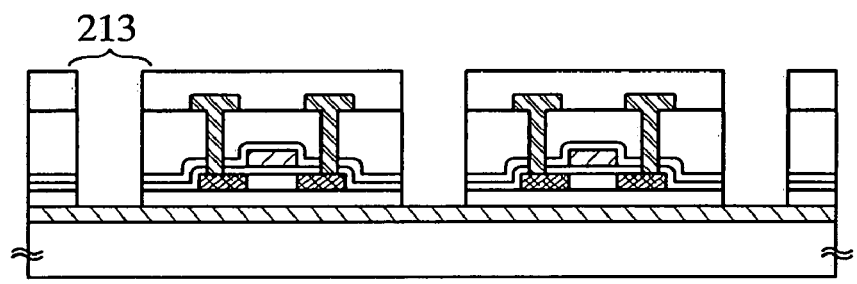

When the element-formed layer 301 is completed, the adhesive agent 203 is removed. Specifically, insulating films 207, 209, 210, and 212, a portion of the oxide layer 204, and the adhesive agent 203 are etched by dry etching to form an opening portion 213 (FIG. 2D).

For example, when the insulating films 207, 209, 210, and 212 and the oxide layer 204 are etched and these are formed from silicon oxide, dry etching is conducted by using an etching gas including mainly carbon fluoride ($CF_4$). Further, when the adhesive agent 203 is etched, the adhesive agent 203 is formed from silicon and a portion including mainly silicon is left in a portion thereof, regardless of the reaction with the metal layer (e.g., W), etching can be conducted by using an etching gas including mainly hydrogen bromide (HBr) and chlorine ($Cl_2$). In addition, when the adhesive agent 203 is formed from silicon and a portion thereof forms a silicide (WSi) due to the reaction with the metal layer (W), the silicide can be etched by using an etching gas including mainly sulfur fluoride ($SF_6$) and hydrogen bromide (HBr).

Subsequently, an organic resin layer 214 is formed over the element-formed layer 301. The organic resin layer 214 is formed by applying an organic material that is soluble in water or alcohols used as a material of the organic resin layer 214, over a whole surface thereof and curing it. The composition of the organic material may be, for example, epoxy series, acrylate series, silicon series, or the like. Specifically, water-soluble resin (TOAGOSEI Co., Ltd.: VL-WSHL10) is spin-coated to have a thickness of 30 μm, and exposed to light for 2 minutes to be temporarily cured, then, exposed to UV rays with its back for 2.5 minutes, and then, with its surface for 10 minutes. The exposure to light is performed for 12.5 minutes in total to be fully cured. Consequently, the organic resin layer 214 is formed (FIG. 2E).

The adhesiveness in the interface (a layer containing a metal oxide) between the metal layer 202 and the oxide layer 204 is partly weakened in order to easily perform a later separation step. The partly weakening of adhesiveness is carried out by emitting laser light partially on the metal layer 202 or the oxide layer 204 along the periphery of the region to be separated, or pressuring locally from outside along the periphery of the region to be separated for damaging a part of the inside or the interface of the oxide layer 204. Specifically, a hard needle such as a diamond pen may be depressed perpendicularly and moved with applying loading. Preferably, a scriber device can be used to move the pen with applying loading with press force ranging from 0.1 mm to 2 mm. As described above, a portion having selectively (partially) weakened adhesiveness that can spark the start of separation is formed before the separation is preformed, thereby preventing poor separation and improving the process yield.

Figure 2E:
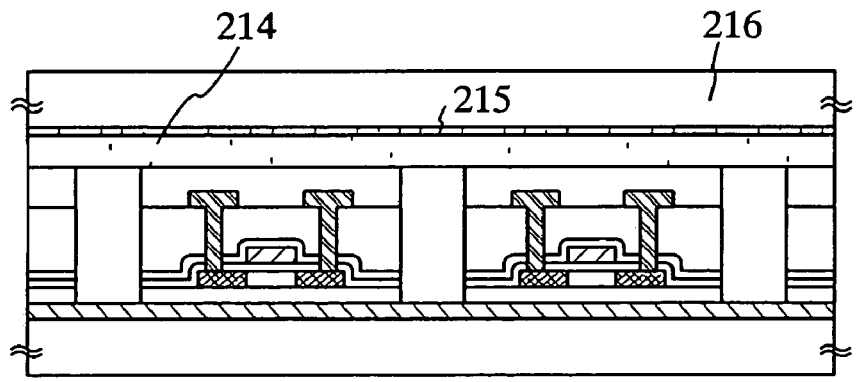

By forming a first adhesive layer 215, a second substrate 216 that is an auxiliary substrate can be bonded to the organic resin layer 214 with the first adhesive layer 215 therebetween (FIG. 2E). As a material for forming the first adhesive layer 215, a known material whose adhesiveness can be weakened by carrying out a predetermined treatment in a later step can be used, however, the case of using a photosensitive two-sided tape whose adhesiveness can be weakened by light irradiation in a later step is described in this embodiment.

Figure 3A:
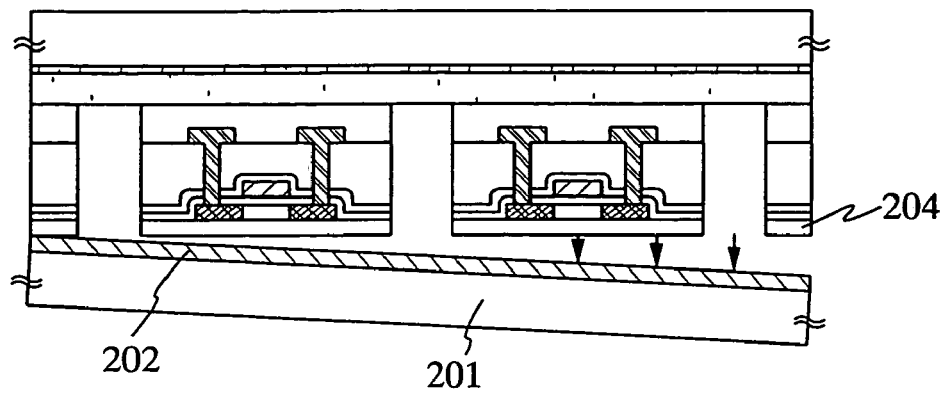
FIGS. 3A to 3D show a method for manufacturing a semiconductor device, including a transfer step.

The first substrate 201 is separated from the element-formed layer 301 bonded with the auxiliary substrate by a physical means. In this embodiment, the first substrate 201 can be separated with comparatively small force (for example, man's hand, air pressure of gas sprayed from a nozzle, ultrasonic waves, or the like) in the interface (the layer containing a metal-oxide) portion of the metal layer 202 and the oxide layer 204. Specifically, the first substrate 201 can be separated by splitting the tungsten oxide film, the interface between the tungsten oxide film and the silicon oxide film, or the interface between the tungsten oxide film and the tungsten film. Thus, the element-formed layer 301 formed over the oxide layer 204 can be separated from the first substrate 201. FIG. 3A shows a state of the separation.

A portion of the layer containing metal oxide is left on the surface that is exposed by the separation. This is a cause of weakening the adhesiveness when the exposed surface is bonded to a substrate or the like in a later step. Thus, the portion of the layer containing metal oxide left on the exposed surface is preferably removed. For removing the portion, aqueous alkali such as aqueous ammonia or aqueous acids can be used. In addition, the following steps may be carried out at the temperature (at most 430° C.) which makes it easier for the portion of the layer containing the metal oxide to be separated.

Figure 3B:
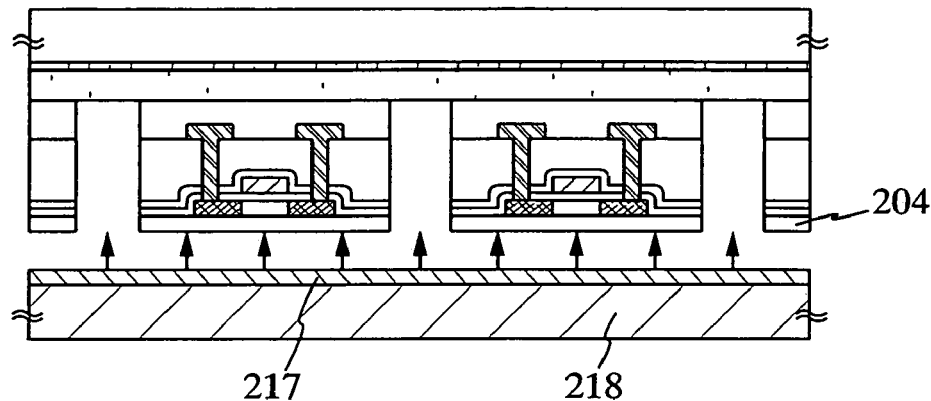

Next, a second adhesive layer 217 is formed, and a third substrate 218 is bonded to the oxide layer 204 (and the element-formed layer 301) with the second adhesive layer 217 therebetween (FIG. 3B). Note that, it is important that the adhesiveness of the third substrate 218 and the oxide layer 204 (and the element-formed layer 301) bonded by the second adhesive layer 217 is superior to that of the second substrate 216 and the organic resin layer 214 by the first adhesive layer 215.

A flexible substrate (plastic substrate) is preferably used for the third substrate 218. ARTON (manufactured by JSR corporation) comprising a norbornene resin including a polar group is used for the third substrate 218 in this embodiment.

As a material of the second adhesive layer 217, various curing materials, for example, a reaction-curing adhesive material, a thermosetting adhesive material, a photo-curing adhesive material such as a UV cure adhesive material, or an anaerobic adhesive material can be adapted. Preferably, the adhesive material is given high thermal conductivity by being mixed with powder including silver, nickel, aluminum, or aluminum nitride, or filler.

Figure 3C:
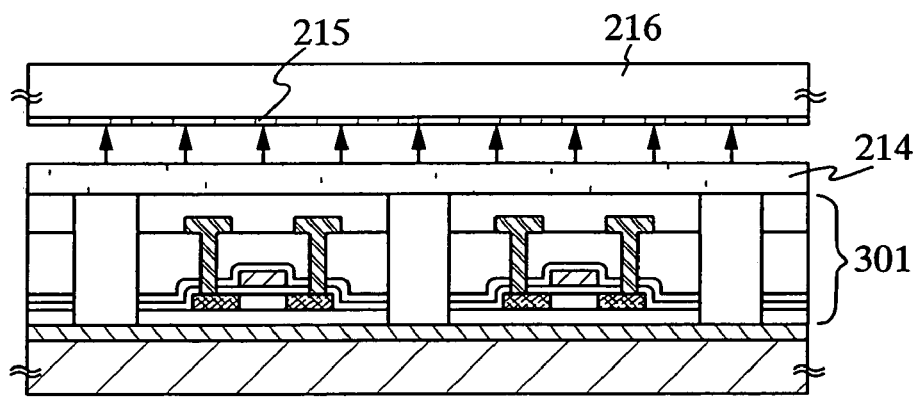
Figure 3D:
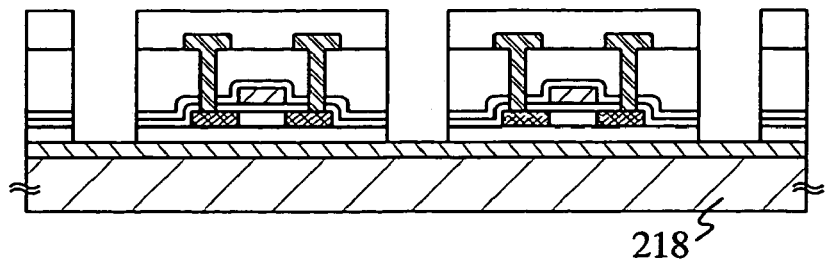

The bonding strength of the two-sided tape used for the first adhesive layer 215 is lowered by emitting UV rays from the second substrate 216 side, thereby separating the second substrate 216 from the element-formed layer 301 (FIG. 3C). Further, in this embodiment, the exposed surface is washed by water, thereby dissolving and removing the first adhesive layer 215 and the organic resin layer 214. Thus, the structure shown in FIG. 3D can be obtained.

According to the method described above, the TFT formed over the first substrate 201 can be separated and transferred to another substrate (the third substrate 218).

Embodiment 2

In this embodiment, a manufacturing method including a transfer step of the present invention that is partly different from that of Embodiment 1 is described with reference to FIGS. 4A to 4E, 5A and 5B.

Figure 4A:
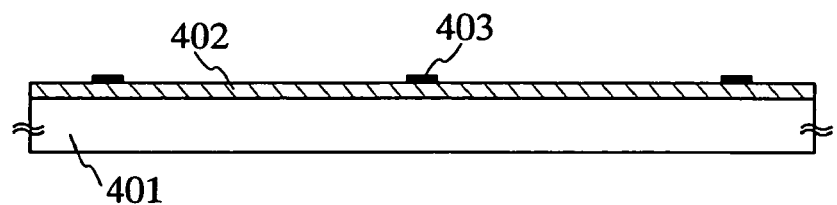
FIGS. 4A to 4E show a method for manufacturing a semiconductor device, including a transfer step.

In FIG. 4A, a metal layer 402 is formed on a first substrate 401, and a plurality of adhesive agents 403 are formed thereon.

A glass substrate (AN 100) is used for the first substrate 401 in this embodiment, as in Embodiment 1. Further, as for a metal layer, a metal layer 402 containing tungsten (W) as a main constituent is also used, as in Embodiment 1. Note that, the metal layer 402 is deposited by sputtering to have a film thickness of from 10 nm to 200 nm, preferably, from 50 nm to 75 nm.

The adhesive agent 403 to be formed on the metal layer 402 is formed by forming an amorphous silicon film and patterning this.

Figure 4B:
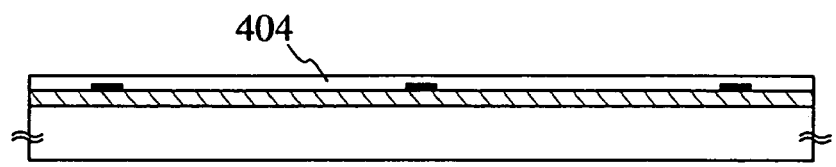

Then, an oxide layer 404 is formed (FIG. 4B). A film made of silicon oxide is deposited to be from 150 nm to 200 nm thick by sputtering using a silicon oxide target in this embodiment. The film thickness of the oxide layer 404 is preferably twice as much as the film thickness of the metal layer 402 or more.

Figure 4C:
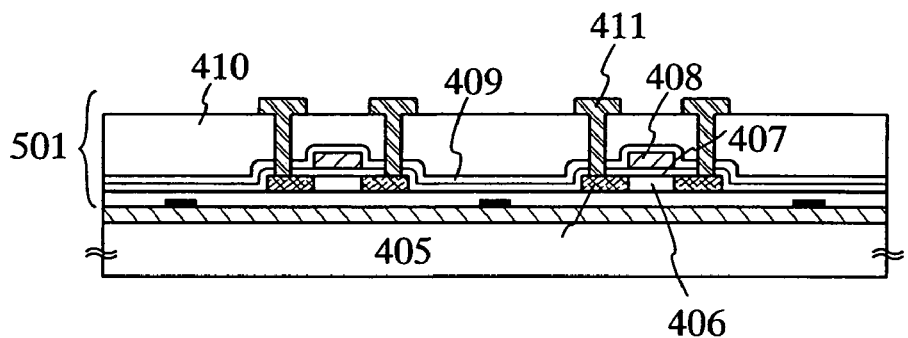

An element-formed layer 501 is formed on the oxide layer 404 (FIG. 4C). A plurality of TFTs (p-channel type TFT or n-channel type TFT) are formed in the element-formed layer 501, and it is assumed that an element (such as a light-emitting element or a liquid crystal element) connected to these TFTs are included, besides wirings 411 to connect these TFTs, an insulating film 410. In addition, a method for manufacturing of the element-formed layer including TFTs is not particularly limited in the present invention. The present invention can be implemented by combination with a publicly known manufacturing method, besides a manufacturing method shown in Embodiment 5. In addition, the TFT includes an impurity region 405 and a channel forming region 406 that are formed in a portion of a semiconductor film on the oxide layer 404, an insulating film 407 and a gate electrode 408.

In the case where the element-formed layer 501 is formed in this embodiment, as in Embodiment 1, a heat treatment to scatter hydrogen included inside a material film including at least hydrogen is performed after forming the material film (a semiconductor film or a metal film) including hydrogen. In addition, a layer made of a metal oxide having a crystal structure (not shown) is formed between the metal layer 402 and the oxide layer 404 by this heat treatment.

In addition, this layer made of the metal oxide (not shown) is formed in the interface between the metal layer 402 and the oxide layer 404, and therefore, the element-formed layer is easily separated from the substrate in a later step.

On the other hand, the adhesiveness of the adhesive agent 403 and the metal layer 402 can be enhanced by the heat treatment conducted while forming the element-formed layer 501.

Figure 4D:
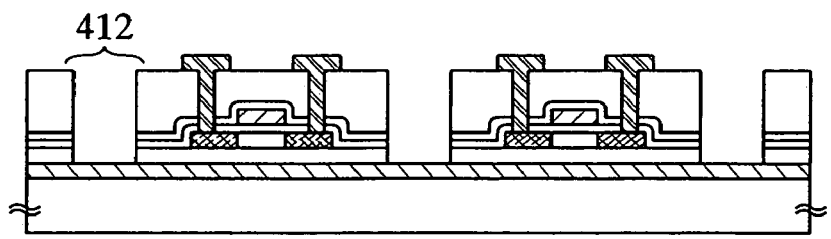

In this embodiment, after the wirings 411 included in the element-formed layer 501 are formed, the adhesive agent 403 is removed. Specifically, a portion of the insulating film 410 and the adhesive agent 403 are etched by dry etching to form an opening portion 412 (FIG. 4D).

For example, when the insulating films 407, 409, and 410, and the oxide layer 404 are etched and these are formed from silicon oxide, dry etching is conducted by using an etching gas including mainly carbon fluoride ($CF_4$). Further, when the adhesive agent 403 is etched, the adhesive agent 403 is formed from silicon and a portion including mainly silicon is left in a portion thereof, regardless of the reaction with the metal layer (e.g., W), etching can be conducted by using an etching gas including mainly hydrogen bromide (HBr) and chlorine ($Cl_2$). In addition, when the adhesive agent 403 is formed from silicon and a portion thereof forms a silicide (WSi) due to the reaction with the metal layer (W), the silicide can be etched by using an etching gas including mainly sulfur fluoride ($SF_6$) and hydrogen bromide (HBr).

Figure 4E:
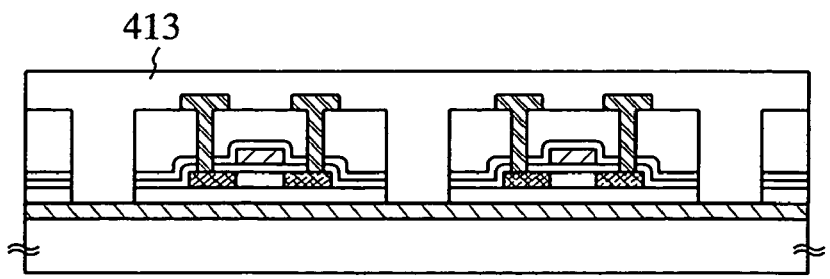

Then, the opening portion 412 is filled, and an insulating film 413 is formed to level a surface of the element-formed layer 501 (FIG. 4E). Note that, a silicon oxynitride film of from 1 μm to 3 μm thick formed by plasma CVD is used in this embodiment. The insulating film is not naturally limited to the silicon oxynitride film, but may be a single layer comprising an insulating material such as silicon nitride or silicon oxide, an organic insulating material such as acrylic, polyimide, or polyamide, or a laminate of the materials.

It is noted that description about the steps after leveling the element-formed layer 501 by using the insulating film 413 is omitted here, since the steps can be performed by using the same material and by the same method as those of Embodiment 1. The steps are as follows: 1. a step of forming an organic resin layer over the element-formed layer 501, and bonding a second substrate that is an auxiliary substrate thereto with a first adhesive layer therebetween; 2. a step of separating the first substrate 401 from the element-formed layer 501 bonded with the auxiliary substrate (the second substrate) by a physical means; 3. a step of forming a second adhesive layer and bonding a third substrate to an oxide layer (and the element-formed layer) with the second adhesive layer therebetween; and 4. a step of separating the second substrate from the element-formed layer.

As described above, a structure, shown in FIG. 5A, in which the element-formed layer 501 is transferred to the third substrate 418 with the second adhesive layer 417 therebetween, can be obtained.

Figure 5A:
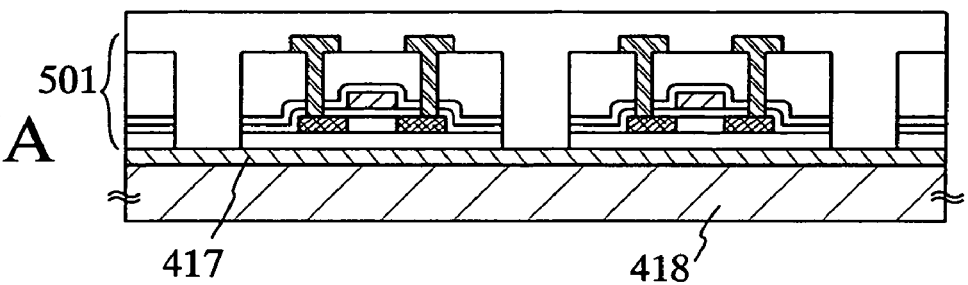
FIGS. 5A and 5B show a method for manufacturing a semiconductor device, including a transfer step.
Figure 5B:
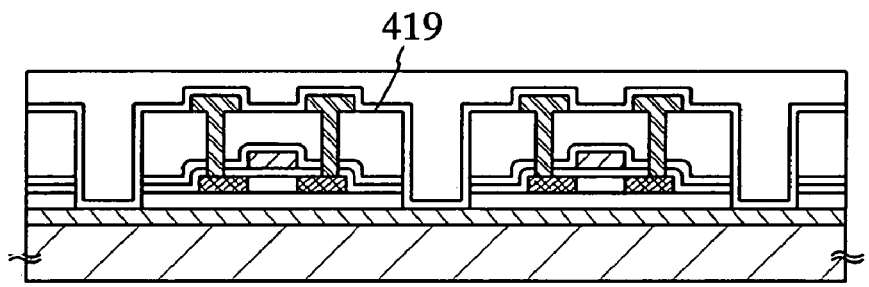

Further, in this embodiment, the opening portion 412 is formed in FIG. 4D, and then, an insulating film 419 may be formed to form a structure shown in FIG. 5B.

As described above, TFTs formed over the first substrate 401 can be separated and transferred to another substrate (the third substrate 418).

Embodiment 3

In this embodiment, a manufacturing method including a transfer step of the present invention that is partly different from that of Embodiment 1 or 2 is described with reference to FIGS. 6A to 6E, 7A and 7B.

Figure 6A:
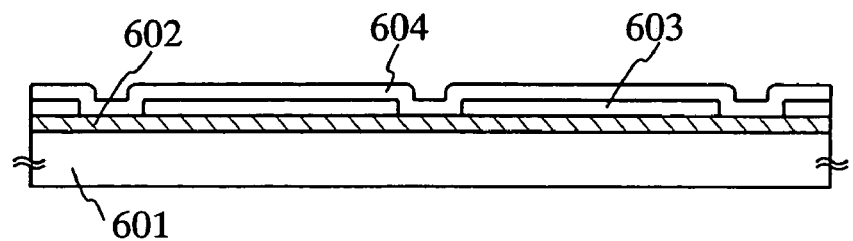
FIGS. 6A to 6E show a method for manufacturing a semiconductor device, including a transfer step.
Figure 6B:
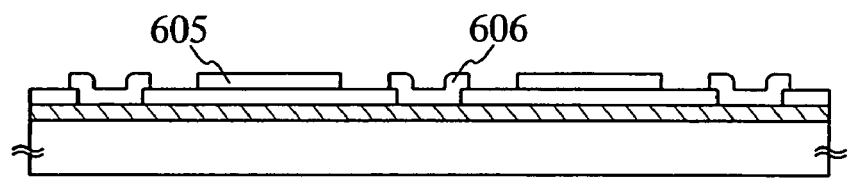

In FIG. 6A, a metal layer 602 is formed on a first substrate 601, and an oxide layer 603 is formed thereon.

A glass substrate (AN 100) is used for the first substrate 601 in this embodiment, as in Embodiment 1. Further, as for the metal layer, the metal layer 602 containing tungsten (W) as a main constituent is also used, as in Embodiment 1. Note that, the metal layer 602 is deposited by sputtering to have a film thickness of from 10 nm to 200 nm, preferably, from 50 nm to 75 nm.

The oxide layer 603 to be formed on the metal layer 602 is a film made of silicon oxide deposited to be from 150 nm to 200 nm thick by sputtering using a silicon oxide target. The film thickness of the oxide layer 603 is preferably twice as much as the film thickness of the metal layer 602 or more. In this embodiment, the oxide layer 603 is separated into a plurality of island-like portions by patterning.

Next, a semiconductor film 604 is formed to cover the oxide layer 603. In this embodiment, an amorphous silicon film is deposited by plasma CVD as the semiconductor film (FIG. 6A). The semiconductor film 604 is patterned, thereby obtaining a semiconductor a (605) formed on the oxide layer 603, and a semiconductor b (606) formed between two oxide layers that have been formed in isolation. It is noted that the semiconductor a (605) corresponds to an impurity region and a channel forming region of a TFT to be formed later, whereas the semiconductor b (606) corresponds to an adhesive agent of the present invention.

In other words, the present invention has a characteristic in that the semiconductor a (605) forming a portion of the TFT and the semiconductor b (606) forming the adhesive agent are formed simultaneously.

Figure 6C:
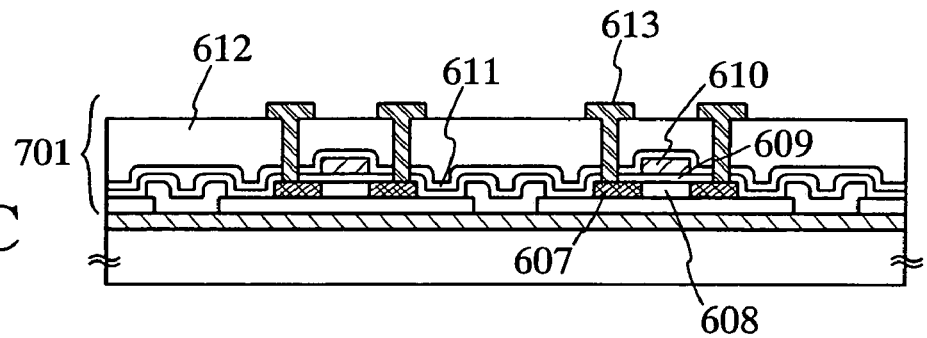

An element-formed layer 701 including the semiconductor a (605) as a portion thereof is formed (FIG. 6C). A plurality of TFTs (p-channel type TFTs or n-channel type TFTs) are formed in the element-formed layer 701, and it is assumed that an element (such as a light-emitting element or a liquid crystal element) connected to these TFTs are included, besides wirings 613 to connect these TFTs, an insulating film 612. In addition, a method for manufacturing the element-formed layer including TFTs is not particularly limited in the present invention. The present invention can be implemented by combination with a publicly known manufacturing method, besides a manufacturing method shown in Embodiment 5. In addition, the TFT includes an impurity region 607 and a channel forming region 608 that are formed in a portion of the semiconductor a (605) on the oxide layer 603, a gate insulating film 609, and a gate electrode 610.

In this embodiment, when the element-formed layer 701 is formed, as in Embodiment 1, a heat treatment to scatter hydrogen included inside a material film including at least hydrogen is performed after forming the material film (a semiconductor film or a metal film) including hydrogen. In addition, a layer made of a metal oxide having a crystal structure (not shown) is formed between the metal layer 602 and the oxide layer 603 by this heat treatment.

In addition, this layer made of the metal oxide (not shown) is formed in the interface between the metal layer 602 and the oxide layer 603, and therefore, the element-formed layer 701 is easily separated from the first substrate 601 in a later step.

On the other hand, the adhesiveness of the semiconductor b (606) that is an adhesive agent and the metal layer 602 can be enhanced by the heat treatment conducted while forming the element-formed layer 701.

After the wirings 613 included in the element-formed layer 701 is formed, the semiconductor b (606) is removed (FIG. 6D) in this embodiment. Specifically, a portion of the insulating film 612 and the semiconductor b (606) are etched by dry etching to form an opening portion 614.

For example, when the insulating films 609, 611, and 612 and the oxide layer 603 are etched and these are formed from silicon oxide, dry etching is conducted by using an etching gas including mainly carbon fluoride ($CF_4$). Further, when the semiconductor b (606) that is an adhesive agent is etched, the semiconductor b (606) is formed from silicon and a portion including mainly silicon is left in a portion thereof, regardless of the reaction with the metal layer (e.g., W), etching can be conducted by an etching gas including mainly hydrogen bromide (HBr) and chlorine ($Cl_2$). In addition, when the semiconductor b (606) is formed from silicon and a portion thereof forms a silicide (WSi) due to the reaction with the metal layer (W), the silicide can be etched by using an etching gas including mainly sulfur fluoride ($SF_6$) and hydrogen bromide (HBr).

Figure 6D:
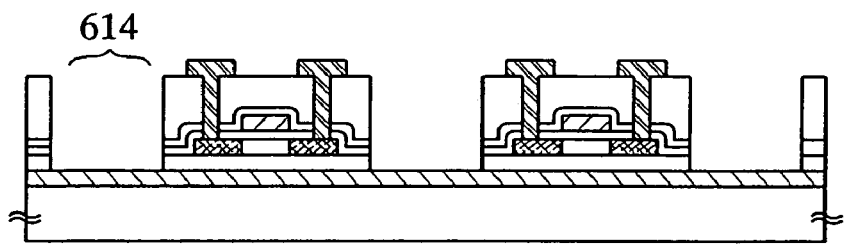
Figure 6E:
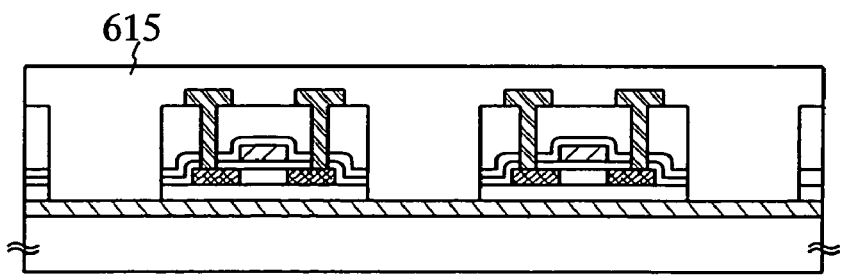

Then, the opening portion 614 is filled, and an insulating film 615 is formed to level a surface of the element-formed layer 701 (FIG. 6E). Note that, a silicon oxynitride film of from 1 μm to 3 μm thick formed by plasma CVD is used in this embodiment. The insulating film is not naturally limited to a silicon oxynitride film, but may be a single layer comprising an insulating material such as silicon nitride or silicon oxide, an organic insulating material such as acrylic, polyimide, or polyamide, or a laminate of the materials.

It is noted that description about the steps after leveling the element-formed layer 701 by using the insulating film 615 is omitted here, since the steps can be performed by using the same material and the same method as those of Embodiment 1. The steps are as follows: 1. a step of forming an organic resin layer over the element-formed layer 701, and bonding a second substrate that is an auxiliary substrate thereto with a first adhesive layer therebetween; 2. a step of separating the first substrate 601 from the element-formed layer 701 bonded with the auxiliary substrate (the second substrate) by a physical means; 3. a step of forming a second adhesive layer and bonding a third substrate to the oxide layer (and the element-formed layer) with the second adhesive layer therebetween; and 4. a step of separating the second substrate from the element-formed layer.

As described above, a structure, shown in FIG. 7A, in which the element-formed layer 701 is transferred to the third substrate 618 with the second adhesive layer 617 therebetween, can be obtained.

Figure 7A:
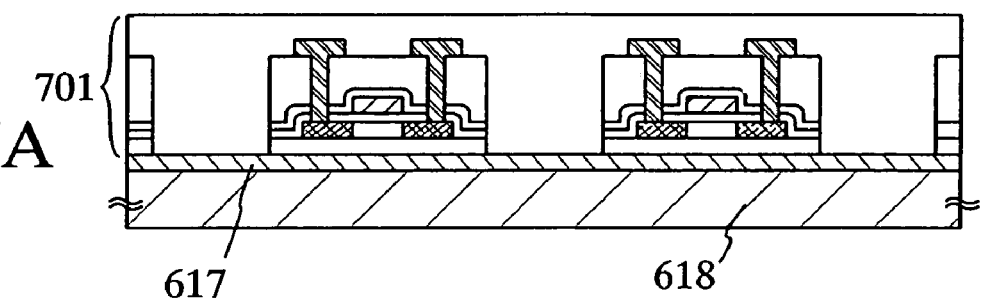
FIGS. 7A and 7B show a method for manufacturing a semiconductor device, including a transfer step.
Figure 7B:
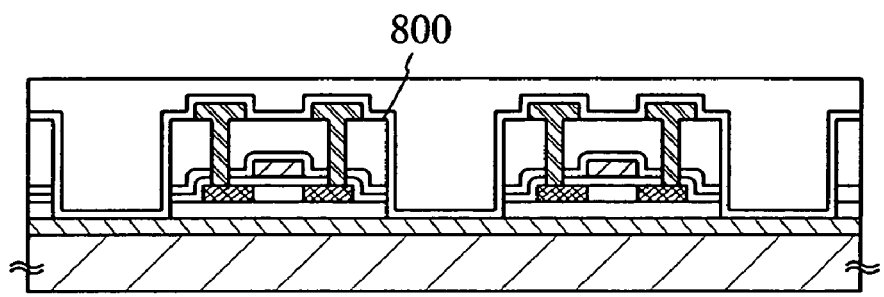

Further, in this embodiment, the opening portion 614 is formed in FIG. 6D, and then, an insulating film 800 may be formed to form a structure shown in FIG. 7B.

As described above, a TFT formed over the first substrate 601 can be formed over another substrate (the third substrate 618).

Embodiment 4

An arrangement and a shape of an adhesive agent in the present invention are described with reference to FIGS. 8A to 8D in this embodiment.

Figure 8A:
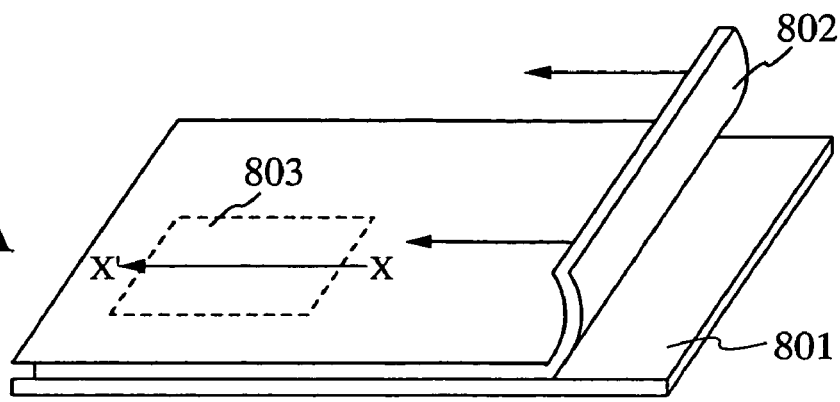
FIGS. 8A to 8D show a shape of an adhesive agent.

A transfer step is performed by separating an element-formed layer 802 formed on a substrate 801 by a physical means and bonding to another substrate, as shown in FIG. 8A. In the case of FIG. 8A, the element-formed layer 802 is separated in the direction of the arrow in FIG. 8A.

An adhesive agent is formed in a region 803 that is a portion of the element-formed layer 802 while forming the element-formed layer 802, and removed just before separation. An example of the arrangement and the shape of the adhesive agent formed in the element-formed layer 802 is shown in FIGS. 8B to 8D.

Figure 8B:
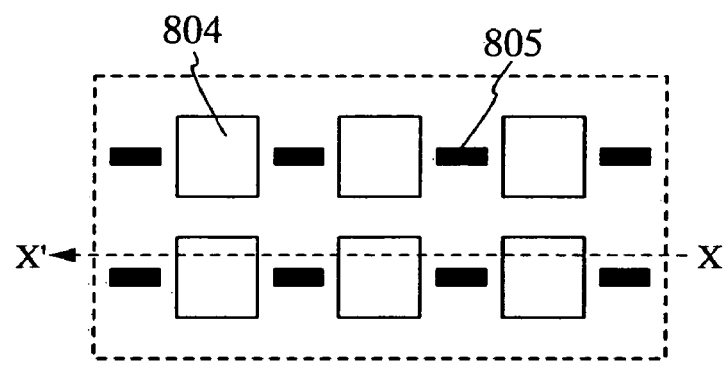

FIG. 8B shows the case where a square-shape adhesive agent 805 is formed among TFTs 804 that are arranged in the separation direction XX' in the region 803 where the plurality of TFTs 804 are formed. In this case, preferably, the square-shape adhesive agent 805 is rectangular, and is arranged so that the longer side of the rectangular adhesive agent is parallel to the separation direction XX'. Thus, the adhesive agent 805 has a square-shape, thereby easily separating the element-formed layer 802 from the substrate 801 after removing the adhesive agent 805.

Figure 8C:
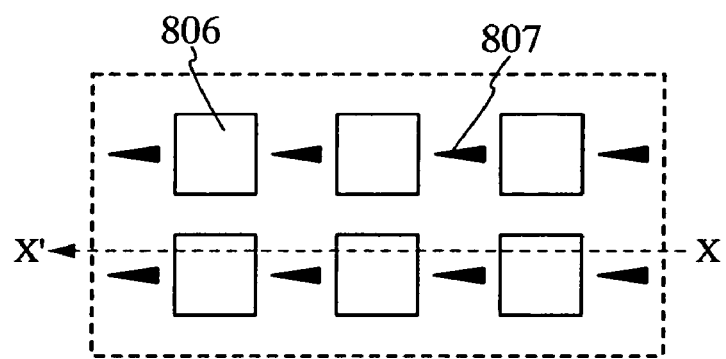

FIG. 8C shows the case where a triangle-shape adhesive agent 807 is formed among TFTs 806 that are arranged in the separation direction XX' in the region 803 where the plurality of TFTs 806 are formed. In this case, preferably, the triangle-shape adhesive agent 807 is arranged so that the base of the triangle-shape adhesive agent 807 is perpendicular to the separation direction XX'. Thus, the adhesive agent 807 has a triangle-shape, thereby easily separating the element-formed layer 802 from the substrate 801 after removing the adhesive agent 807.

Figure 8D:
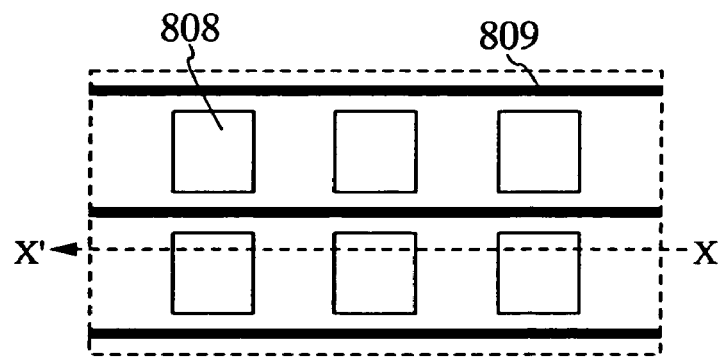

FIG. 8D shows the case where a line-shape adhesive agent 809 is formed among rows of a plurality of TFTs 808 that are arranged in the separation direction XX' in the region 803 where the plurality of TFTs 808 are formed. In this case, the line-shape adhesive agent 809 may be formed with the same length as the entire length of the plurality of TFTs 808 arranged in the separation direction XX', or as that of each one TFT 808. Thus, the adhesive agent 809 has a line-shape, thereby easily separating the element-formed layer 802 from the substrate 801 after removing the adhesive agent 807.

The arrangement and the shape of the adhesive agent shown in this embodiment are each one preferable example of the present invention, and do not limit the shape of the adhesive agent according to the present invention.

Embodiment 5

A method for simultaneously manufacturing an n-channel TFT and a p-channel TFT over one substrate is described in this embodiment with reference to FIGS. 9A to 9D and 10A to 10D.

A metal layer 902 is formed on a substrate 901, and then, an adhesive agent 903 is formed thereon.

In this embodiment, a glass substrate (#1737) is used for the substrate 901. A metal material including mainly tungsten (W) is used for the metal layer 902, as in Embodiment 1. The adhesive agent 903 is formed by patterning, so as to be arranged among TFTs to be formed later.

Subsequently, an oxide layer 904 that also serves as a base insulating film is formed over the metal layer 902 and the adhesive agent 903. In this embodiment, the oxide layer 904 is formed by depositing a silicon oxynitride film using $SiH_4$ and $N_2O$ as material gases (composition ratio: Si=32%, O=59%, N=7%, H=2%) to have a thickness of 100 nm at deposition temperature of 300° C. by plasma CVD.

Further, a semiconductor layer having an amorphous structure (in this case, an amorphous silicon layer) is formed to have a thickness of 54 nm with $SiH_4$ gas as a deposition gas at a deposition temperature of 300° C. by plasma CVD successively without exposure to an atmosphere. This amorphous silicon layer contains hydrogen; the hydrogen will be diffused by a subsequent heat treatment, and the amorphous silicon film can be separated inside the oxide layer or the interface with the oxide layer by a physical means.

Then, a nickel acetate salt solution containing nickel of 10 ppm by weight is applied by a spinner. Nickel elements can be sputtered on the entire surface instead of being applied. Then, a heat treatment is carried out for crystallization to form a semiconductor film having a crystal structure (here, a polysilicon layer). Here, after the heat treatment (at 500° C. for 1 hour) for dehydrogenation is carried out, and then the heat treatment (at 550° C. for 4 hours) for crystallization is carried out, thereby forming a silicon film having a crystal structure. Also, the heat treatment (at 500° C. for 1 hour) for dehydrogenation has also a function of a heat treatment for diffusing the hydrogen contained in the amorphous silicon layer into an interface between the metal layer 902 and the oxide layer 904. Also, note that, although a crystallization technique using nickel as a metal element for promoting crystallization of silicon is used here, other known crystallization techniques, for example, solid-phase growth and laser crystallization may be used.

Next, after the oxide film on the surface of the silicon film having a crystal structure is removed by dilute hydrofluoric acid or the like, laser light irradiation (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulsed laser light with a repetition frequency of approximately from 10 Hz to 1000 Hz is used, the pulsed laser light is condensed to from 100 $mJ/cm^2$ to 500 $mJ/cm^2$ by an optical system, and emitted with an overlap ratio of from 90% to 95%, and thus, the silicon film surface may be scanned. Here, the laser light irradiation is performed in an atmosphere under the conditions of a repetition frequency of 30 Hz and energy density of 470 $mJ/cm^2$.

Note that, an oxide film is formed on the surface by the laser light irradiation since the irradiation is conducted in an atmosphere or in an oxygen atmosphere. Though an example of using the pulsed laser is shown here, the continuous wave laser may also be used. When an amorphous semiconductor film is crystallized, the second harmonic through the fourth harmonic of basic waves is preferably applied by using the solid state laser which is capable of continuously oscillating in order to obtain crystals with large grain size. Typically, the second harmonic (a wavelength of 532 nm) or the third harmonic (a wavelength of 355 nm) of an Nd: $YVO_4$ laser (basic wave of 1064 nm) may be applied. Specifically, laser light emitted from the continuous wave type $YVO_4$ laser with 10 W output is converted into a harmonic by using a non-linear optical element. Also, a method of emitting a harmonic by applying $YVO_4$ crystals and the non-linear optical element into a resonator can be given. Then, preferably, the laser light is shaped so as to have a rectangular shape or an elliptical shape by an optical system, thereby irradiating the surface with the laser light. At this time, the energy density of approximately from 0.01 $MW/cm^2$ to 100 $MW/cm^2$ (preferably from 0.1 $MW/cm^2$ to 10 $MW/cm^2$) is required. The semiconductor film is irradiated with the laser light while moving the semiconductor film relatively to the laser light at approximately from 10 cm/s to 2000 cm/s rate.

In addition to the oxide film formed by this laser light irradiation, a barrier layer comprising an oxide film is formed to have a thickness of from 1 nm to 5 nm in total by treating the surface with ozone water for 120 seconds. The barrier layer is formed by using the ozone water in this embodiment. However, the barrier layer may be formed by depositing a oxide film of from 1 nm to 10 nm in thickness by a method of oxidizing the surface of the semiconductor film having the crystal structure by UV light irradiation in an oxygen atmosphere, a method of oxidizing the surface of the semiconductor film having the crystal structure by an oxygen plasma treatment, a plasma CVD, a sputtering, a vapor deposition or the like. Further, the oxide film formed by the laser light irradiation may be removed before forming the barrier layer.

Over the barrier layer, an amorphous silicon film containing an argon element, which serve as a gettering site, is formed to have a thickness of from 10 nm to 400 nm, 100 nm in this embodiment, by sputtering. In this embodiment, the amorphous silicon film containing the argon element is formed in an atmosphere containing argon using a silicon target. The amorphous silicon film containing an argon element is formed under the deposition conditions where the flow rate of monosilane to argon ($SiH_4$:Ar) is 1:99, a deposition pressure is 6.665 Pa (0.05 Torr), RF power density is 0.087 $W/cm^2$, and a deposition temperature is 350° C. in the case of using plasma CVD.

Then, a furnace heated at 650° C. is used for a heat treatment for 3 minutes to perform gettering to reduce the nickel concentration in the semiconductor film having the crystal structure. A lamp annealing apparatus may be used instead of the furnace.

Subsequently, the amorphous silicon film containing the argon element, which serves as the gettering site, is selectively removed using the barrier layer as an etching stopper, thereafter the barrier layer is selectively removed by dilute hydrofluoric acid. Note that, since nickel tends to move to a region having a high oxygen concentration during gettering, the barrier layer made of the oxide film is preferably removed after the gettering.

Figure 9A:
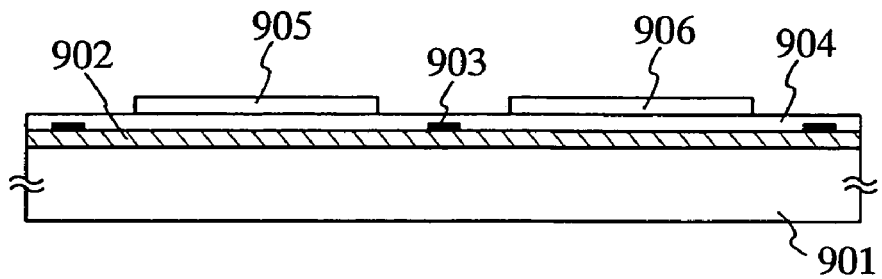
FIGS. 9A to 9D show a method for manufacturing a TFT.

Then, after a thin oxide film is formed from ozone water on the surface of the obtained silicon film having a crystal structure (also referred to as a polysilicon film), a mask made of resist is formed, and an etching step is conducted thereto to obtain a desired shape, thereby forming island-like semiconductor layers 905 and 906 that are separated from one another. After the formation of the semiconductor layers 905 and 906, the mask made of resist is removed (FIG. 9A).

Figure 9B:
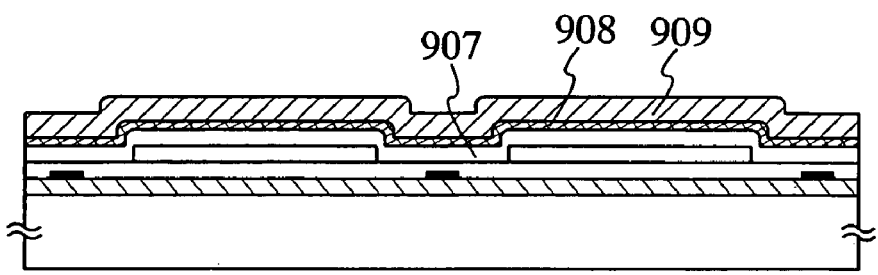

Next, the oxide film is removed with the etchant containing hydrofluoric acid, and at the same time, the surfaces of the silicon films (semiconductor layers 905 and 906) are washed. Thereafter, an insulating film containing silicon as its main constituent, which serves as a gate insulating film 907, is formed. In this embodiment, a silicon oxide film is formed to have a thickness of 115 nm by plasma CVD (FIG. 9B).

Next, a first conductive film 908 having a thickness of from 20 nm to 100 nm and a second conductive film 909 having a thickness of from 100 nm to 400 nm are laminated over the gate insulating film 907. In this embodiment, a 50 nm thick tantalum nitride film serving as the first conductive film 908 and a 370 nm thick tungsten film serving as the second conductive film 909 are sequentially laminated over the gate insulating film 907.

As a conductive material for forming the first conductive film 908 and the second conductive film 909, an element selected from the group consisting of Ta, W, Ti, Mo, Al and Cu, or an alloy material or a compound material containing the elements as its main constituent can be utilized. Further, a semiconductor film as typified by a polysilicon film doped with an impurity element such as phosphorous, or an AgPdCu alloy may be used for the first conductive film 908 and the second conductive film 909. In addition, the present invention is not limited to a two-layer structure. For example, a three-layer structure may be adopted in which a 50 nm thick tungsten film, an alloy film of aluminum and silicon (Al—Si) of 500 nm thick, and a 30 nm thick titanium nitride film are sequentially laminated. Moreover, in the case of the three-layer structure, tungsten nitride may be used instead of tungsten as the first conductive film, an alloy film of aluminum and titanium (Al—Ti) may be used instead of the alloy film of aluminum and silicon (Al—Si) as the second conductive film, and a titanium film may be used instead of the titanium nitride film as the third conductive film. In addition, a single layer structure may also be adopted.

Figure 9C:
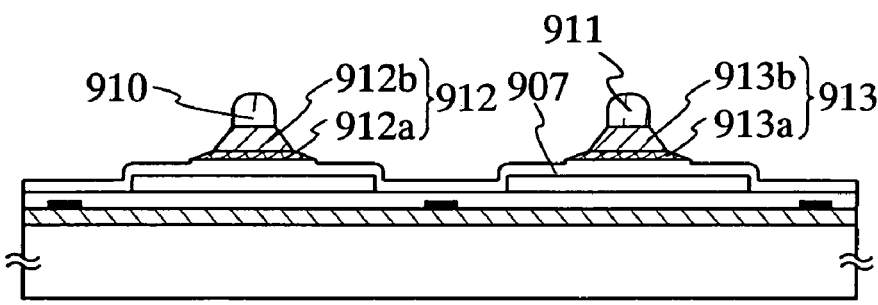

Next, mask made of resist 910 and 911 are formed by a light exposure step as shown in FIG. 9C. Then, a first etching treatment is carried out for forming gate electrodes and wirings. The first etching treatment is carried out under the first and the second etching conditions. It is preferable to carry out ICP (inductively coupled plasma) etching. The film can be etched to have a desired tapered shape by ICP etching under suitably adjusted etching conditions (that is, the amount of power applied to a coiled electrode, the amount of power applied to an electrode on the substrate side, the temperature of the electrode on the substrate side, etc.). As the etching gas, chlorine-based gas as typified by $Cl_2$, $BCl_3$, $SiCl_4$, or $CCl_4$, fluorine-based gas as typified by $CF_4$, $SF_6$, or $NF_3$, or $O_2$ are appropriately utilized.

The substrate side (sample stage) also receives an RF power of 150 W (13.56 MHz) to apply a substantially negative self-bias voltage. The size of the substrate side electrode is 12.5 cm×12.5 cm and the coiled electrode is a disc 25 cm in diameter (here, a quartz disc for which the coil is provided). The W film is etched under these first etching conditions so that the edge portion of the first conductive layer has a tapered shape. Under the first etching conditions, the rate of etching the W film is 200.39 nm/min. and the rate of etching the TaN film is 80.32 nm/min., and the selective ratio of W to TaN is therefore about 2.5. The W film is tapered under the first etching conditions at an angle of about 26°. Thereafter, the first etching conditions are switched to the second etching conditions without removing the masks made of resist 910 and 911. The second etching conditions include using $CF_4$ and $Cl_2$ as the etching gases, setting the flow rate of the gases to 30:30 (sccm), and giving an RF (13.56 MHz) power of 500 W to the coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions including a mixture of $CF_4$ and $Cl_2$, the TaN film and the W film are etched to almost the same degree. The rate of etching the W film is 58.97 nm/min. and the rate of etching the TaN film is 66.43 nm/min. under the second etching conditions. In order to etch the films without leaving any residue on the gate insulating film, the etching time may be prolonged at a rate of approximately from 10% to 20%.

In the first etching treatment, the first conductive layer and the second conductive layer are tapered around the edge portions by forming the mask made of resist into a proper shape and by the effect of the bias voltage applied to the substrate side. The angle of the tapered portions may be set from 15° to 45°.

The first shape conductive layers 912 and 913 comprising the first conductive layer and the second conductive layer (the first conductive layers 912a, 913a and the second conductive layers 912b, 913b) are formed by the first etching treatment. The insulating film 907 to serve as a gate insulating film is etched appropriately from 10 nm to 20 nm. The gate insulating film 907 has a thinned region that is not covered with the first shape conductive layers 912 and 913.

Figure 9D:
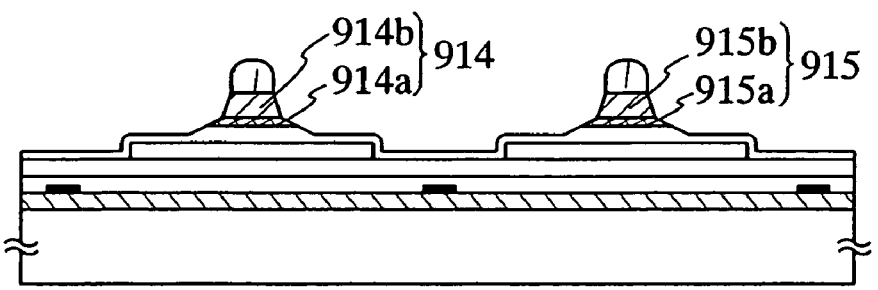

Next, the first shape conductive layers 914 and 915 are formed by a second etching treatment without removing the masks made of resist as shown in FIG. 9D. Here, $SF_6$, $Cl_2$ and $O_2$ are used as etching gases, the flow rate of the gases is set to 24/12/24 sccm, and RF (13.56 MHz) power of 700 W is applied to a coiled electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching treatment, the rate of etching W is 227.3 nm/min, the rate of etching TaN is 32.1 nm/min, a selective ratio of W to TaN is 7.1, the rate of etching SiON that is the gate insulating film 911 is 33.7 nm/min, and a selective ratio of W to SiON is 6.83. In the case where $SF_6$ is used as the etching gas, the selective ratio with respect to the gate insulating film 911 is high as described above. Thus, reduction in the film thickness can be suppressed. In this embodiment, the film thickness of the insulating film 907 is reduced by about 8 nm.

By the second etching treatment, the taper angle of W can be 70°. By the second etching treatment, second conductive layers 914b and 915b are formed. At this time, the first conductive layers are hardly etched to be first conductive layers 914a and 915a. Note that, the first conductive layers 914a and 915a have almost the same size as the first conductive layers 912a and 913a. Actually, there is a case where the width of the first conductive layer may be reduced by approximately 0.3 μm, namely, approximately 0.6 μm in the total line width in comparison with before the second etching treatment. However, there is almost no change in the size.

Further, in the case where, instead of the two-layer structure, the three-layer structure is adopted in which a 50 nm thick tungsten film, a 500 nm thick alloy film of aluminum and silicon (Al—Si), and a 30 nm thick titanium nitride film are sequentially laminated, under the first etching conditions of the first etching treatment in which: $BCl_3$, $Cl_2$ and $O_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coiled electrode with a pressure of 1.2 Pa to generate plasma, etching is performed for 117 seconds. As for the second etching conditions of the first etching treatment, $CF_4$, $Cl_2$ and $O_2$ are used, the flow rate of the gases is set to 25/25/10 sccm, RF (13.56 MHz) power of 20 W is also applied to the substrate side (sample stage), and RF (13.56 MHz) power of 500 W is applied to a coiled electrode with a pressure of 1 Pa to generate plasma. It is sufficient that etching is performed for about 30 seconds under the above conditions. In the second etching treatment, $BCl_3$ and $Cl_2$ are used, the flow rate of the gases are set to 20/60 sccm, RF (13.56 MHz) power of 100 W is applied to the substrate side (sample stage), and RF (13.56 MHz) power of 600 W is applied to a coiled electrode with a pressure of 1.2 Pa to generate plasma, thereby performing etching.

Figure 10A:
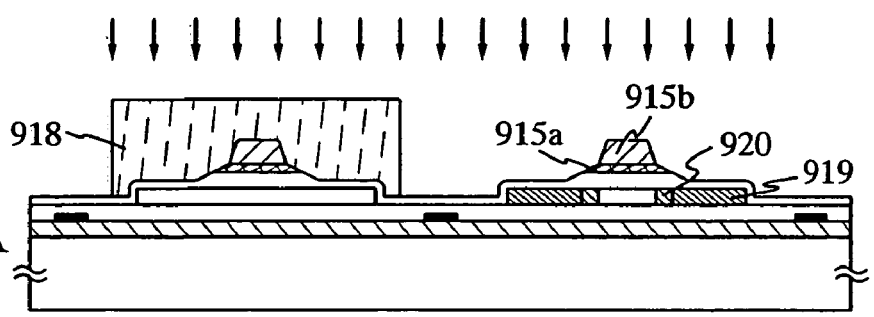
FIGS. 10A to 10D show a method for manufacturing a TFT.

Next, the masks made of resist 910 and 911 are removed, and then, a mask made of resist 918 is formed to perform a first doping treatment as shown in FIG. 10A. The doping treatment may be conducted by ion doping or ion implantation. Note that the mask 918 is a mask for protecting a semiconductor layer forming a p-channel TFT and the vicinity thereof.

Ion doping for the first doping treatment is conducted by doping phosphorous (P) under the conditions of a dosage of $1.5 \times 10^{15}$ atoms/cm$^2$ and an accelerating voltage of from 60 keV to 100 keV. As an impurity element imparting n-type conductivity, phosphorous (P) or arsenic (As) can typically be used. In this case, impurity regions are formed in each semiconductor layer in a self-aligning manner by using the second conductive layer 914b and 915b as masks. Of course, the region covered with the mask 918 is not doped. Thus, a first impurity region 919 and a second impurity region 3920 are formed. An impurity element imparting n-type conductivity is added to the first impurity region 919 in a concentration range of $1 \times 10^{20}$ atoms/cm$^3$ to $1 \times 10^{21}$ atoms/cm$^3$. Here, the region having the same concentration range as the first impurity region is also called an n$^+$ region.

Further, the second impurity region 920 is formed at a lower concentration than that of the first impurity region 919 because of the first conductive layer 915a, and added with the impurity element imparting n-type conductivity in a concentration range of $1 \times 10^{18}$ atoms/cm$^3$ to $1 \times 10^{19}$ atoms/cm$^3$. Note that since doping is conducted by passing impurities through the portion of the first conductive layer 915a having a tapered shape, the second impurity region 920 has a concentration gradient in which an impurity concentration increases toward the end portion of the tapered portion. Here, the region having the same concentration range as the second impurity region 920 is called an n$^-$ region.

Figure 10B:
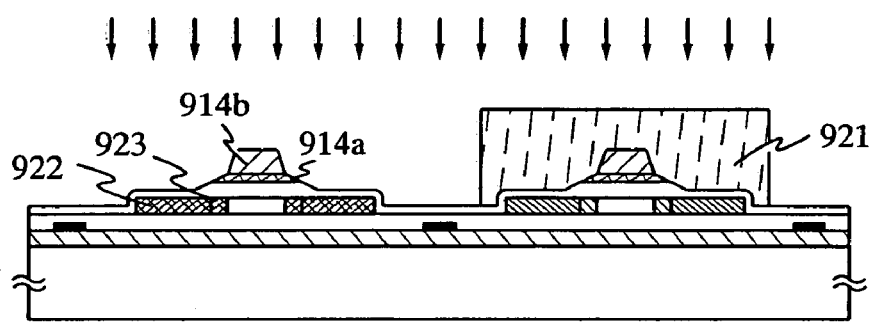

Next, after the mask made of resist 918 is removed, another mask made of resist 921 is newly formed, and a second doping treatment is conducted as shown in FIG. 10B. The doping treatment may be conducted by ion doping or ion implantation. Note that, the mask 921 is a mask for protecting a semiconductor layer forming a n-channel TFT and the vicinity thereof.

Ion doping for the second doping treatment is conducted by doping boron (B) under the conditions of a dosage of from $1 \times 10^{15}$ atoms/cm$^2$ to $2 \times 10^{16}$ atoms/cm$^2$ and an accelerating voltage of from 50 keV to 100 keV. In this case, impurity regions are formed in each semiconductor layer in a self-aligning manner by using the second conductive layer 914b and 915b as masks. Of course, the region covered with the mask 921 is not doped. By the second doping treatment as described above, a third impurity region 922 and a fourth impurity region 923 are formed in which an impurity element imparting p-type conductivity is added to the semiconductor layer forming the p-channel TFT.

Further, the impurity element imparting p-type conductivity is added to the third impurity region 922 in a concentration range of $1 \times 10^{20}$ to $1 \times 10^{21}$ atoms/cm$^3$.

Further, a fourth impurity region 923 is formed in a region overlapping with the tapered portion of the first conductive layer 914a, and are added with the impurity element imparting p-type conductivity in a concentration range of $1 \times 10^{18}$ to $1 \times 10^{20}$ atoms/cm$^3$. Note that since doping is conducted by passing impurities through the portion of the first conductive layer 914a having a tapered shape, the fourth impurity region 923 has a concentration gradient in which an impurity concentration increases toward the end portion of the tapered portion. Here, the region having the same concentration range as the fourth impurity region 923 is also called a p$^-$ region.

Through the above-described steps, the impurity regions having n-type or p-type conductivity are formed in the respective semiconductor layers. The second shape conductive layers 914 and 915 become gate electrodes of TFTs.

Then, a step of activating the impurity element added to the respective semiconductor layers is conducted. This activation step is performed by a rapid thermal annealing (RTA) method using a lamp light source, a method of emitting YAG laser light or excimer laser light from the back surface, a heat treatment using a furnace, or by combining the methods.

A first insulating film 924 is formed. Note that, a silicon oxynitride film of 50 nm thick formed by plasma CVD is used in this embodiment. The insulating film is not naturally limited to a silicon oxynitride film, but may be a single layer made of an insulating material such as silicon nitride, or silicon oxide, or a laminate of the materials.

Then, a second insulating film 925 is formed on the first insulating film 924. Insulating films such as silicon nitride, silicon oxynitride, and silicon oxide can be used for the second insulating film 925. In this embodiment, a silicon nitride film of 50 nm thick formed by plasma CVD is used.

Figure 10C:
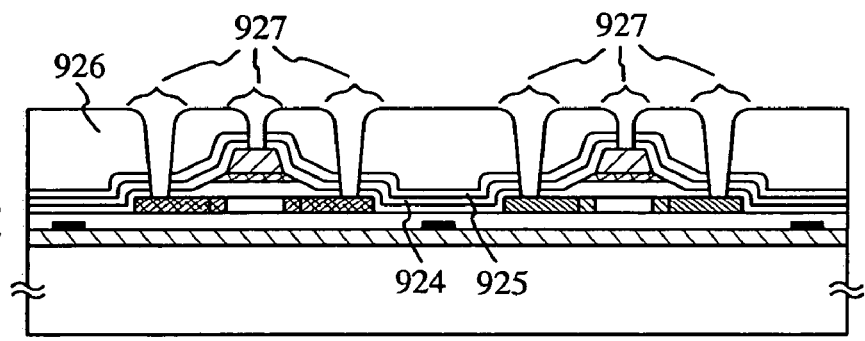

Next, the second insulating film 925 made of a silicon nitride film is formed, and then, a heat treatment (at temperatures from 300° C. to 550° C. for 1 to 12 hours) is performed, thereby conducting a step of hydrogenating the semiconductor layers (FIG. 10C). This step is a step of terminating dangling bonds of the semiconductor layers by hydrogen contained in the second insulating film 925. As another means for hydrogenation, a heat treatment at 350° C. in the hydrogen atmosphere, or plasma hydrogenation (using hydrogen excited by plasma) may be conducted.

Next, a third insulating film 926 is formed from an organic insulating material on the second insulating film 925. In this embodiment, an acrylic resin film with a thickness of 1.6 μm is formed. Then, a contact hole 927 that reaches each impurity region is formed.

Since the acrylic resin film used in this embodiment is photosensitive acryl, contact holes can be provided in desired positions by exposing the acrylic resin film to light and developing it. Portions of the first insulating film 924 and the second insulating film 925 are etched by dry etching. The first insulating film 924 is used as an etching stopper to etch partly the second insulating film 925, then, the first insulating film 924 is partly etched. Thus, the contact holes 927 are obtained.

In this embodiment, the case where the contact holes are formed after forming the third insulating film 926 by using an organic resin film is explained, however, the first insulating film 924 and the second insulating film 925 can be etched by dry-etching before forming the third insulating film 926. In this case, the substrate is preferably heat-treated at temperatures from 300° C. to 550° C. for 1 to 12 hours after etching treatment and before forming the third insulating film 926.

Figure 10D:
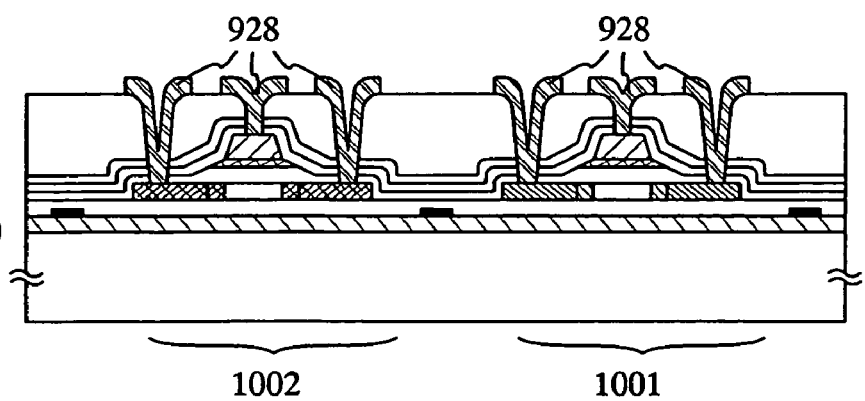

Then, wirings 928 are formed by using Al, Ti, Mo, W, or the like, as shown in FIG. 10D, consequently, an n-channel TFT 1001 and a p-channel TFT 1002 can be formed over the same substrate.

Embodiment 6

Figure 11A:
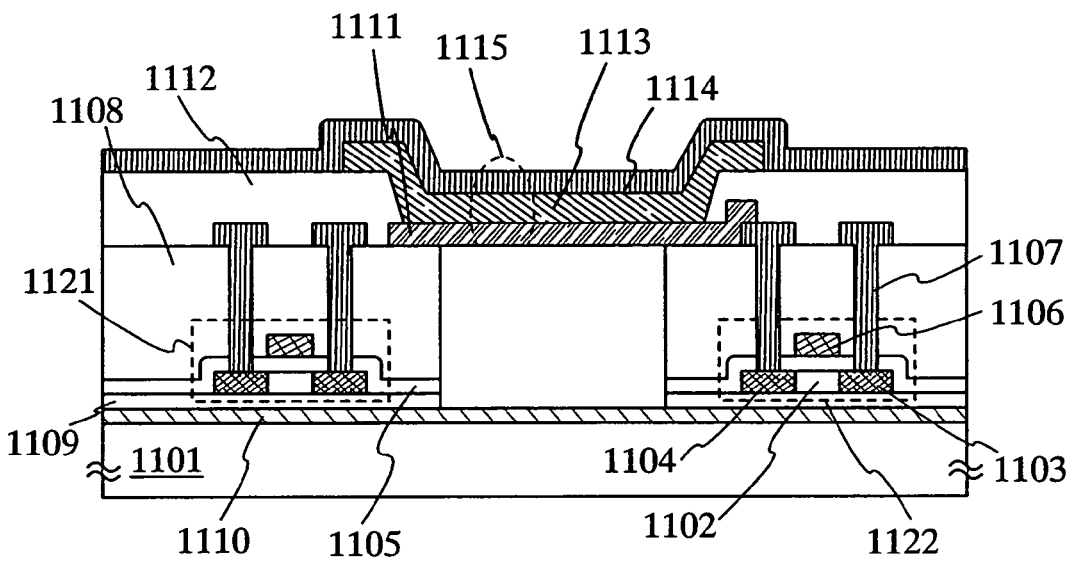
FIGS. 11A to 11C show a structure of a light-emitting element formed in a pixel portion.
Figure 11B:
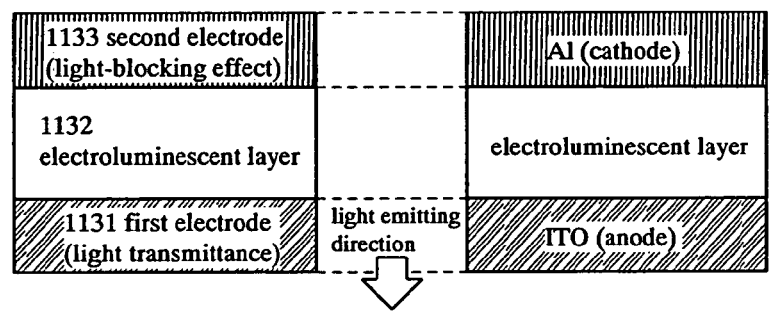
Figure 11C:
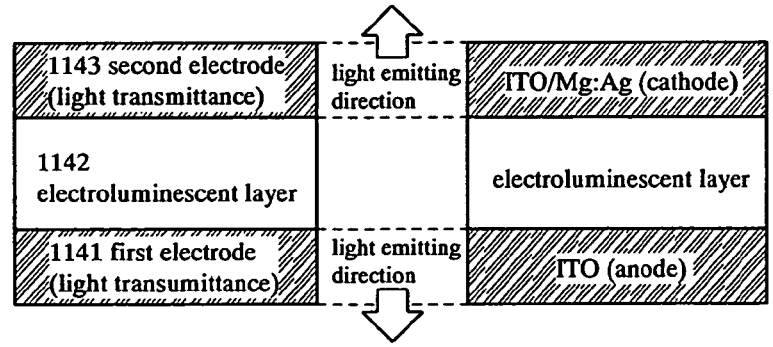

In this embodiment, a light-emitting device including a light-emitting element in a pixel portion of a panel, among semiconductor devices formed according to the present invention, is described with reference to FIGS. 11A to 11C. FIG. 11A shows a cross-sectional structure of the light-emitting element, whereas FIGS. 11B and 11C show an element-structure of the light-emitting element. Note that, the light-emitting element shown here includes a first electrode that is electrically connected to a current control TFT, and a second electrode that sandwich an electroluminescent layer with the first electrode.

In FIG. 11A, an adhesive layer 1110 and an oxide layer 1109 are formed on a substrate 1101, and a thin film transistor (TFT) is formed thereon. FIG. 11A shows a current control TFT 1122 that is electrically connected to a first electrode 1111 of a light-emitting element 1115 and that has a function of controlling current supplied to the light-emitting element 1115, and a switching TFT 1121 for controlling a video signal applied to a gate electrode of the current control TFT 1122.

A silicon substrate having light blocking effect is used as the substrate 1101. A glass substrate, a quartz substrate, a resin substrate, a flexible substrate material (plastics), however, may be used. In addition, an active layer of each TFT includes, at least, a channel forming region 1102, a source region 1103, and a drain region 1104.

The active layer of each TFT is covered with a gate insulating film 1105, and a gate electrode 1106 is formed to overlap with the channel forming region 1102 with the gate insulating film 1105 therebetween. An interlayer insulating film 1108 is provided to cover the gate electrode 1106. An organic resin film such as polyimide, polyamide, acrylic (including photosensitive acrylic), or BCB (benzo cyclo butene) can be used for a material for the interlayer insulating film 1108 as well as an insulating film containing silicon such as silicon oxide, silicon nitride, silicon oxynitride.

Wirings 1107 that are electrically connected to the source region 1103 of the current control TFT 1122 are formed in an opening portion of an interlayer insulating film 1108, and a first electrode 1111 that is electrically connected to the drain region 1104 are formed. Note that, when the first electrode 1111 is an anode, the current control TFT 1122 is preferably a p-channel. When the first electrode 1111 is a cathode, the current control TFT 1122 is preferably an n-channel.

The above-described steps can be performed according to the other embodiments, and thus, the description thereof is omitted in this embodiment. It is should be noted that the opening portion formed in the steps of separation and transfer are filled by forming the interlayer insulating film 1108. The wirings 1107 are etched back to expose a part thereof, and then, the first electrode 1111 is formed on the wirings 1107. The insulating layer 1112 is formed to cover end portions of the first electrode 1111, the wirings 1107, and the like. Then, an electroluminescent layer 1113 is formed on the first electrode 1111, and the second electrode 1114 is formed thereon, thereby completing the light-emitting element 1115.

In addition, materials of the first electrode 1111 and the second electrode 1114 can be selected arbitrarily in this embodiment. However, when an electrode to function as an anode is formed, a conductive material generally having a large work function (for example, the work function of 4.0 eV or more) is preferably used. On the contrary, when an electrode to function as a cathode is formed, it is desirable to use a conductive material generally having a small work function (for example, the work function of 3.5 eV or less). When the electrode that can transmit the light generated in the electroluminescent layer is formed, it is necessary to form the electrode by using a material having light transmittance. In this case, only one electrode may be formed from a material having light transmittance, the other may be formed from a material having light blocking effect. The light-emitting element which can emit light from the both electrodes sides, however, can be formed by forming the both electrodes from materials having light transmittance.

In the light-emitting element shown in FIG. 11A, holes are injected into the electroluminescent layer 1113 from the electrode to serve as an anode, whereas electrons are injected to the electroluminescent layer 1113 from the electrode to serve as a cathode. And recombination of the holes and the electrons occurs in the electroluminescent layer 1113, thereby obtaining light-emission.

The electroluminescent layer 1113 includes at least the light-emitting layer. The electroluminescent layer 1113 is formed by laminating one layer or a plurality of layers having a different function for carriers, such as a hole injection layer, a hole transporting layer, a blocking layer, an electron transporting layer and an electron injection layer.

Known low molecular-based organic compounds, high molecular-based organic compounds, and intermediate molecular-based organic compounds can be used as a material for forming the electroluminescent layer 1113. Note that, the term intermediate molecular-based organic compound denotes organic compounds that do not have sublimation property but whose number of molecules is equal to or less than 20, and whose molecular chain length is equal to or less than 10 μm.

Note that, materials as shown below can, specifically, be used as a material for forming the electroluminescent layer 1113.

Porphyrins are effective as a hole injection material for forming the hole injection layer, in the case of an organic compound, for example, phthalocyamine (hereinafter referred to as $H_2$-Pc), copper phthalocyamine (hereinafter referred to as Cu-Pc), or the like may be used. A material that is a conductive high molecular compound treated by chemical doping can also be used, and polyethylene dioxythiophene (hereinafter referred to as PEDOT) doped with polystyrene sulfonate (hereinafter referred to as PSS), polyaniline, polyvinyl carbazole (hereinafter referred to as PVK), and the like can be given as examples.

As the hole transporting material used for forming the hole transporting layer, an aromatic amine-based (that is, compound having a benzene ring-nitrogen bond) compound is preferred. Widely used materials include, for example, in addition to the above-mentioned TPD, derivatives thereof such as 4,4'-bis[N-(1-naphthyl)-N-phenyl-amino]-biphenyl (hereafter, referred to as "α-NPD"). Also used are star burst aromatic amine compounds, including: 4,4',4"-tris(N,N-diphenyl-amino)-triphenyl amine (hereafter, referred to as "TDATA"); and 4,4',4"-tris[N-(3-methylphenyl)-N-phenyl-amino]-triphenyl amine (hereafter, referred to as "MTDATA").

Specific examples of the light-emitting material used for forming, the light-emitting layer include metal complexes such as tris(8-quinolinolato)aluminum (hereafter, referred to as $Alq_3$), tris(4-methyl-8-quinolinolato)aluminium (hereafter, referred to as $Almq_3$), and bis(10-hydroxybenzo[h]-quinolinate)beryllium (hereafter, referred to as $BeBq_2$), and bis(2-methyl-8-quinolinolato)-(4-hydroxy-biphenylyl)-aluminum (hereafter, referred to as BAlq), bis[2-(2-hydroxyphenyl)-benzooxazolate]zinc (hereafter, referred to as $Zn(BOX)_2$) and bis[2-(2-hydroxyphenyl)-benzothiazolate]zinc (hereafter, referred to as $Zn(BTZ)_2$). Also, various fluorescent dyes may be used. Triplet electroluminescence materials may also be used and main examples thereof include complexes with platinum or iridium as central metal. Known triplet electroluminescence materials include tris(2-phenylpyridine) iridium (hereafter, referred to as $Ir(ppy)_3$),2,3,7,8,12,13,17,18-octaethyl-21H, and 23H-porphyrin-platinum (hereafter, referred to as PtOEP).

Metal complexes are often used as the electron transporting material for forming the electron transporting layer. Preferred examples thereof include: metal complexes having a quinoline skeleton or benzoquinoline skeleton, such as the aforementioned $Alq_3$, $Almq_3$, $BeBq_2$; and mixed ligand complexes such as BAlq. Other examples include metal complexes having oxazole-based and thiazole-based ligands such as $Zn(BOX)_2$ and $Zn(BTZ)_2$. Other materials that are capable of transporting electrons than the metal complexes are: oxadiazole derivatives such as 2-(4-biphenyl)-5-(4-tert-butylphenyl)-1,3,4-oxadiazole (hereafter referred to as PBD), and 1,3-bis[5-(p-tert-butylphenyl)-1,3,4-oxadiazole-2-yl]benzene (hereafter, referred to as OXD-7); triazole derivatives such as 3-(4-tert-butylphenyl)-4-phenyl-5-(4-biphenylyl)-1,2,4-triazole (hereafter, referred to as TAZ) and 3-(4-tert-butylphenyl)-4-(4-ethylphenyl)-5-(4-biphenylyl)-1,2,4-triazole (hereafter, referred to as p-EtTAZ); and phenanthroline derivatives such as bathophenanthroline (hereafter, referred to as BPhen) and bathocuproin (hereafter, referred to as BCP).

In addition, in case that the electroluminescent layer includes the blocking layer, the above-mentioned BAlq, OXD-7, TAZ, p-EtTAZ, BPhen, BCP, and the like are effective as hole blocking materials for forming the blocking layer because of their high excitation energy level.

FIG. 11B shows a structure of the case where a first electrode 1131 is an anode made of a material having light transmittance, and a second electrode 1133 is a cathode made of a material having light-blocking effect. In this case, the first electrode 1131 can be formed by using a transparent conductive film such as an indium tin oxide (ITO) film, or a transparent conductive film in which 2% to 20% zinc oxide (ZnO) is mixed into indium oxide, IZO, or $In_2O_3$—ZnO, whereas the second electrode 1133 can be made of Al, Ti, W, or the like. Here is shown a case where the first electrode 1131 is made of ITO, and the second electrode 1133 is made of Al. The light generated in the electroluminescent layer 1132 is emitted from the first electrode 1131 side. It is noted that the material for forming the electroluminescent layer 1132 can be selected appropriately from the materials mentioned above.

The present invention is not limited to the above-mentioned structure. Alternatively, the first electrode 1131 can be an anode made of a material having light-blocking effect, and the second electrode 1133 is a cathode made of a material having light transmittance. In this case, the light is emitted from the second electrode 1133 side.

FIG. 11C shows a case where both a first electrode 1141 and a second electrode 1143 are made from materials having light transmittance, and the first electrode 1141 is an anode and the second electrode 1143 is a cathode. In this case, the first electrode 1141 can be formed by using a transparent conductive film such as an indium tin oxide (ITO) film, or a transparent conductive film in which 2% to 20% zinc oxide (ZnO) is mixed into indium oxide, IZO, or $In_2O_3$—ZnO, as in FIG. 11B, whereas the second electrode 1143 can be formed by laminating Mg:Ag (an alloy of magnesium and silver) having a small function and ITO. In this case, the light generated in the electroluminescent layer 1142 is emitted from both sides of the first electrode 1141 and the second electrode 1143. It is noted that the material for forming the electroluminescent layer 1142 in this structure can be also selected appropriately from the materials mentioned above.

Embodiment 7

In this embodiment, a liquid crystal device including a liquid crystal element in a pixel portion of a panel, among semiconductor devices formed according to the present invention, is described with reference to FIG. 12.

Figure 12:
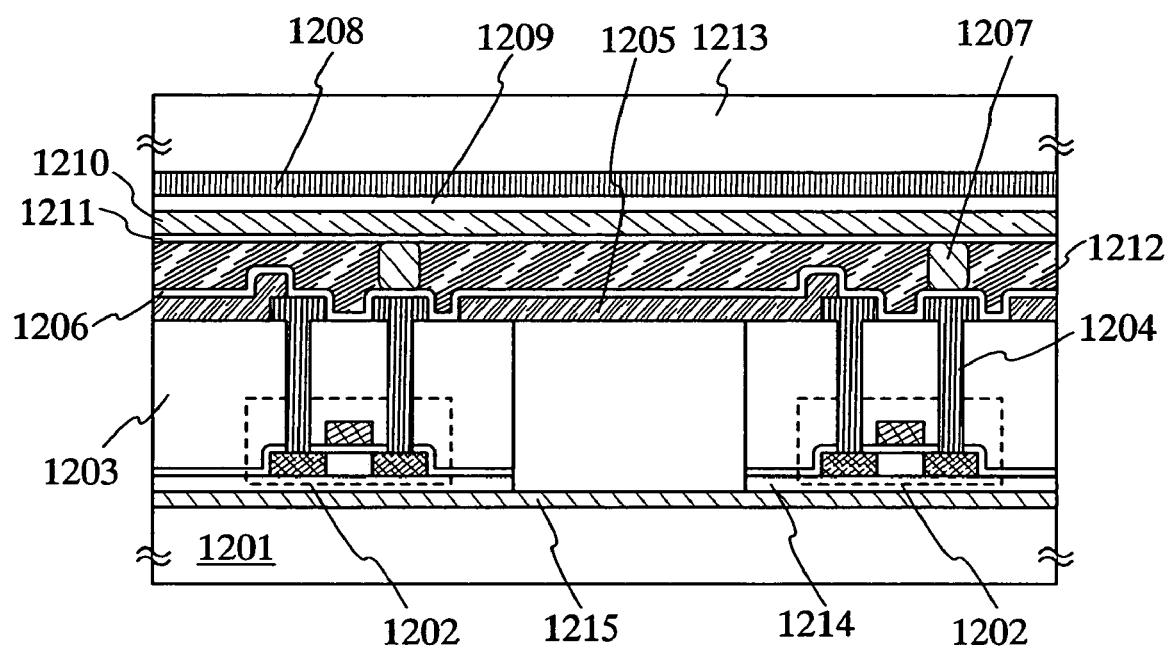
FIG. 12 shows a structure of a liquid crystal element formed in a pixel portion.

As shown in FIG. 12, an adhesive layer 1215 and an oxide layer 1214 are formed over a substrate 1201, and a TFT 1202 is formed thereon. The TFT 1202 is electrically connected to a first electrode 1205 to serve as a pixel electrode by a wiring 1204 formed in an opening portion of an interlayer insulating film 1203. An orientation film 1206 is formed on the first electrode 1205, and is exposed to a rubbing treatment. A columnar spacer 1207 made of organic resin for keeping a substrate space is provided. Note that, the order of forming the orientation film 1206 and the spacer 1207 may be reverse.

On the contrary, an opposite substrate 1213 includes a colored layer 1208, a planarization film 1209, an opposite electrode 1210 made of a transparent conductive film, and an orientation film 1211. A red colored layer, a blue colored layer, and a green colored layer are each formed as the colored layer 1208.

The substrate 1201 where elements are formed and the opposite substrate 1213 are bonded together by a sealing material (not shown). A filler is mixed into the sealing material, and the two substrates are bonded while keeping a uniform space (preferably, from 2.0 μm to 3.0 μm) by the filler and the spacer. A liquid crystal 1212 is injected between the two substrates, and perfectly sealed with a sealant. It is noted that a known liquid crystal material can be used for the liquid crystal 1212.

In the case of the structure shown in FIG. 12, light is incident from the opposite substrate 1213 side, modulated in the liquid crystal 1212, and emitted from the substrate 1201 side where elements are formed.

According to the present invention, the first electrode can be formed from a metal film (specifically, an aluminum (alloy) film or the like) having reflectiveness. In this case, light is incident from the opposite substrate 1213 side, modulated in the liquid crystal 1212, and then, emitted from the opposite substrate 1213 side again. In the case of the structure, a memory element, a resistance element, etc. can be formed, since the light does not pass through the first electrode.

Embodiment 8

In this embodiment, various electronics that are completed by incorporating a semiconductor element that is made according to the present invention, into a part thereof is described.

Such electronics include a video camera, a digital camera, a head mounted display (goggle type display), a car navigation system, a projector, a car stereo, a personal computer, a portable information terminal (a device provided with a semiconductor device that can playback record medium of a mobile computer, cellular phone, portable game machine or electronic book etc. and display the image), etc. Practical examples thereof are shown in FIGS. 13A to 13G FIG. 13A shows a display device including a frame 2001, a support 2002, a display screen unit 2003, a speaker portion 2004, a video input terminal 2005, and the like. The display screen unit 2003 includes a light-emitting element described in Embodiment 6 or a liquid crystal element described in Embodiment 7. The display devices include all information display apparatuses for a personal computer, a TV broadcasting, an advertisement, and the like.

Figure 13A:
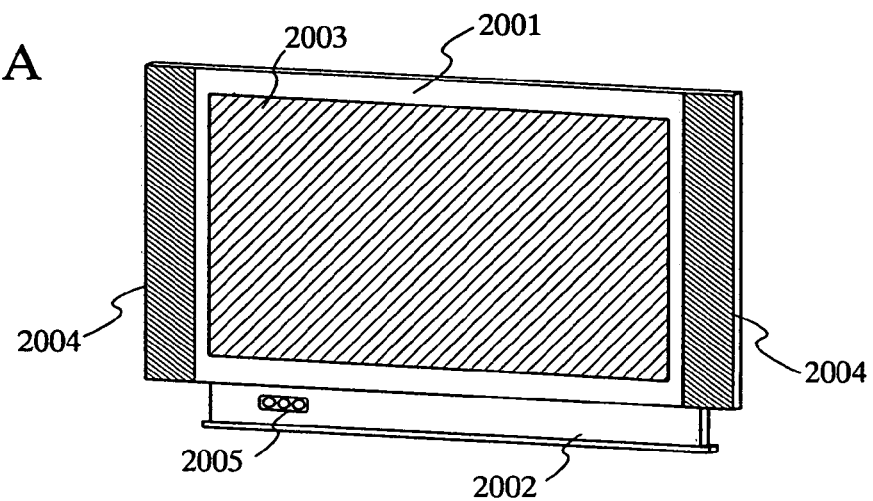
FIGS. 13A to 13G show electronics that are formed according to the present invention.
Figure 13B:
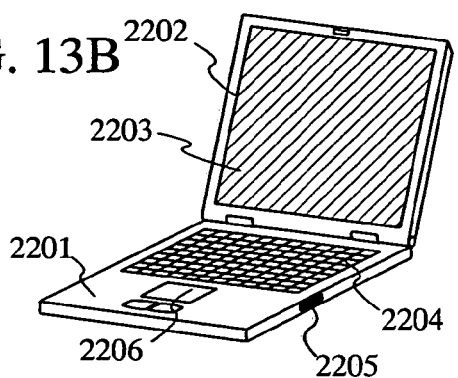

FIG. 13B shows a laptop computer including a main body 2201, a frame 2202, a display screen unit 2203, a keyboard 2204, an external connection port 2205, a pointing mouse 2206, and the like. The display screen unit 2203 includes a light-emitting element described in Embodiment 6 or a liquid crystal element described in Embodiment 7.

Figure 13C:
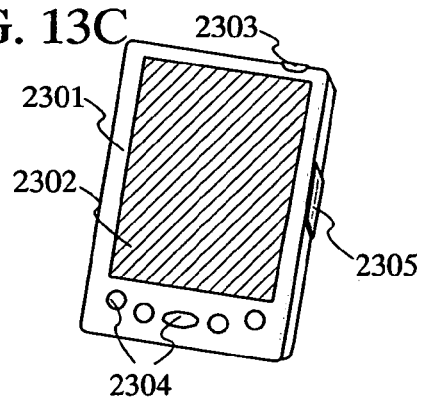

FIG. 13C shows a mobile computer including a main body 2301, a display screen unit 2302, a switch 2303, an operation key 2304, an infrared port 2305, and the like. The display screen unit 2302 includes a light-emitting element described in Embodiment 6 or a liquid crystal element described in Embodiment 7.

Figure 13D:
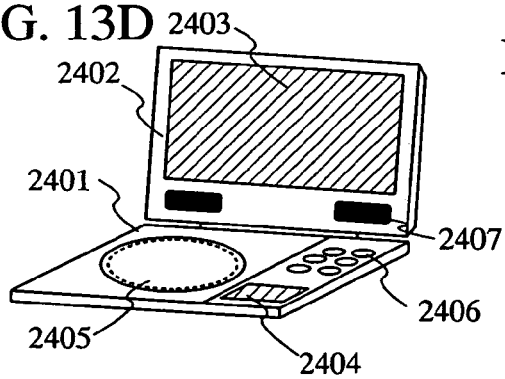

FIG. 13D shows a player using a record medium recorded with programs (hereinafter, record medium). The player includes a main body 2401, a frame 2402, a display screen unit A (2403), a display screen unit B (2404), a record medium reading portion 2405, an operation key 2406, a speaker portion 2407, and the like. The display screen unit A (2403) and the display screen unit B (2404) each include a light-emitting element described in Embodiment 6 or a liquid crystal element described in Embodiment 7. The player uses DVD (Digital Versatile Disc), CD or the like as a record medium, thereby making it possible to enjoy music, a movie, a game or Internet.

Figure 13E:
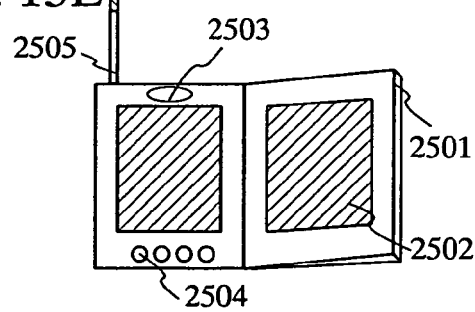

FIG. 13E shows a portable book (electronic book) including a main body 2501, a display screen unit 2502, a record medium 2503, an operation key 2504, an antenna 2505, and the like. The display screen unit 2502 includes a light-emitting element described in Embodiment 6 or a liquid crystal element described in Embodiment 7.

Figure 13F:
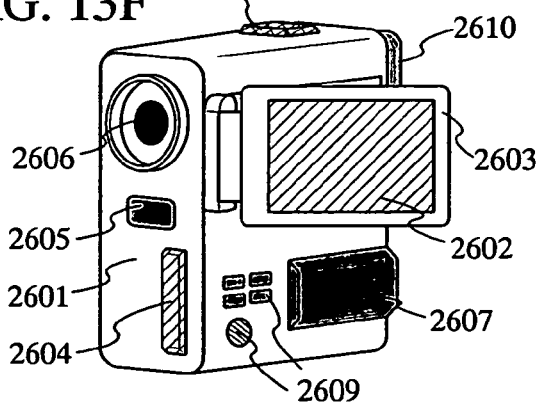

FIG. 13F shows a video camera including a main body 2601, a display screen unit 2602, a frame 2603, an external connection port 2604, a remote control receiving portion 2605, an image receiving portion 2606, a battery 2607, a voice input portion 2608, operation keys 2609, an eyepiece portion 2610, and the like. The display screen unit 2602 includes a light-emitting element described in Embodiment 6 or a liquid crystal element described in Embodiment 7.

Figure 13G:
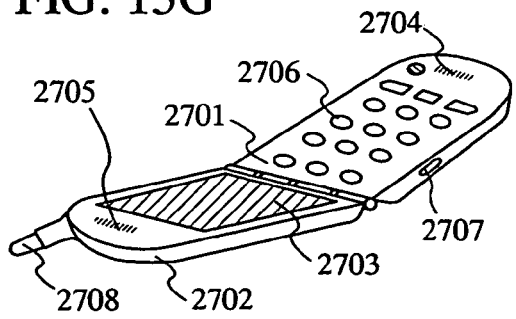

FIG. 13G shows a cellular phone including a main body 2701, a frame 2702, a display screen unit 2703, a sound input portion 2704, a sound output portion 2705, an operation key 2706, an external connection port 2707, an antenna 2708, and the like. The display screen unit 2703 includes a light-emitting element described in Embodiment 6 or a liquid crystal element described in Embodiment 7.

As described above, the range of application of a semiconductor device formed according to the present invention is extremely wide, and is applicable to electronics of all the fields.

Embodiment 9

In this embodiment, a method for manufacturing including a transfer step of the present invention is described with reference to FIGS. 15A to 15E, and FIGS. 16A to 16D.

In FIG. 15A, a metal layer 3202 is laminated over the first substrate 3201, and a plurality of adhesive agents 3203 are formed thereon.

A glass substrate or a quartz substrate can be used as the first substrate 3201 in this embodiment. Note that, a glass substrate containing barium borosilicate glass, alumino borosilicate glass, alumino silicate glass, or the like as a material is suitable. Representatively, a 1737 glass substrate (distortion point of 667° C.) manufactured by Corning Incorporated, AN 100 (distortion point of 670° C.) manufactured by Asahi Glass Co., Ltd., and the like are applicable. AN 100 is used in this embodiment.

A material of the metal layer 3202 can be an element selected from the group consisting of tungsten (W), molybdenum (Mo), technetium (Tc), rhenium (Re), ruthenium (Ru), osmium (Os), rhodium (Rh), iridium (Ir), palladium (Pd), platinum (Pt), silver (Ag), and gold (Au), or an alloy material including the element as a main constituent, and alternatively a single layer formed of a nitride (such as titanium nitride, tungsten nitride, tantalum nitride or molybdenum nitride) or a laminated layer of the nitrides. The metal layer 3202 containing W (tungsten) as a main constituent is used in this embodiment. The metal layer 3202 may be from 10 nm to 200 nm thick, preferably from 50 nm to 75 nm.

The metal layer 3202 can be formed by sputtering, CVD, or vapor deposition, but the metal layer 3202 is deposited by sputtering in this embodiment. In addition, the film thickness in the vicinity of circumference of the first substrate 3201 becomes easily uneven to fix the first substrate 3201 when the metal layer 3202 is formed by sputtering. Therefore, it is preferable to remove only the circumference by dry etching.

After the adhesive agent 3203 on the metal layer 3202 is formed by forming an amorphous silicon film and patterning this.

Next, an oxide layer 3204 is formed (FIG. 15B). A film made of silicon oxide is formed to be from 150 nm to 200 nm thick by sputtering using a silicon oxide target in this embodiment. The film thickness of the oxide layer 3204 is preferably twice as much as the film thickness of the metal layer 3202 or more.

An element-formed layer 3301 is formed over the oxide layer 3204 (FIG. 15C). A plurality of TFTs that constitute an integrated circuit (p-channel type TFTs and/or n-channel type TFTs) are formed in the element-formed layer 3301, and wirings 3211 to connect these TFTs, and insulating films 3210 and 3212 are also included in the element-formed layer 3301. In addition, a method for manufacturing of the element-formed layer like this is not particularly limited in the present invention. The present invention can be implemented by combination with a publicly known manufacturing method, besides a manufacturing method shown in Embodiment 13. In addition, the TFT includes an impurity region 3205 and a channel forming region 3206 that are formed in a portion of a semiconductor film over the oxide layer 3204, an insulating film 3207 and a gate electrode 3208.

In this embodiment, when the element-formed layer 3301 is formed, a heat treatment to scatter hydrogen included inside the material film including hydrogen is performed after forming a material film (a semiconductor film or a metal film) including at least hydrogen. This heat treatment may be performed at the temperature of 420° C. or more, and it may be performed separately from the formation step of the element-formed layer 3301, or serve as the formation step to omit the step. After forming an amorphous silicon film including hydrogen by CVD as the material film including hydrogen, for example, it is possible to simultaneously perform diffusion of hydrogen and formation of a polycrystalline film by heating, with a heat treatment of 500° C. or more for the sake of crystallization of the amorphous silicon film.

In addition, a layer including a metal oxide having a crystal structure (not shown) is formed between the metal layer 3202 and the oxide layer 3204 by this heat treatment. In addition, when the adhesive agent 3203 is formed on the metal layer 3202 and the oxide layer 3204 is laminated thereover, a metal-oxide layer (tungsten oxide film) in an amorphous condition that is formed to be approximately from 2 nm to 5 nm thick between the metal layer 3202 and the oxide layer 3204, also has the crystal structure by this heat treatment and forms the layer made of an metal oxide (not shown).

In addition, this layer made of a metal oxide (not shown) is formed in the interface between the metal layer 3202 and the oxide layer 3204, and therefore, the element-formed layer is easily separated from the substrate in a later step. In addition, in the heat treatment conducted while forming the element-formed layer 3301, the case of forming the layer made of a metal oxide is described in this embodiment. However, the present invention is not limited to this method, and there is employed a method of forming the metal-oxide layer and then the oxide layer 3204, after forming the metal layer 3202 and the adhesive agent 3203.

On the other hand, the adhesiveness of the adhesive agent 3203 and the metal layer 3202 can be enhanced by the heat treatment conducted while forming the element-formed layer 3301. In other words, in this embodiment, the adhesive agent 3203 formed from the amorphous silicon film reacts with tungsten (W) inside the metal layer 3202 that has been formed, to form a silicide (tungsten silicide: $WSi_2$) by a heat treatment. Therefore, the adhesiveness of the adhesive agent 3203 and the metal layer 3202 can be enhanced. In addition, the present invention is not limited to the method of reacting a metal inside the metal layer with the adhesive agent by the heat treatment conducted while forming the element-formed layer 3301. A heat treatment for reacting a metal inside the metal layer with the adhesive agent after forming the metal layer and the adhesive agent, may be performed separately from the formation of the element-formed layer 3301.

When the element-formed layer 3301 is completed, the adhesive agent 3203 is removed. Specifically, portions of insulating films 3210, and 3212, and the adhesive agent 3203 are etched by dry etching to form an opening portion 3213 (FIG. 15D).

For example, when the insulating films 3207, 3209, 3210, and 3212 and the oxide layer 3204 are etched and these are formed from silicon oxide, dry etching is conducted by using an etching gas including mainly carbon fluoride ($CF_4$). Further, when the adhesive agent 3203 is etched, the adhesive agent 3203 is formed from silicon and a portion including mainly silicon is left in a portion thereof, regardless of the reaction with the metal layer (e.g., W), etching can be conducted by using an etching gas including mainly hydrogen bromide (HBr) and chlorine ($Cl_2$). In addition, when the adhesive agent 3203 is formed from silicon and a portion thereof forms a silicide (WSi) due to the reaction with the metal layer (W), the silicide can be etched by using an etching gas including mainly sulfur fluoride ($SF_6$) and hydrogen bromide (HBr).

Subsequently, an organic resin layer 3214 is formed over the element-formed layer 3301. The organic resin layer 3214 is formed by applying an organic material that is soluble in water or alcohols used as a material of the organic resin layer 3214, over a whole surface thereof and curing it. The composition of the organic material may be, for example, epoxy series, acrylate series, silicon series, or the like. Specifically, water-soluble resin (TOAGOSEI Co., Ltd.: VL-WSHL10) is spin-coated to have a thickness of 30 μm, and exposed to light for 2 minutes to be temporarily cured, then, exposed to UV rays with its back for 2.5 minutes, and then, for 10 minutes with its surface to be fully cured. The exposure to light is performed for 12.5 minutes in total. Consequently, the organic resin layer 3214 is formed (FIG. 15E).

The adhesiveness in the interface (a layer containing a metal-oxide) between the metal layer 3202 and the oxide layer 3204 is partly weakened in order to easily perform a later separation step. The partly weakening of adhesiveness is carried out by emitting laser light partially on the metal layer 3202 or the oxide layer 3204 along the periphery of the region to be separated, or pressuring locally from outside on the region to be separated along the periphery thereof for damaging a part of the inside or the interface of the oxide layer 3204. Specifically, a hard needle such as a diamond pen may be depressed perpendicularly and moved with applying loading. Preferably, a scriber device can be used to move the pen with applying loading with press force ranging from 0.1 mm to 2 mm. As described above, a portion having selectively (partially) weakened adhesiveness that can spark the start of separation is formed before the separation is preformed, thereby preventing poor separation and improving the process yield.

By forming a first adhesive layer 3215, a second substrate 3216 that is an auxiliary substrate can be bonded to the organic resin layer 3214 with the first adhesive layer 3215 therebetween (FIG. 15E). As a material for forming the first adhesive layer 3215, a known material whose adhesiveness can be weakened by carrying out a predetermined treatment in a later step can be used, however, the case of using a photosensitive two-sided tape whose adhesiveness can be weakened by light irradiation in a later step is described in this embodiment.

Figure 16A:
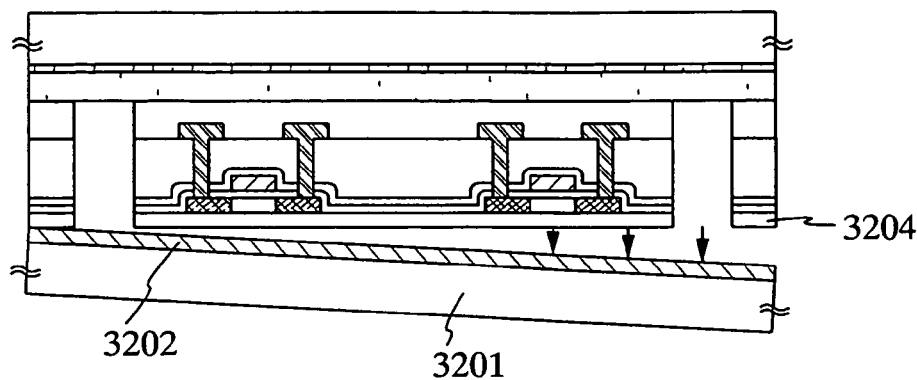
FIGS. 16A to 16D show a method for manufacturing a semiconductor device, including a transfer step.

The first substrate 3201 is separated from the element-formed layer 3301 bonded with the auxiliary substrate by a physical means. In this embodiment, the first substrate 3201 can be separated with comparatively small force (for example, man's hand, air pressure of gas sprayed from a nozzle, ultrasonic waves, or the like) in the interface (the layer containing a metal-oxide) portion of the metal layer 3202 and the oxide layer 3204. Specifically, the first substrate 3201 can be separated by splitting the tungsten oxide film, the interface between the tungsten oxide film and the silicon oxide film, or the interface between the tungsten oxide film and the tungsten film. Thus, the element-formed layer 3301 formed over the oxide layer 3204 can be separated from the first substrate 3201. FIG. 16A shows a state of the separation.

A portion of the layer containing metal oxide is left on the surface that is exposed by the separation. This is a cause of weakening the adhesiveness when the exposed surface is bonded to a substrate or the like in a later step. Thus, the portion of the layer containing metal oxide left on the exposed surface is preferably removed. For removing the portion, aqueous alkali such as aqueous ammonia or aqueous acids can be used. In addition, the following steps may be carried out at the temperature (at most 430° C.) which makes it easier for the portion of the layer containing the metal oxide to be separated.

Figure 16B:
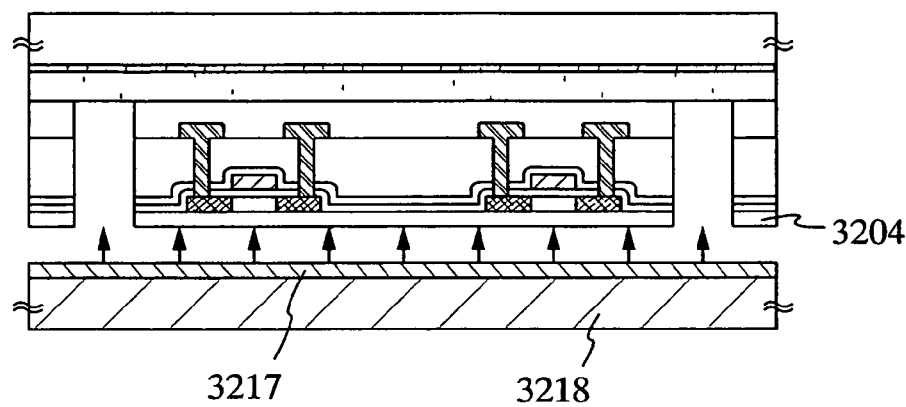

Next, a second adhesive layer 3217 is formed, and a third substrate 3218 is bonded to the oxide layer 3204 (and the element-formed layer 3301) with the second adhesive layer 3217 therebetween (FIG. 16B). Note that, it is important that the adhesiveness of the third substrate 3218 and the oxide layer 3204 (and the element-formed layer 3301) bonded by the second adhesive layer 3217 is superior to that of the second substrate 3216 and the organic resin layer 3214 by the first adhesive layer 3215.

A flexible substrate (plastic substrate) is preferably used for the third substrate 3218. ARTON (manufactured by JSR corporation) comprising a norbornene resin including a polar group is used for the third substrate 3218 in this embodiment.

As a material of the second adhesive layer 3217, various curing adhesive materials, for example, a photo-curing adhesive material such as a reaction-curing adhesive material, a thermosetting adhesive material, or a UV cure adhesive material, or an anaerobic adhesive material can be adapted. Preferably, the adhesive material is given high thermal conductivity by being mixed with powder including silver, nickel, aluminum, or aluminum nitride, or filler.

Figure 16C:
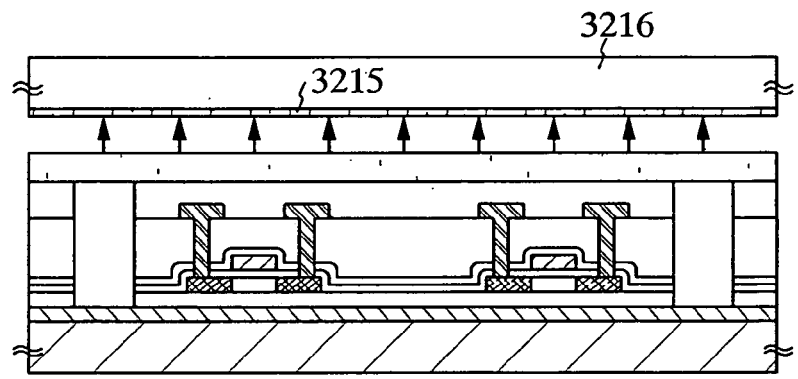
Figure 16D:
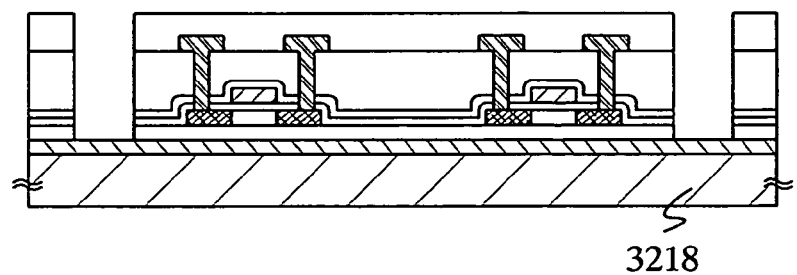

The bonding strength of the two-sided tape used for the first adhesive layer 3215 is lowered by emitting UV rays from the second substrate 3216 side, thereby separating the second substrate 3216 from the element-formed layer 3301 (FIG. 16C). Further, in this embodiment, the exposed surface is washed by water, thereby dissolving and removing the first adhesive layer 3215 and the organic resin layer 3214. Thus, the structure shown in FIG. 16D can be obtained.

As described above, the integrated circuit comprising the plurality of TFTs formed over the first substrate 3201 can be formed over another substrate (the third substrate 3218).

Embodiment 10

In this embodiment, a manufacturing method including a transfer step of the present invention that is partly different from that of Embodiment 9 is described with reference to FIGS. 17A to 17E, 18A and 18B.

Figure 17A:
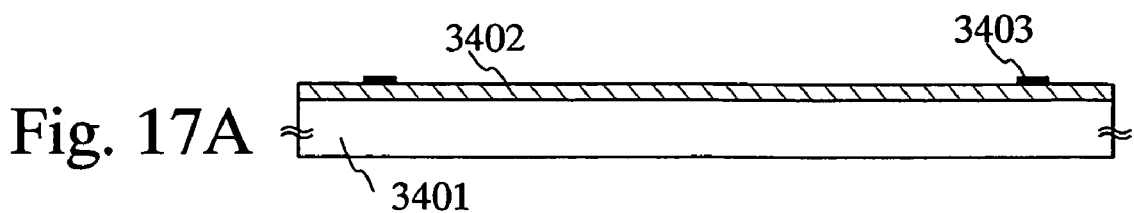
FIGS. 17A to 17E show a method for manufacturing a semiconductor device, including a transfer step.

In FIG. 17A, a metal layer 3402 is formed over a first substrate 3401, and a plurality of adhesive agents 3403 are formed thereon.

A glass substrate (AN 100) is used for the first substrate 3401 in this embodiment, as in Embodiment 9. Further, as for a metal layer, a metal layer 3402 containing tungsten (W) as a main constituent is also used, as in Embodiment 9. Note that, the metal layer 3402 is deposited by sputtering to have a film thickness of from 10 nm to 200 nm, preferably, from 50 nm to 75 nm.

An adhesive agent 3403 to be formed on the metal layer 3402 is formed by forming an amorphous silicon film and then, patterning this.

Figure 17B:
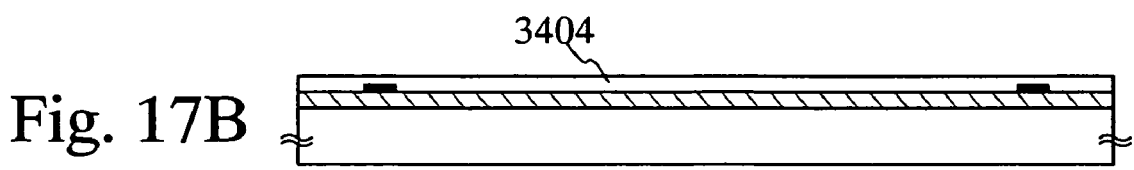

Then, an oxide layer 3404 is formed (FIG. 17B). A film made of silicon oxide is deposited to be from 150 nm to 200 nm thick by sputtering using a silicon oxide target in this embodiment. The film thickness of the oxide layer 3404 is preferably twice as much as the film thickness of the metal layer 3402 or more.

Figure 17C:
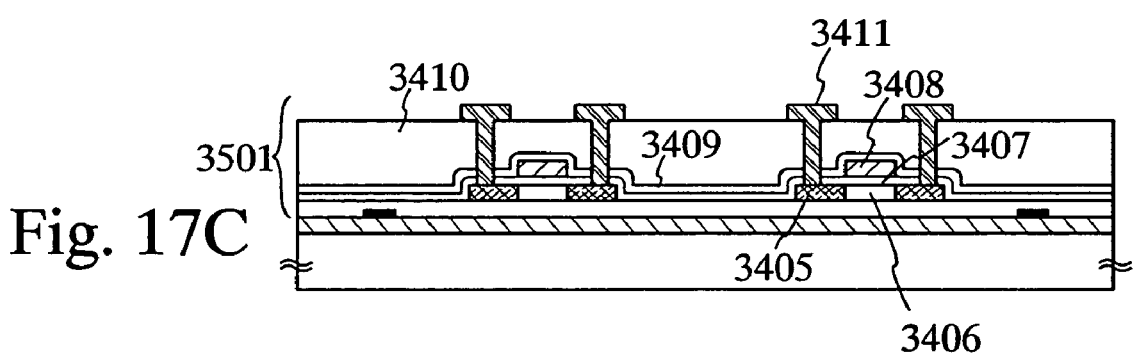

An element-formed layer 3501 is formed over the oxide layer 3404 (FIG. 17C). A plurality of TFTs that constitute an integrated circuit (p-channel type TFT and/or n-channel type TFT) are formed in the element-formed layer 3501, and wirings 3411 to connect these TFTs, an insulating film 3410, and the like are included in the element-formed layer 3501. In addition, a method for manufacturing of the element-formed layer like this is not particularly limited in the present invention. The present invention can be implemented by combination with a publicly known manufacturing method, besides a manufacturing method shown in Embodiment 13. In addition, the TFT includes an impurity region 3405 and a channel forming region 3406 that are formed in a portion of a semiconductor film over the oxide layer 3404, an insulating film 3407 and a gate electrode 3408.

In the case where the element-formed layer 3501 is formed in this embodiment, as in Embodiment 9, a heat treatment to scatter hydrogen included inside a material film including hydrogen is performed after forming the material film (a semiconductor film or a metal film) including at least hydrogen. In addition, a layer containing a metal oxide having a crystal structure (not shown) is formed between the metal layer 3402 and the oxide layer 3404 by this heat treatment.

In addition, this layer containing the metal oxide (not shown) is formed in the interface between the metal layer 3402 and the oxide layer 3404, and therefore, the element-formed layer is easily separated from the substrate in a later step.

On the other hand, the adhesiveness of the adhesive agent 3403 and the metal layer 3402 can be enhanced by the heat treatment conducted while forming the element-formed layer 3501.

Figure 17D:
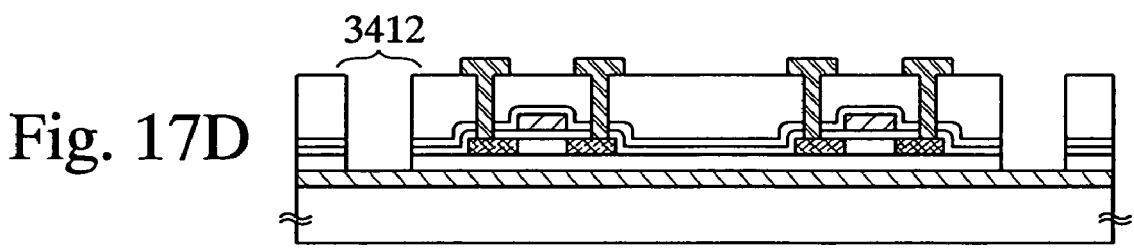

In this embodiment, after the wirings 3411 included in the element-formed layer 3501 are formed, the adhesive agent 3403 is removed. Specifically, a portion of the insulating film 3410 and the adhesive agent 3403 are etched by dry etching to form an opening portion 3412 (FIG. 17D).

For example, when the insulating films 3407, 3409, and 3410, and the oxide layer 3404 are etched and these are formed from silicon oxide, dry etching is conducted by an etching gas including mainly carbon fluoride ($CF_4$). Further, when the adhesive agent 3403 is etched, the adhesive agent 3403 is formed from silicon and a portion including mainly silicon is left in a portion thereof, regardless of the reaction with the metal layer (e.g., W), etching can be conducted by an etching gas including mainly hydrogen bromide (HBr) and chlorine ($Cl_2$). In addition, when the adhesive agent 3403 is formed from silicon and a portion thereof forms a silicide (WSi) due to the reaction with the metal layer (W), the silicide can be etched by using an etching gas including mainly sulfur fluoride ($SF_6$) and hydrogen bromide (HBr).

Figure 17E:
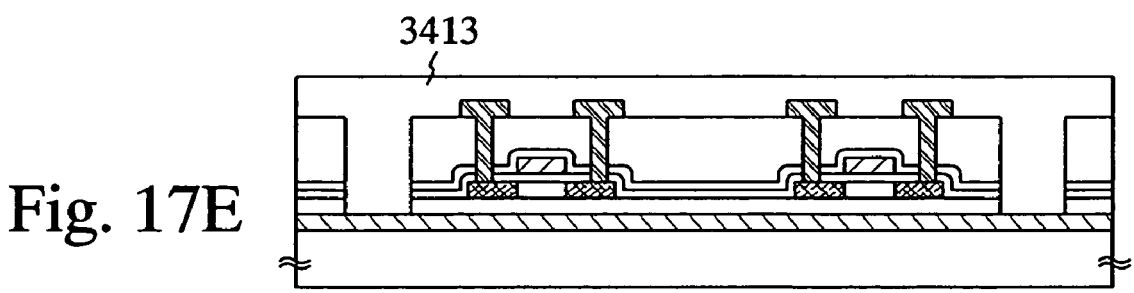

Then, the opening portion 3412 is filled, and an insulating film 3413 is formed to achieve smoothness of a surface of the element-formed layer 3501 (FIG. 17E). Note that, a silicon nitride oxide film of from 1 μm to 3 μm thick formed by plasma CVD is used in this embodiment. The insulating film is not naturally limited to the silicon nitride oxide film, but may be an insulating material such as silicon nitride or silicon oxide, a single layer comprising an organic insulating material such as acrylic, polyimide, or polyamide, or a laminate of the materials.

It is noted that description about the steps after achieving the smoothness of the element-formed layer 3501 by using the insulating film 3413 is omitted here, since the steps can be performed by using the same material and by the same method as those of Embodiment 9. The steps are as follows: (1) a step of forming an organic resin layer over the element-formed layer 3501, and bonding a second substrate that is an auxiliary substrate thereto with a first adhesive layer therebetween; (2) a step of separating the first substrate 3401 from the element-formed layer 3501 bonded with the auxiliary substrate (the second substrate) by a physical means; (3) a step of forming a second adhesive layer and bonding a third substrate to an oxide layer (and the element-formed layer) with the second adhesive layer therebetween; and (4) a step of separating the second substrate from the element-formed layer.

As described above, a structure, shown in FIG. 18A, in which the element-formed layer 3501 is transferred to the third substrate 3418 with the second adhesive layer 3417 therebetween, can be obtained.

Figure 18A:
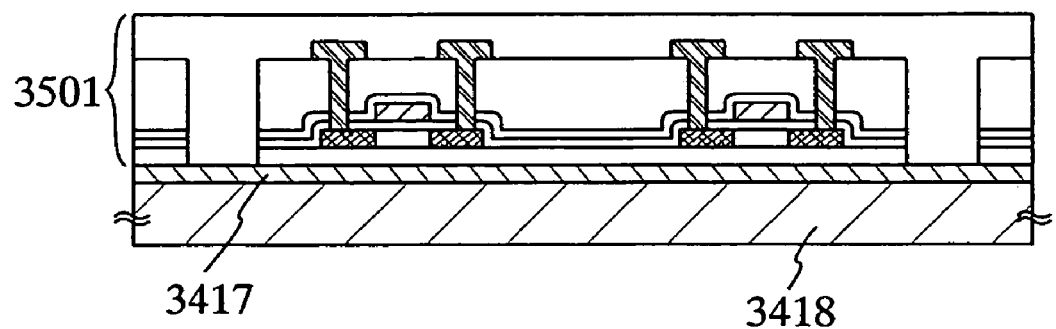
FIGS. 18A and 18B show a method for manufacturing a semiconductor device, including a transfer step.
Figure 18B:
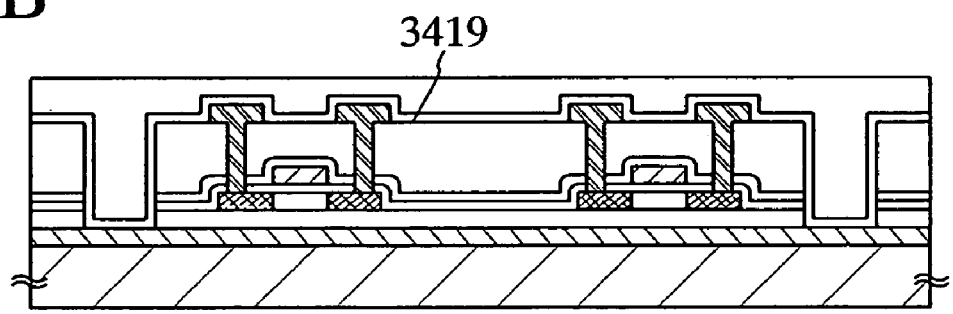

Further, in this embodiment, the opening portion 3412 is formed in FIG. 17D, and then, an insulating film 3419 may be formed to form a structure shown in FIG. 18B.

As described above, the integrated circuit comprising plural TFTs formed over the first substrate 3401 can be formed over another substrate (the third substrate 3418).

Embodiment 11

In this embodiment, a manufacturing method including a transfer step of the present invention that is partly different from that of Embodiment 9 or 10 is described with reference to FIGS. 19A to 19E, 20A and 20B.

Figure 19A:
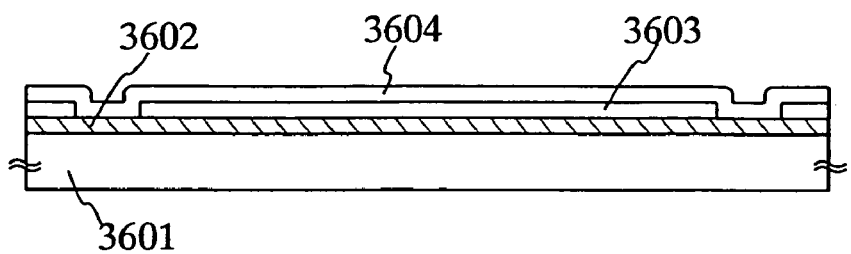
FIGS. 19A to 19E show a method for manufacturing a semiconductor device, including a transfer step.
Figure 19B:
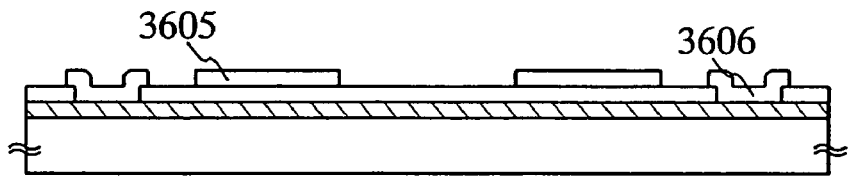

In FIG. 19A, a metal layer 3602 is formed over a first substrate 3601, and an oxide layer 3603 is formed thereover.

A glass substrate (AN 100) is used for the first substrate 3601 in this embodiment, as in Embodiment 9. Further, as for the metal layer, the metal layer 3602 containing tungsten (W) as a main constituent is also used, as in Embodiment 9. Note that, the metal layer 3602 is deposited by sputtering to have a film thickness of from 10 nm to 200 nm, preferably, from 50 nm to 75 nm.

The oxide layer 3603 to be formed over the metal layer 3602 is a film made of silicon oxide deposited to be from 150 nm to 200 nm thick by sputtering using a silicon oxide target. The film thickness of the oxide layer 3603 is preferably twice as much as the film thickness of the metal layer 3602 or more. In this embodiment, the oxide layer 3603 is separated into a plurality of island-like portions by pattering.

Next, a semiconductor film 3604 is formed to cover the oxide layer 3603. In this embodiment, an amorphous silicon film is deposited by plasma CVD as the semiconductor film (FIG. 19A). The semiconductor film 3604 is exposed to patterning, thereby obtaining a semiconductor a (3605) formed over the oxide layer 3603, and a semiconductor b (3606) formed between two oxide layers that have been formed in isolation. It is noted that the semiconductor a (3605) corresponds to an impurity region and a channel forming region of a TFT to be formed later, whereas the semiconductor b (3606) corresponds to an adhesive agent of the present invention.

In other words, the present invention has a characteristic in that the semiconductor a (3605) forming a portion of the TFT and the semiconductor b (3606) forming the adhesive agent are formed simultaneously.

Figure 19C:
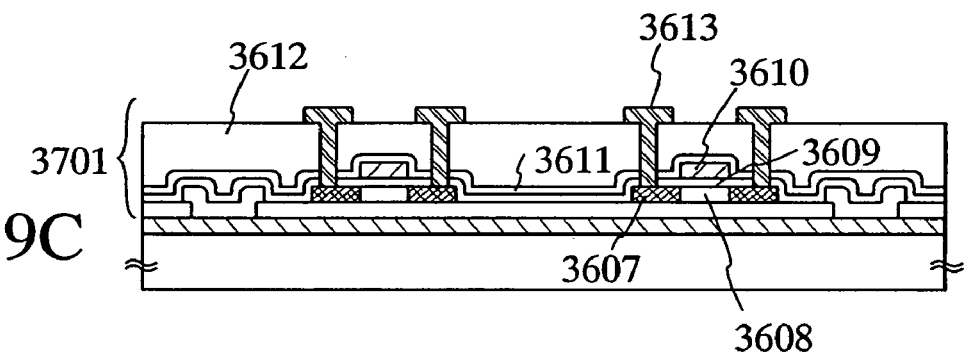

An element-formed layer 3701 including the semiconductor a (3605) as a portion thereof is formed (FIG. 19C). A plurality of TFTs that constitute an integrated circuit (p-channel type TFTs or n-channel type TFTs) are formed in the element-formed layer 3701, and wirings 3613 to connect these TFTs, an insulating film 3612, and the like are included in the element-formed layer 3701. In addition, a method for manufacturing the element-formed layer like this is not particularly limited in the present invention. The present invention can be implemented by combination with a publicly known manufacturing method, besides a manufacturing method shown in Embodiment 13. In addition, the TFT includes an impurity region 3607 and a channel forming region 3608 that are formed in a portion of the semiconductor a (3605) over the oxide layer 3603, a gate insulating film 3609, and a gate electrode 3610.

In this embodiment, when the element-formed layer 3701 is formed, as in Embodiment 9, a heat treatment to scatter hydrogen included inside the material film including hydrogen is performed after forming a material film (a semiconductor film or a metal film) including at least hydrogen. In addition, a layer containing a metal oxide having a crystal structure (not shown) is formed between the metal layer 3602 and the oxide layer 3603 by this heat treatment.

In addition, this layer containing the metal oxide (not shown) is formed in the interface between the metal layer 3602 and the oxide layer 3603, and therefore, the element-formed layer 3701 is easily separated from the first substrate 3601 in a later step.

On the other hand, the adhesiveness of the semiconductor b (3606) that is an adhesive agent and the metal layer 3602 can be enhanced by the heat treatment conducted while forming the element-formed layer 3701.

After the wirings 3613 included in the element-formed layer 3701 is formed, the semiconductor b (3606) is removed (FIG. 19D) in this embodiment. Specifically, a portion of the insulating film 3612 and the semiconductor b (3606) are etched by dry etching to form an opening portion 3614.

For example, when the insulating films 3609, 3611, and 3612 and the oxide layer 3603 are etched and these are formed from silicon oxide, dry etching is conducted by an etching gas including mainly carbon fluoride ($CF_4$). Further, when the semiconductor b (3606) that is an adhesive agent is etched, the semiconductor b (3606) is formed from silicon and a portion including mainly silicon is left in a portion thereof, regardless of the reaction with the metal layer (e.g., W), etching can be conducted by an etching gas including mainly hydrogen bromide (HBr) and chlorine ($Cl_2$). In addition, when the semiconductor b (3606) is formed from silicon and a part thereof forms a silicide (WSi) due to the reaction with the metal layer (W), the silicide can be etched by using an etching gas including mainly sulfur fluoride ($SF_6$) and hydrogen bromide (HBr).

Figure 19D:
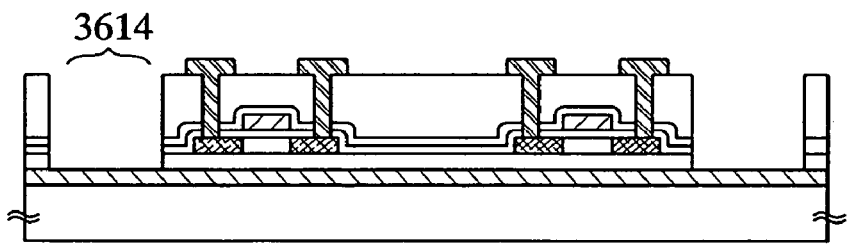
Figure 19E:
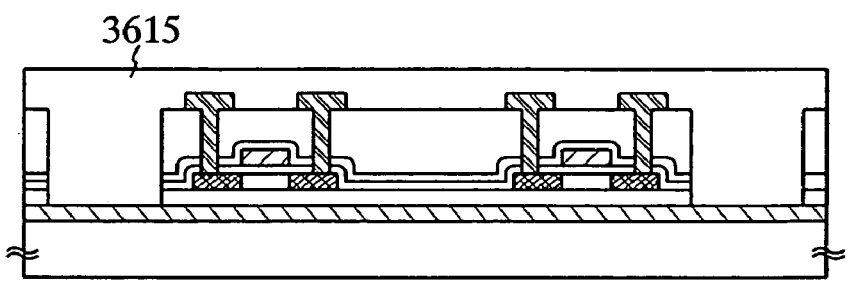

Then, the opening portion 3614 is filled, and an insulating film 3615 is formed to achieve smoothness of a surface of the element-formed layer 3701 (FIG. 19E). Note that, a silicon nitride oxide film of from 1 μm to 3 μm thick formed by plasma CVD is used in this embodiment. The insulating film is not naturally limited to a silicon nitride oxide film, but may be an insulating material such as silicon nitride, or silicon oxide, a single layer comprising an organic insulating material such as acrylic, polyimide, or polyamide, or a laminate of the materials.

It is noted that description about the steps after achieving the smoothness of the element-formed layer 3701 by using the insulating film 3615 is omitted here, since the steps can be performed by using the same material and the same method as those of Embodiment 9. The steps are as follows:

(1) a step of forming an organic resin layer over the element-formed layer 3701, and bonding a second substrate that is an auxiliary substrate thereto with a first adhesive layer therebetween; (2) a step of separating the first substrate 3601 from the element-formed layer 3701 bonded with the auxiliary substrate (the second substrate) by a physical means; (3) a step of forming a second adhesive layer and bonding a third substrate to the oxide layer (and the element-formed layer) with the second adhesive layer therebetween; and (4) a step of separating the second substrate from the element-formed layer.

As described above, a structure, shown in FIG. 20A, in which the element-formed layer 3701 is transferred to the third substrate 3618 with the second adhesive layer 3617 therebetween, can be obtained.

Figure 20A:
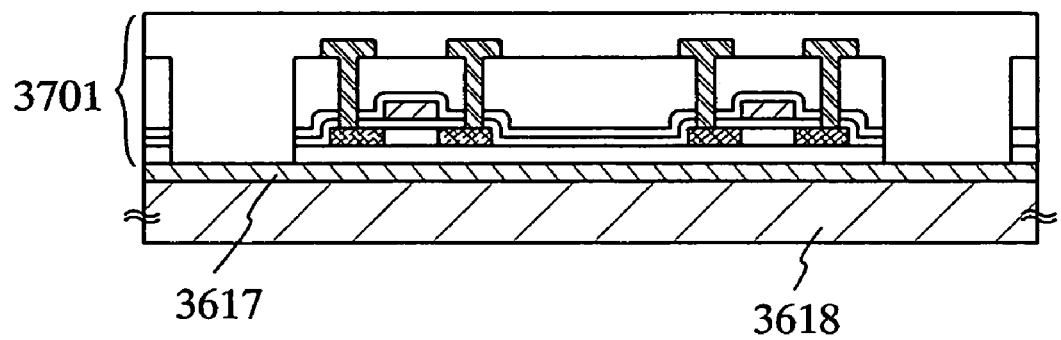
FIGS. 20A and 20B show a method for manufacturing a semiconductor device, including a transfer step.
Figure 20B:
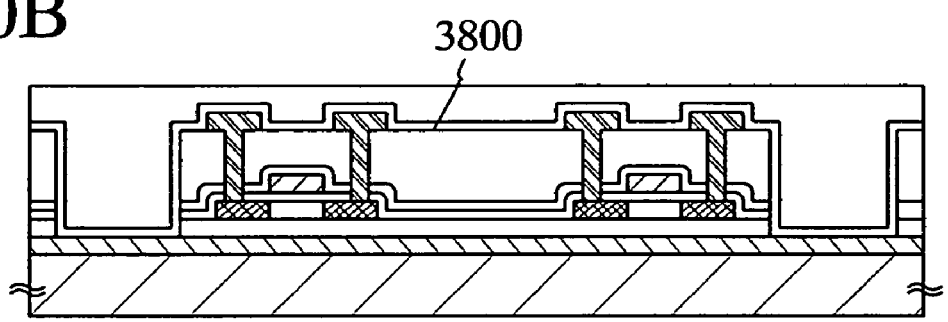

Further, in this embodiment, the opening portion 3614 is formed in FIG. 19D, and then, an insulating film 3800 may be formed to form a structure shown in FIG. 20B.

As described above, the integrated circuit comprising plural TFTs formed over the first substrate 3601 can be formed over another substrate (the third substrate 3618).

Embodiment 12

An arrangement and a shape of an adhesive agent in the present invention are described with reference to FIGS. 21A to 21D in this embodiment.

Figure 21A:
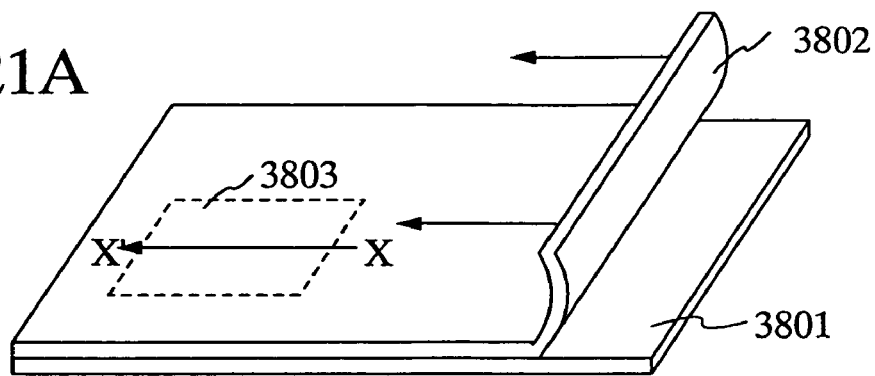
FIGS. 21A to 21D show a shape of an adhesive agent.

A transfer step is performed by separating an element-formed layer 3802 formed over a substrate 3801 and bonding to another substrate, as shown in FIG. 21A. In the case of FIG. 21A, the element-formed layer 3802 is separated in the direction of the arrow in FIG. 21A.

An adhesive agent is formed in a region 3803 that is a portion of the element-formed layer 3802 while forming the element-formed layer 3802, and removed just before separation. An example of the arrangement and the shape of the adhesive agent formed in the element-formed layer 3802 is shown in FIGS. 8B to 8D.

Figure 21B:
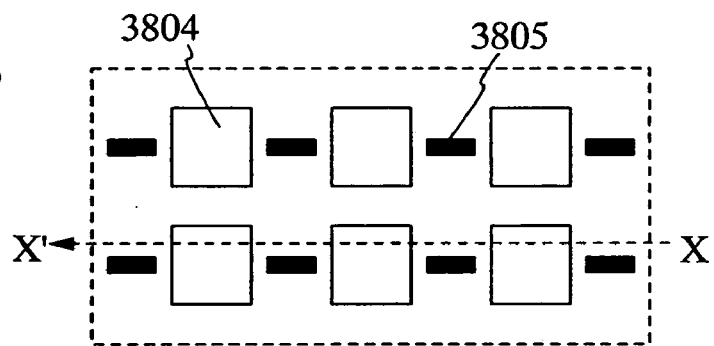

FIG. 21B shows the case where a square-shape adhesive agent 3805 is formed among a plurality of integrated circuits 3804 that are arranged in the separation direction XX' in the region 3803 where the integrated circuits 3804 are formed. In this case, preferably, the square-shape adhesive agent 3805 is rectangular, and is arranged so that the longer side of the rectangular adhesive agent is parallel to the separation direction XX'. Thus, the adhesive agent 3805 has a square-shape, thereby easily separating the element-formed layer 3802 from the substrate 3801 after removing the adhesive agent 3805.

Figure 21C:
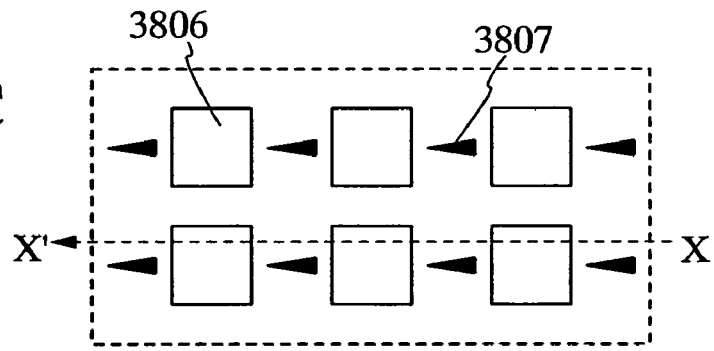

FIG. 21C shows the case where a triangle-shape adhesive agent 3807 is formed among a plurality of integrated circuits 3806 that are arranged in the separation direction XX' in the region 3803 where the integrated circuits 3806 are formed. In this case, preferably, the triangle-shape adhesive agent 3807 is arranged so that the base of the triangle-shape adhesive agent 3807 is perpendicular to the separation direction XX'. Thus, the adhesive agent 3807 has a triangle-shape, thereby easily separating the element-formed layer 3802 from the substrate 3801 after removing the adhesive agent 3807.

Figure 21D:
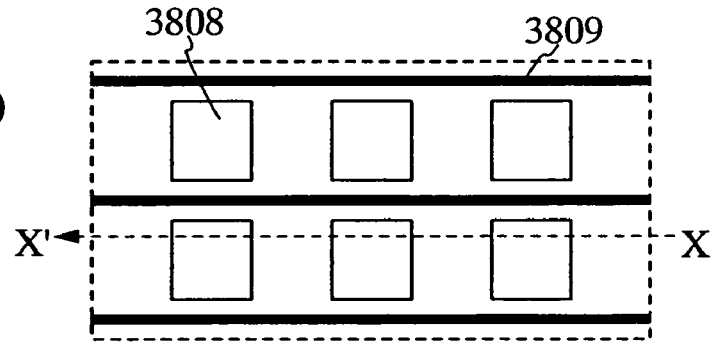

FIG. 21D shows the case where a line-shape adhesive agent 3809 is formed among rows of a plurality of integrated circuits 3808 that are arranged in the separation direction XX' in the region 3803 where the plurality of integrated circuits 3808 are formed. In this case, the line-shape adhesive agent 3809 may be formed with the same length as the entire length of the plurality of integrated circuits 3808 arranged in the separation direction XX', or as that of each one integrated circuit 3808. Thus, the adhesive agent 3809 has a line-shape, thereby easily separating the element-formed layer 3802 from the substrate 3801 after removing the adhesive agent 3809.

The arrangement and the shape of the adhesive agent shown in this embodiment are each one preferable example of the present invention, and do not limit the shape of the adhesive agent according to the present invention.

Embodiment 13

A method for simultaneously manufacturing an n-channel TFT and a p-channel TFT over one substrate is described in this embodiment with reference to FIGS. 22A to 22D and 23A to 23D.

A metal layer 3902 is formed over a substrate 3901, and then, an adhesive agent 3903 is formed thereon.

In this embodiment, a glass substrate (#1737) is used for the substrate 3901. A metal material including mainly tungsten (W) is used for the metal layer 3902, as in Embodiment 9. The adhesive agent 3903 is formed by patterning, so as to be arranged among integrated circuits (including plural TFTs) to be formed later.

Subsequently, an oxide layer 3904 that also serves as a base insulating film is formed over the metal layer 3902 and the adhesive agent 3903. In this embodiment, the oxide layer 3904 is formed by depositing a silicon oxynitride film using $SiH_4$ and $N_2O$ as material gases (composition ratio: Si=32%, O=59%, N=7%, H=2%) to have a thickness of 100 nm at deposition temperature of 300° C. by plasma CVD.

Further, a semiconductor layer having an amorphous structure (in this case, an amorphous silicon layer) is formed to have a thickness of 54 nm with $SiH_4$ gas as a deposition gas at a deposition temperature of 300° C. by plasma CVD successively without exposure to an atmosphere. This amorphous silicon layer contains hydrogen; the hydrogen will be diffused by a subsequent heat treatment, and the amorphous silicon film can be separated inside the oxide layer or the interface with the oxide layer by a physical means.

Then, a nickel acetate salt solution containing nickel of 10 ppm by weight is applied by a spinner. Nickel elements can be sputtered on the entire surface instead of being applied. Then, a heat treatment is carried out for crystallization to form a semiconductor film having a crystal structure (here, a polycrystalline layer). Here, after the heat treatment (at 500° C. for 1 hour) for dehydrogenation is carried out, and the heat treatment (at 550° C. for 4 hours) for crystallization is carried out, thereby forming a silicon film having a crystal structure. Also, the heat treatment (at 500° C. for 1 hour) for dehydrogenation has also a function of a heat treatment for diffusing the hydrogen contained in the amorphous silicon layer into an interface between the metal layer 3902 and the oxide layer 3904. Also note that, although a crystallization technique using nickel as a metal element for promoting crystallization of silicon is used here, other known crystallization techniques, for example, solid-phase growth and laser crystallization may be used.

Next, after the oxide film on the surface of the silicon film having a crystal structure is removed by dilute hydrofluoric acid or the like, laser light irradiation (XeCl: wavelength of 308 nm) for raising a crystallization rate and repairing defects remaining in crystal grains is performed in an atmosphere or in an oxygen atmosphere. Excimer laser light with a wavelength of 400 nm or less, or second harmonic wave or third harmonic wave of a YAG laser is used for the laser light. In any case, pulsed laser light with a repetition frequency of approximately from 10 Hz to 1000 Hz is used, the pulsed laser light is condensed to from 100 mJ/cm$^2$ to 500 mJ/cm$^2$ by an optical system, and emitted with an overlap ratio of from 90% to 95%, and thus, the silicon film surface may be scanned. Here, the laser light irradiation is performed in an atmosphere under the conditions of a repetition frequency of 30 Hz and energy density of 470 mJ/cm$^2$.

Note that, an oxide film is formed on the surface by the laser light irradiation since the irradiation is conducted in an atmosphere or in an oxygen atmosphere. Though an example of using the pulsed laser is shown here, the continuous wave laser may also be used. When an amorphous semiconductor film is crystallized, the second harmonic through the fourth harmonic of basic waves is preferably applied by using the solid state laser which is capable of continuously oscillating in order to obtain crystals with large grain size. Typically, the second harmonic (a wavelength of 532 nm) or the third harmonic (a wavelength of 355 nm) of an Nd: YVO$_4$ laser (basic wave of 1064 nm) may be applied. Specifically, laser light emitted from the continuous wave type YVO$_4$ laser with 10 W output is converted into a harmonic by using a non-linear optical element. Also, a method of emitting a harmonic by applying YVO$_4$ crystals and the non-linear optical element into a resonator can be given. Then, preferably, the laser light is shaped so as to have a rectangular shape or an elliptical shape by an optical system on the surface, thereby irradiating the surface with the laser light. At this time, the energy density of approximately from 0.01 MW/cm$^2$ to 100 MW/cm$^2$ (preferably from 0.1 MW/cm$^2$ to 10 MW/cm$^2$) is required. The semiconductor film is irradiated with the laser light while moving the semiconductor film relatively to the laser light at approximately from 10 cm/s to 2000 cm/s rate.

In addition to the oxide film formed by this laser light irradiation, a barrier layer comprising an oxide film is formed to have a thickness of from 1 nm to 5 nm in total by treating the surface with ozone water for 120 seconds. The barrier layer is formed by using the ozone water in this embodiment. However, the barrier layer may be formed by depositing a oxide film of from 1 nm to 10 nm in thickness by a method of oxidizing the surface of the semiconductor film having the crystal structure by UV light irradiation in an oxygen atmosphere, a method of oxidizing the surface of the semiconductor film having the crystal structure by an oxygen plasma treatment, a plasma CVD method, a sputtering method, a vapor deposition method or the like. Further, the oxide film formed by the laser light irradiation may be removed before forming the barrier layer.

Over the barrier layer, an amorphous silicon film containing an argon element, which serve as a gettering site, is formed to have a thickness of from 10 nm to 400 nm, 100 nm in this embodiment, by sputtering. In this embodiment, the amorphous silicon film containing the argon element is formed in an atmosphere containing argon using a silicon target. The amorphous silicon film containing an argon element is formed under the deposition conditions where the flow rate of monosilane to argon (SiH$_4$:Ar) is 1:99, a deposition pressure is 6.665 Pa (0.05 Torr), RF power density is 0.087 W/cm$^2$, and a deposition temperature is 350° C. in the case of using plasma CVD.

Then, a furnace heated at 650° C. is used for a heat treatment for 3 minutes to perform gettering to reduce the nickel concentration in the semiconductor film having the crystal structure. A lamp annealing apparatus may be used instead of the furnace.

Subsequently, the amorphous silicon film containing the argon element, which serves as the gettering site, is selectively removed using the barrier layer as an etching stopper, thereafter the barrier layer is selectively removed by dilute hydrofluoric acid. Note that, since nickel tends to move to a region having a high oxygen concentration during gettering, the barrier layer made of the oxide film is preferably removed after the gettering.

Figure 22A:
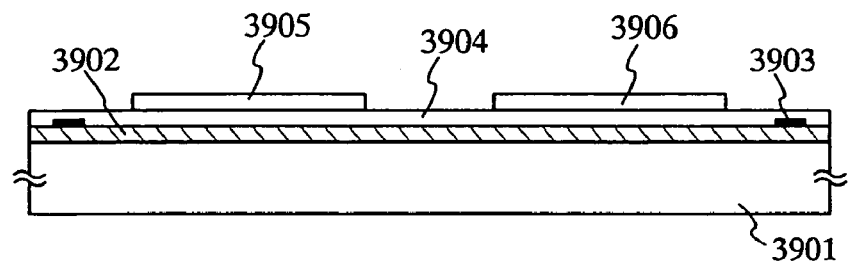
FIGS. 22A to 22D show a method for manufacturing a TFT.

Then, after a thin oxide film is formed from ozone water on the surface of the obtained silicon film having a crystal structure (also referred to as a polycrystalline film), a mask made of resist is formed, and an etching step is conducted thereto to obtain a desired shape, thereby forming island-like semiconductor layers 3905 and 3906 that are separated from one another. After the formation of the semiconductor layers 3905 and 3906, the mask made of resist is removed (FIG. 22A).

Figure 22B:
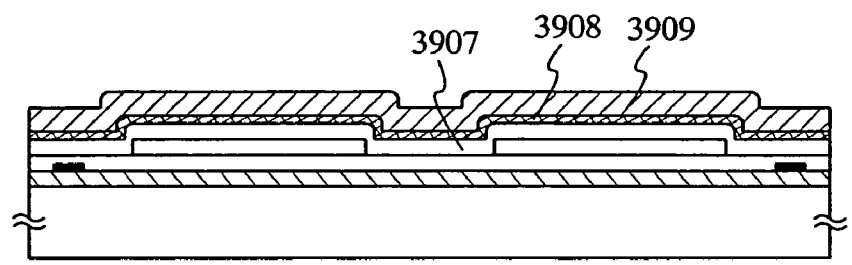

Next, the oxide film is removed with the etchant containing hydrofluoric acid, and at the same time, the surfaces of the silicon films (semiconductor layers 3905 and 3906) are washed. Thereafter, an insulating film containing silicon as its main constituent, which serves as a gate insulating film 3907, is formed. In this embodiment, a silicon oxide film is formed to have a thickness of 115 nm by plasma CVD (FIG. 22B).

Next, a first conductive film 3908 having a thickness of from 20 nm to 100 nm and a second conductive film 3909 having a thickness of from 100 nm to 400 nm are laminated over the gate insulating film 3907. In this embodiment, a 50 nm thick tantalum nitride film serving as the first conductive film 3908 and a 370 nm thick tungsten film serving as the second conductive film 3909 are sequentially laminated over the gate insulating film 3907.

As a conductive material for forming the first conductive film 3908 and the second conductive film 3909, an element selected from the group consisting of Ta, W, Ti, Mo, Al and Cu, or an alloy material or a compound material containing the elements as its main constituent can be utilized. Further, a semiconductor film as typified by a polycrystalline silicon film doped with an impurity element such as phosphorous, or an AgPdCu alloy may be used for the first conductive film 3908 and the second conductive film 3909. In addition, the present invention is not limited to a two-layer structure. For example, a three-layer structure may be adopted in which a 50 nm thick tungsten film, an alloy film of aluminum and silicon (Al—Si) of 500 nm thick, and a 30 nm thick titanium nitride film are sequentially laminated. Moreover, in the case of the three-layer structure, tungsten nitride may be used instead of tungsten as the first conductive film, an alloy film of aluminum and titanium (Al—Ti) may be used instead of the alloy film of aluminum and silicon (Al—Si) as the second conductive film, and a titanium film may be used instead of the titanium nitride film as the third conductive film. In addition, a single layer structure may also be adopted.

Figure 22C:
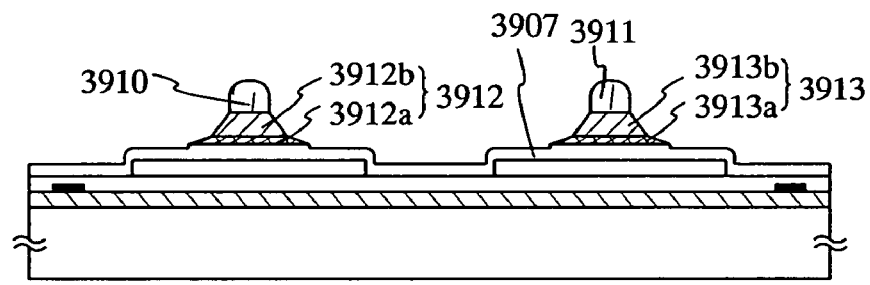

Next, masks made of resist 3910 and 3911 are formed by a light exposure step as shown in FIG. 22C. Then, a first etching treatment is carried out for forming gate electrodes and wirings. The first etching treatment is carried out under the first and the second etching conditions. It is preferable to carry out ICP (inductively coupled plasma) etching. The film can be etched to have a desired tapered shape by ICP etching under suitably adjusted etching conditions (that is, the amount of power applied to a coiled electrode, the amount of power applied to an electrode on the substrate side, the temperature of the electrode on the substrate side, etc.). As the etching gas, chlorine-based gas as typified by Cl$_2$, BCl$_3$, SiCl$_4$, or CCl$_4$, fluorine-based gas as typified by CF$_4$, SF$_6$, or NF$_3$, or O$_2$ are appropriately utilized.

The substrate side (sample stage) also receives an RF power of 150 W (13.56 MHz) to apply a substantially negative self-bias voltage. The size of the substrate side electrode is 12.5 cm×12.5 cm and the coiled electrode is a disc 25 cm in diameter (here, a quartz disc for which the coil is provided). The W film is etched under these first etching conditions so that the edge portion of the first conductive layer has a tapered shape. Under the first etching conditions, the rate of etching the W film is 200.39 nm/min. and the rate of etching the TaN film is 80.32 nm/min. The selective ratio of W to TaN is therefore about 2.5. The W film is tapered under the first etching conditions at an angle of about 26°. Thereafter, the first etching conditions are switched to the second etching conditions without removing the masks made of resist 3910 and 3911. The second etching conditions include using CF$_4$ and Cl$_2$ as the etching gases, setting the flow rate of the gases to 30:30 (sccm), and giving an RF (13.56 MHz) power of 500 W to the coiled electrode at a pressure of 1 Pa to generate plasma for etching for about 30 seconds. The substrate side (sample stage) also receives an RF power of 20 W (13.56 MHz) to apply a substantially negative self-bias voltage. Under the second etching conditions including a mixture of CF$_4$ and Cl$_2$, the TaN film and the W film are etched to almost the same degree. The rate of etching the W film is 58.97 nm/min. and the rate of etching the TaN film is 66.43 nm/min. under the second etching conditions. In order to etch the films without leaving any residue on the gate insulating film, the etching time may be prolonged at a rate of approximately from 10% to 20%.

In the first etching treatment, the first conductive layer and the second conductive layer are tapered around the edge portions by forming the mask made of resist into a proper shape and by the effect of the bias voltage applied to the substrate side. The angle of the tapered portions may be set from 15° to 45°.

The first shape conductive layers 3912 and 3913 comprising the first conductive layer and the second conductive layer (the first conductive layers 3912*a*, 3913*a* and the second conductive layers 3912*b*, 3913*b*) are formed by the first etching treatment. The insulating film 3907 to serve as a gate insulating film is etched appropriately from 10 nm to 20 nm. The gate insulating film 3907 has a thinned region that is not covered with the first shape conductive layers 3912 and 3913.

Figure 22D:
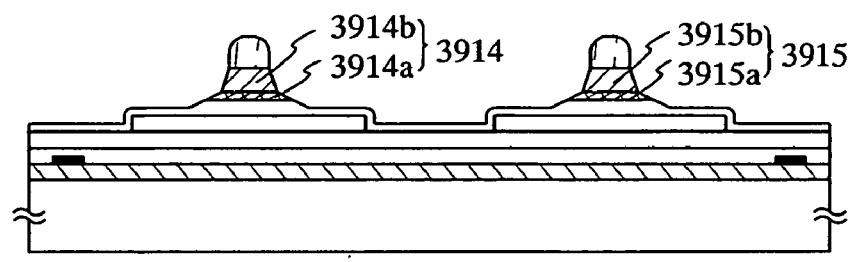

Next, a second shape conductive layers 3914 and 3915 are formed by a second etching treatment is conducted without removing the masks made of resist as shown in FIG. 22D. Here, SF$_6$, Cl$_2$ and O$_2$ are used as etching gases, the flow rate of the gases is set to 24/12/24 sccm, and RF (13.56 MHz) power of 700 W is applied to a coiled electrode with a pressure of 1.3 Pa to generate plasma, thereby performing etching for 25 seconds. RF (13.56 MHz) power of 10 W is also applied to the substrate side (sample stage) to substantially apply a negative self-bias voltage. In the second etching treatment, the rate of etching W is 227.3 nm/min, the rate of etching TaN is 32.1 nm/min, a selective ratio of W to TaN is 7.1, the rate of etching SiON that is the gate insulating film 3907 is 33.7 nm/min, and a selective ratio of W to SiON is 6.83. In the case where SF$_6$ is used as the etching gas, the selective ratio with respect to the gate insulating film 3907 is high as described above. Thus, reduction in the film thickness can be suppressed. In this embodiment, the film thickness of the insulating film 3907 is reduced by about 8 nm.

By the second etching treatment, the taper angle of W can be 70°. By the second etching treatment, second conductive layers 3914*b* and 3915*b* are formed. At this time, the first conductive layers are hardly etched to be first conductive layers 3914*a* and 3915*a*. Note that, the first conductive layers 3914*a* and 3915*a* have almost the same size as the first conductive layers 3912*a* and 3913*a*. Actually, there is a case where the width of the first conductive layer may be reduced by approximately 0.3 μm, namely, approximately 0.6 μm in the total line width in comparison with before the second etching treatment. However, there is almost no change in the size.

Further, in the case where, instead of the two-layer structure, the three-layer structure is adopted in which a 50 nm thick tungsten film, a 500 nm thick alloy film of aluminum and silicon (Al—Si), and a 30 nm thick titanium nitride film are sequentially laminated, under the first etching conditions of the first etching treatment in which: BCl$_3$, Cl$_2$ and O$_2$ are used as material gases; the flow rate of the gases is set to 65/10/5 (sccm); RF (13.56 MHz) power of 300 W is applied to the substrate side (sample stage); and RF (13.56 MHz) power of 450 W is applied to a coiled electrode with a pressure of 1.2 Pa to generate plasma, etching is performed for 117 seconds. As for the second etching conditions of the first etching treatment, CF$_4$, Cl$_2$ and O$_2$ are used, the flow rate of the gases is set to 25/25/10 sccm, RF (13.56 MHz) power of 20 W is also applied to the substrate side (sample stage), and RF (13.56 MHz) power of 500 W is applied to a coiled electrode with a pressure of 1 Pa to generate plasma. It is sufficient that etching is performed for about 30 seconds under the above conditions. In the second etching treatment, BCl$_3$ and Cl$_2$ are used, the flow rate of the gases are set to 20/60 sccm, RF (13.56 MHz) power of 100 W is applied to the substrate side (sample stage), and RF (13.56 MHz) power of 600 W is applied to a coiled electrode with a pressure of 1.2 Pa to generate plasma, thereby performing etching.

Figure 23A:
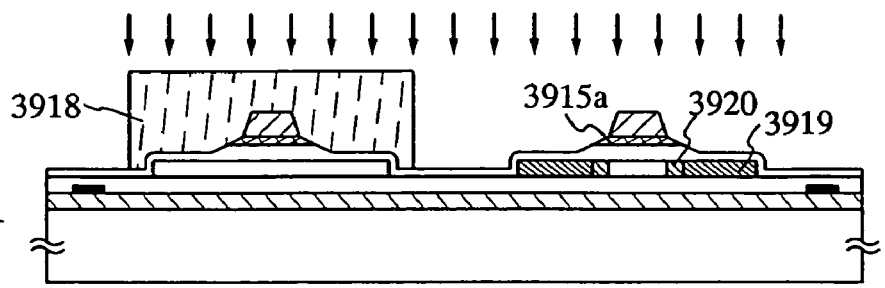
FIGS. 23A to 23D show a method for manufacturing a TFT.

Next, the masks made of resist 3910 and 3911 are removed, and then, a first doping treatment is conducted to obtain a mask made of resist 3918 as shown in FIG. 23A. The doping treatment may be conducted by ion doping or ion implantation. Note that, the mask 3918 is a mask for protecting a semiconductor layer forming a p-channel TFT and the vicinity thereof. Ion doping for the first doping treatment is conducted by doping phosphorous (P) under the conditions of a dosage of $1.5 \times 10^{15}$ atoms/cm$^2$ and an accelerating voltage of from 60 keV to 100 keV. As an impurity element imparting n-type conductivity, phosphorous (P) or arsenic (As) can typically be used. In this case, impurity regions are formed in each semiconductor layer in a self-aligning manner by using the second conductive layer 3914*b* and 3915*b* as masks. Of course, the region covered with the mask 3918 is not doped. Thus, a first impurity region 3919 and a second impurity region 3920 are formed. An impurity element imparting n-type conductivity is added to the first impurity region 3919 in a concentration range of $1 \times 10^{20}$ to $1 \times 10^{21}$ atoms/cm$^3$. Here, the region having the same concentration range as the first impurity region is also called an n$^+$ region.

Further, the second impurity region 3920 is formed at a lower concentration than that of the first impurity region 3919 because of the first conductive layer 3915*a*, and added with the impurity element imparting n-type conductivity in a concentration range of $1 \times 10^{18}$ to $1 \times 10^{19}$ atoms/cm$^3$. Note that, since doping is conducted by passing impurities through the portion of the first conductive layer 3915*a* having a tapered shape, the second impurity region 3920 has a concentration gradient in which an impurity concentration increases toward the end portion of the tapered portion. Here, the region having the same concentration range as the second impurity region 3920 is called an n⁻ region.

Figure 23B:
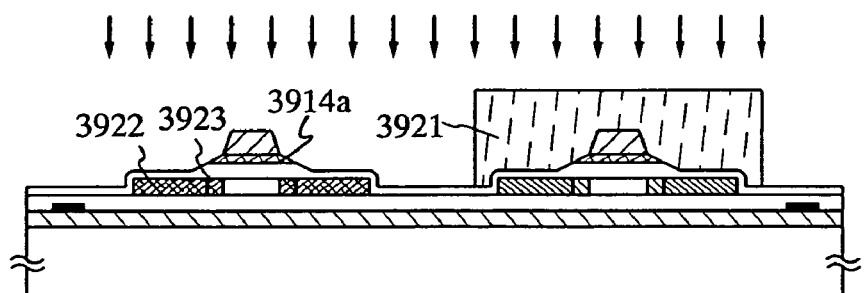

Next, after the mask made of resist 3918 is removed, another mask made of resist 3921 is newly formed, and a second doping treatment is conducted as shown in FIG. 23B. The doping treatment may be conducted by ion doping or ion implantation. Note that, the mask 3921 is a mask for protecting a semiconductor layer forming a n-channel TFT and the vicinity thereof.

Ion doping for the second doping treatment is conducted by doping boron (B) under the conditions of a dosage of from $1 \times 10^{15}$ atoms/cm² to $2 \times 10^{16}$ atoms/cm² and an accelerating voltage of from 50 keV to 100 keV. In this case, impurity regions are formed in each semiconductor layer in a self-aligning manner by using the second conductive layer 3914b and 3915b as masks. Of course, the region covered with the mask 3921 is not doped. By the second doping treatment as described above, a third impurity region 3922 and a fourth impurity region 3923 are formed in which an impurity element imparting p-type conductivity is added to the semiconductor layer forming the p-channel TFT.

Further, the impurity element imparting p-type conductivity is added to the third impurity region 3922 in a concentration range of $1 \times 10^{20}$ to $1 \times 10^{21}$, atoms/cm³.

Further, a fourth impurity region 3923 is formed in a region overlapping with the tapered portion of the first conductive layer 3914a, and are added with the impurity element imparting p-type conductivity in a concentration range of $1 \times 10^{18}$ to $1 \times 10^{20}$ atoms/cm³. Note that since doping is conducted by passing impurities through the portion of the first conductive layer 3914a having a tapered shape, the fourth impurity region 3923 has a concentration gradient in which an impurity concentration increases toward the end portion of the tapered portion. Here, the region having the same concentration range as the fourth impurity region 3923 is also called a p⁻ region.

Through the above-described steps, the impurity regions having n-type or p-type conductivity are formed in the respective semiconductor layers. The second shape conductive layers 3914 and 3915 become gate electrodes of TFTs.

Then, a step of activating the impurity element added to the respective semiconductor layers is conducted. This activation step is performed by combining one method of a rapid thermal annealing (RTA) method using a lamp light source, a method of emitting YAG laser light or excimer laser light from the back surface, a heat treatment using a furnace.

A first insulating film 3924 is formed. Note that, a silicon nitride oxide film of 50 nm thick formed by plasma CVD is used in this embodiment. The insulating film is not naturally limited to a silicon nitride oxide film, but may be a single layer of an insulating material such as silicon nitride, or silicon oxide, or a laminate of the materials.

Then, a second insulating film 3925 is formed over the first insulating film 3924. Insulating films such as silicon nitride, silicon nitride oxide, and silicon oxide can be used for the second insulating film 3925. In this embodiment, a silicon nitride film of 50 nm thick formed by plasma CVD is used.

Figure 23C:
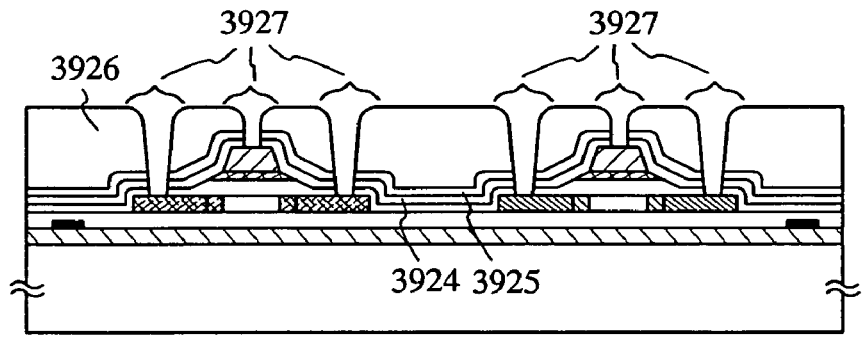

Next, the second insulating film 3925 made of a silicon nitride film is formed, and then, a heat treatment (at temperatures from 300° C. to 550° C. for 1 to 12 hours) is performed, thereby conducting a step of hydrogenating the semiconductor layers. (FIG. 23C). This step is a step of terminating dangling bonds of the semiconductor layers by hydrogen contained in the second insulating film 3925. As another means for hydrogenation, a heat treatment at 350° C. in the hydrogen atmosphere, or plasma hydrogenation (using hydrogen excited by plasma) may be conducted.

Next, a third insulating film 3926 is formed from an organic insulating material over the second insulating film 3925. In this embodiment, an acrylic resin film with a thickness of 1.6 μm is formed. Then, a contact hole 3927 that reaches each impurity region is formed.

Since the acrylic resin film used in this embodiment is photosensitive acryl, contact holes can be provided in desired positions by exposing the acrylic resin film to light and developing it. Portions of the first insulating film 3924 and the second insulating film 3925 are etched by dry etching. The first insulating film 3924 is used as an etching stopper to etch partly the second insulating film 3925, then, the first insulating film 3924 is partly etched. Thus, the contact holes 3927 are obtained.

In this embodiment, the case where the contact holes are formed after forming the third insulating film 3926 by using an organic resin film is explained, however, the first insulating film 3924 and the second insulating film 3925 can be etched by dry-etching before forming the third insulating film 3926. In this case, the substrate is preferably heat-treated at temperatures from 300° C. to 550° C. for 1 to 12 hours after etching treatment and before forming the third insulating film 3926.

Figure 23D:
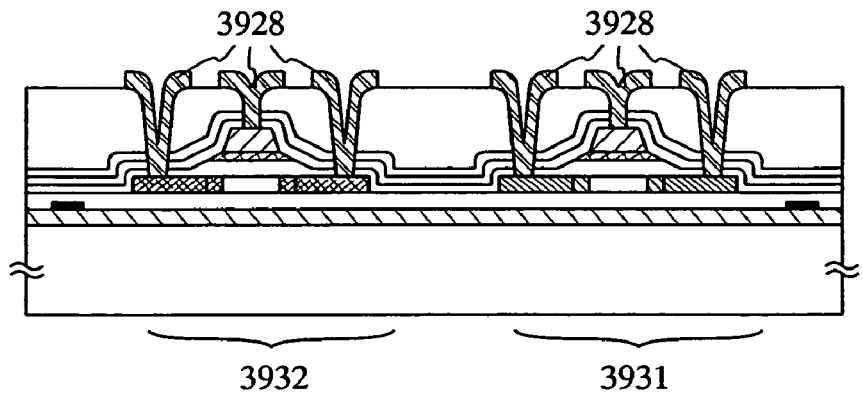

Then, wirings 3928 are formed by using Al, Ti, Mo, W, or the like, as shown in FIG. 23D, consequently, an n-channel TFT 3931 and a p-channel TFT 3932 can be formed over the same substrate.

Embodiment 14

Figure 24:
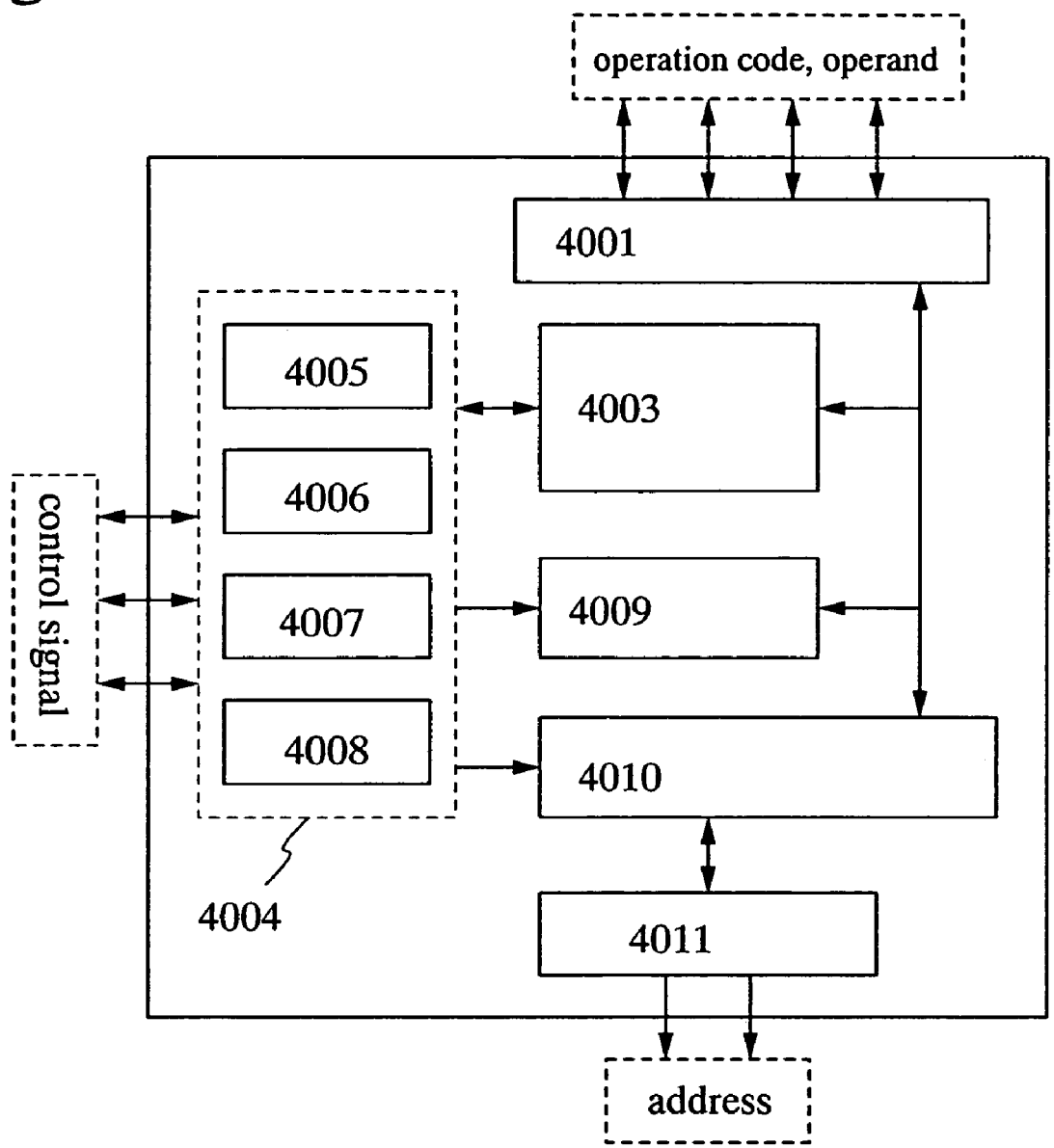
FIG. 24 shows a CPU manufactured according to the present invention.

A function and a structure of an integrated circuit manufactured according to the present invention in the case where the integrated circuit has a function as a CPU is described with reference to FIG. 24 in this embodiment.

When an operation code is inputted to an interface 4001, the code is decrypted in an analysis unit 4003 (also referred to as an Instruction Decoder), and a signal is inputted to a control signal generation unit 4004 (a CPU Timing Control). Upon inputting the signal, a control signal is outputted to an arithmetic logical unit 4009 (hereinafter, an ALU) and a memory circuit 4010 (hereinafter, a Register) from the control signal generation unit 4004.

The control signal generation unit 4004 comprises an ALU controller 4005 for controlling the ALU 4009 (hereinafter, ACON), a unit 4006 for controlling the Register 4010 (hereinafter, a RCON), a timing controller 4007 for controlling timing (hereinafter, a TCON), and an interruption controller 4008 for controlling interruption (hereinafter, an ICON).

On the other hand, when an operand is inputted to the interface 4001, the operand is outputted to the ALU 4009 and the Register 4010. Then, a processing, such as a memory read cycle, a memory write cycle, an I/O read cycle, an I/O write cycle, based on a control signal, which is inputted from the control signal generation unit 4004, is carried out.

The Register 4010 comprises a general resister, a stack pointer (SP), a programmable counter (PC), or the like.

An address controller 4011 (hereinafter, ADRC) outputs 16 bits address.

A structure of the CPU described in this embodiment is illustrative only as a CPU manufactured according to the present invention and does not limit the structure of the present invention. Therefore, it is possible to use a known CPU with the structure other than that of the present invention.

Embodiment 15

The state that the integrated circuit manufactured according to the present invention is incorporated into a module and further, actually into electronics is described with reference to FIG. 25, giving a cellular phone as an example.

Figure 25:
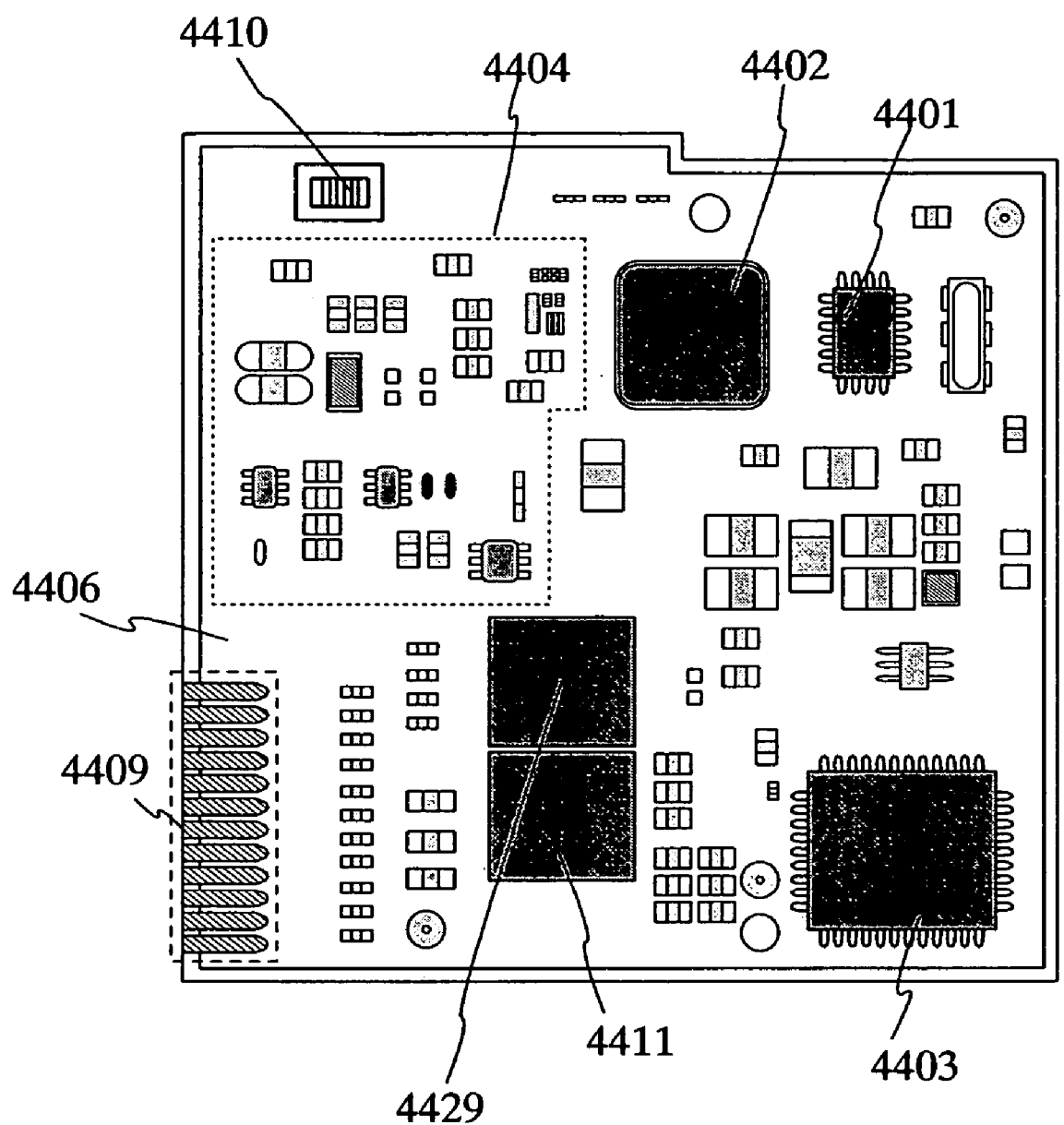
FIG. 25 shows a module incorporating an integrated circuit manufactured according to the present invention.

The module of the cellular phone shown in FIG. 25 includes a printed wiring board 1406 on which a controller 4401, a CPU 4402, a memory 4411, a power source circuit 4403, a speech processing circuit 4429, a transmitter-receiver circuit 4404, and devices such as a resister, a buffer, and a capacitor element, are mounted. It is noted that the integrated circuit manufactured according to the present invention can be applied to the controller 4401, the CPU 4402, the memory 4411, the power source circuit 4403, the speech processing circuit 4429, and the like. Though not shown, a panel is mounted on the printed wiring board 4406 by an FPC.

Various signals inputted from a power source voltage, a keyboard, and the like are supplied into the printed wiring board 4406 via an interface (I/F) portion 4409 for the printed wiring board provided with a plurality of input terminals. A port for an antenna 4410 for transmitting signals to and receiving signals from an antenna is provided for the printed wiring board 4406.

The memory 4411 includes a VRAM, a DRAM, a flush memory, and the like. An image date to be displayed in a panel is stored in the VRAM, an image data or a voice data is stored in the DRAM, and various programs are stored in the flush memory.

Power supply voltage for the controller 4401, the CPU 4402, the speech processing circuit 4429, the memory 4411, and the transmitter-receiver circuit 4404 is generated in the power source circuit 4403. According to the specification of a panel, a current source may be provided for the power source circuit 4403.

The structure of the CPU 4402 is described in Embodiment 14, and will not be further explained. The CPU transmit a signal including various instructions into the memory 4411, the transmitter-receiver circuit 4404, the speech processing circuit 4429, the controller 4401, and the like, based on the inputted signal.

The memory 4411, the transmitter-receiver circuit 4404, the speech processing circuit 4429, and the controller 4401 perform each operation by a recieved instruction. Each the operation is described hereinafter.

The signal inputted from a keyboard is transmitted into the CPU 4402 mounted on the printed wiring board 4406 via the interface 4409. In the CPU 4402, an image date stored in the VRAM is converted into a prescribed format in accordance with the signal transmitted from a keyboard, and sent to the controller 4401.

A signal including the image date sent from the CPU 4402 is data-processed in accordance with the specification of the panel in the controller 4401, and supplied to the panel. In addition, the controller 4401 generates a Hsync signal, a Vsync signal, a clock signal CLK, and a volts alternating current (AC Cont) based on power supply voltage inputted from the power source circuit 4403 or various signals inputted from the CPU 4402, and supplies theses signals to the panel.

In the transmitter-receiver circuit 4404, a signal which is transmitted to and received from the antenna as an electric wave is processed, specifically, a high frequency circuit such as an isolator, a band pass filter, a VCO (Voltage Controlled Oscillator), an LPF (Low Pass Filter), a coupler, and a balun are included. A signal including voice information among signals transmitted to and received from the transmitter-receiver circuit 4404 is sent to the speech processing circuit 4429 by an instruction of the CPU 4402.

The signal including voice information sent by the instruction of the CPU 4402 is demodulated into a speech signal in the speech processing circuit 4429, and send to a speaker. A speech signal sent from a mike is modulated in the speech processing circuit 4429, and sent to the transmitter-receiver circuit 4404 by the instruction of the CPU 4402.

The integrated circuit manufactured according to the present invention can be applied to all kinds of circuits as well as the above described circuits, except high frequency circuits such as the isolator, the band pass filter, the VCO (Voltage Controlled Oscillator), the LPF (Low Pass Filter), the coupler, and the balun.

Embodiment 16

Various modules as described in Embodiment 15 can be completed by using an integrated circuit that is made according to the present invention. Accordingly, various electronics can be completed by incorporating such modules.

Such electronics include a video camera, a digital camera, a head mounted display (goggle type display), a car navigation system, a projector, a car stereo, a personal computer, a portable information terminal (a device provided with a display device that can playback record medium of a mobile computer, cellular phone, portable game machine or electronic book etc. and display the image), etc. Practical examples thereof are shown in FIGS. 13A to 13G.

FIG. 13A shows a display device including a frame 2001, a support 2002, a display screen unit 2003, a speaker portion 2004, a video input terminal 2005, and the like. An integrated circuit manufactured according to the present invention can be used for a circuit portion and the like for operating the display device. The display devices includes all information display apparatuses for a personal computer, a TV broadcasting, an advertisement, and the like.

FIG. 13B shows a laptop computer including a main body 2201, a frame 2202, a display screen unit 2203, a keyboard 2204, an external connection port 2205, a pointing mouse 2206, and the like. An integrated circuit manufactured according to the present invention can be used for a circuit portion and the like for operating the laptop computer.

FIG. 13C shows a mobile computer including a main body 2301, a display screen unit 2302, a switch 2303, an operation key 2304, an infrared port 2305, and the like. An integrated circuit manufactured according to the present invention can be used for a circuit portion and the like for operating the mobile computer.

FIG. 13D shows a player using a record medium recorded with programs (hereinafter, record medium). The player includes a main body 2401, a frame 2402, a display screen unit A 2403, a display screen unit B 2403, a record medium reading portion 2405, an operation key 2406, a speaker portion 2407, and the like. The player uses DVD (Digital Versatile Disc), CD or the like as a record medium, thereby making it possible to enjoy music, a movie, a game or Internet. An integrated circuit manufactured according to the present invention can be used for a circuit portion and the like for operating the player.

FIG. 13E shows a portable book (electronic book) including a main body 2501, display screen unit 2502, a record medium 2503, an operation key 2504, an antenna 2505, and the like. An integrated circuit manufactured according to the present invention can be used for a circuit portion and the like for operating the portable book.

FIG. 13F shows a video camera including a main body 2601, a display screen unit 2602, a frame 2603, an external connection port 2604, a remote control receiving portion 2605, an image receiving portion 2606, a battery 2607, a voice input portion 2608, operation keys 2609, an eyepiece portion 2610, and the like. An integrated circuit manufactured according to the present invention can be used for a circuit portion and the like for operating the video camera.

FIG. 13G shows a cellular phone including a main body 2701, a frame 2702, a display screen unit 2703, a sound input portion 2704, a sound output portion 2705, an operation key 2706, an external connection port 2707, an antenna 2708, and the like. An integrated circuit manufactured according to the present invention can be used for a circuit portion and the like for operating the cellular phone.

As described above, the range of application of an integrated circuit manufactured according to the present invention is extremely wide, and is applicable to electronics of all the fields. This application is based on Japanese Patent Application serial no. 2003-053193 filed in Japan Patent Office on 28, Feb. 2003 and Japanese Patent Application serial no. 2003-053243 filed in Japan Patent Office on 28, Feb. 2003, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be constructed as being included therein.

What is claimed is:

1. A method for manufacturing a semiconductor device, comprising the steps of:
    forming a metal layer over a first substrate;
    forming an adhesive agent on a portion of the metal layer;
    forming an oxide layer to cover the metal layer and the adhesive agent;
    forming an element-formed layer including a semiconductor element over the oxide layer;
    removing the adhesive agent by etching a portion of the element-formed layer;
    bonding a second substrate to the element-formed layer by an adhesive material; and
    separating the second substrate and the element-formed layer from the first substrate by a physical means.

2. A method for manufacturing a semiconductor device according to claim 1, wherein the metal layer is formed from any one of tungsten, molybdenum, technetium, rhenium, ruthenium, osmium, rhodium, iridium, palladium, platinum, silver, and gold.

3. A method for manufacturing a semiconductor device according to claim 1, wherein the step of forming the element-formed layer includes a heat treatment step of 400° C. or more, preferably 600° C. or more.

4. A method for manufacturing a semiconductor device according to claim 1, wherein the semiconductor element is formed so as not to overlap with the adhesive agent.

5. A method for manufacturing a semiconductor device according to claim 1, wherein a material to be chemically reacted with a metal included in the metal layer is used for the adhesive agent.

6. A method for manufacturing a semiconductor device according to claim 1, wherein any one of silicon, germanium, carbon, boron, magnesium, aluminum, titanium, tantalum, iron, cobalt, nickel, and manganese is used for the adhesive agent.

7. A method for manufacturing a semiconductor device, comprising the steps of:
    forming a metal layer over a first substrate;
    forming an adhesive agent on a portion of the metal layer;
    forming an oxide layer to cover the metal layer and the adhesive agent;
    forming an element-formed layer comprising an integrated circuit including a plurality of semiconductor elements over the oxide layer;
    removing the adhesive agent by etching a portion of the element-formed layer;
    bonding a second substrate to the element-formed layer by a first adhesive material; and
    separating the second substrate and the element-formed layer from the first substrate by a physical means.

8. A method for manufacturing a semiconductor device according to claim 7, wherein the metal layer is formed from any one of tungsten, molybdenum, technetium, rhenium, ruthenium, osmium, rhodium, iridium, palladium, platinum, silver, and gold.

9. A method for manufacturing a semiconductor device according to claim 7, wherein the step of forming the element-formed layer includes a heat treatment step of 400° C. or more, preferably 600° C. or more.

10. A method for manufacturing a semiconductor device according to claim 7, wherein the integrated circuit is formed so as not to overlap with the adhesive agent.

11. A method for manufacturing a semiconductor device according to claim 7, wherein a material to be chemically reacted with a metal included in the metal layer is used for the adhesive agent.

12. A method for manufacturing a semiconductor device according to claim 7, wherein any one of silicon, germanium, carbon, boron, magnesium, aluminum, titanium, tantalum, iron, cobalt, nickel, and manganese is used for the adhesive agent.

13. A method for manufacturing a semiconductor device according to claim 1, further comprising the steps of:
    bonding the second substrate and the element-formed layer to a third substrate by a second adhesive material; and
    removing the second substrate from the element-formed layer.

14. A method for manufacturing a semiconductor device according to claim 7, further comprising the steps of:
    bonding the second substrate and the element-formed layer to a third substrate by a second adhesive material; and
    removing the second substrate from the element-formed layer.

15. A method for manufacturing a semiconductor device according to claim 1, wherein the adhesive agent is in contact with a portion of the oxide layer.

16. A method for manufacturing a semiconductor device according to claim 7, wherein the adhesive agent is in contact with a portion of the oxide layer.

17. A method for manufacturing a semiconductor device according to claim 1, wherein the portion of the element-formed layer is over the adhesive agent.

18. A method for manufacturing a semiconductor device according to claim 7, wherein the portion of the element-formed layer is over the adhesive agent.

* * * * *